(12) United States Patent
Yamazaki et al.

(10) Patent No.: US 12,471,290 B2
(45) Date of Patent: Nov. 11, 2025

(54) FERROELECTRIC DEVICE AND SEMICONDUCTOR DEVICE

(71) Applicant: Semiconductor Energy Laboratory Co., Ltd., Atsugi (JP)

(72) Inventors: Shunpei Yamazaki, Setagaya (JP); Tomonori Nakayama, Atsugi (JP); Masahiro Takahashi, Atsugi (JP); Hitoshi Kunitake, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 342 days.

(21) Appl. No.: 18/030,334

(22) PCT Filed: Oct. 12, 2021

(86) PCT No.: PCT/IB2021/059304
§ 371 (c)(1),
(2) Date: Apr. 5, 2023

(87) PCT Pub. No.: WO2022/084801
PCT Pub. Date: Apr. 28, 2022

(65) Prior Publication Data
US 2023/0380180 A1    Nov. 23, 2023

(30) Foreign Application Priority Data

Oct. 20, 2020 (JP) ................. 2020-176354
Nov. 20, 2020 (JP) ................. 2020-193541

(51) Int. Cl.
*H10B 53/30* (2023.01)
(52) U.S. Cl.
CPC .................... *H10B 53/30* (2023.02)
(58) Field of Classification Search
CPC ............................................. H10B 53/30
See application file for complete search history.

(56) References Cited

U.S. PATENT DOCUMENTS 6,635,528 B2   10/2003  Gilbert et al.
7,758,979 B2    7/2010  Akiyama et al.
(Continued)

FOREIGN PATENT DOCUMENTS

CN    102782858 A    11/2012
CN    109075762 A    12/2018
(Continued)

OTHER PUBLICATIONS

International Search Report (Application No. PCT/IB2021/059304) Dated Jan. 25, 2022.
(Continued)

*Primary Examiner* — Richard A Booth
(74) *Attorney, Agent, or Firm* — Eric J. Robinson; Robinson Intellectual Property Law Office, P.C.

(57) ABSTRACT

A ferroelectric device (100) that includes a metal nitride film (130) with favorable ferroelectricity is provided. The ferroelectric device comprises a first conductor (110), a metal nitride film over the first conductor, a second conductor (120) over the metal nitride film, a first insulator (155) over the second conductor, and a second insulator (152) over the first insulator. The first insulator includes regions in contact with the side surface of the metal nitride film and the side surface and the top surface of the second conductor; the metal nitride film has ferroelectricity; the metal nitride film contains a first element, a second element, and nitrogen; the first element is one or more elements selected from Group 13 elements; the second element is one or more elements selected from Group 2 elements to Group 6 elements and Group 13 elements other than the first element; the first conductor and the second conductor each contain nitrogen; the first insulator contains aluminum and oxygen; and the second insulator contains silicon and nitrogen.

17 Claims, 31 Drawing Sheets

(56) References Cited

U.S. PATENT DOCUMENTS

| | | |
|---|---|---|
| 8,513,773 B2 | 8/2013 | Takemura |
| 8,981,440 B2 | 3/2015 | Nakao |
| 9,362,295 B2 | 6/2016 | Nakao |
| 9,607,998 B2 | 3/2017 | Nakao |
| 9,847,338 B2 | 12/2017 | Nakao |
| 10,020,374 B2 | 7/2018 | Sone et al. |
| 10,134,781 B2 | 11/2018 | Yamazaki et al. |
| 10,217,776 B2 | 2/2019 | Yamazaki et al. |
| 10,763,816 B2 | 9/2020 | Yanagitani et al. |
| 10,870,276 B2 | 12/2020 | McAvoy |
| 11,271,085 B2 | 3/2022 | Sone et al. |
| 2001/0044205 A1 | 11/2001 | Gilbert et al. |
| 2011/0169135 A1 | 7/2011 | Nakao |
| 2012/0248451 A1 | 10/2012 | Sone et al. |
| 2014/0070289 A1 | 3/2014 | Tanaka et al. |
| 2019/0089325 A1 | 3/2019 | Yanagitani et al. |
| 2021/0320193 A1* | 10/2021 | Yamazaki ............ H01L 21/0228 |
| 2023/0363174 A1* | 11/2023 | Yamazaki ............... H10D 84/83 |

FOREIGN PATENT DOCUMENTS

| | | |
|---|---|---|
| EP | 2517255 A | 10/2012 |
| JP | 2001-223342 A | 8/2001 |
| JP | 2002-359291 A | 12/2002 |
| JP | 2009-010926 A | 1/2009 |
| JP | 2009-105084 A | 5/2009 |
| JP | 2010-251590 A | 11/2010 |
| JP | 2011-151370 A | 8/2011 |
| JP | 2014-053568 A | 3/2014 |
| JP | 2017-201050 A | 11/2017 |
| JP | 2019-530601 | 10/2019 |
| KR | 2012-0085923 A | 8/2012 |
| TW | 201131772 | 9/2011 |
| WO | WO-2010/032456 | 3/2010 |
| WO | WO-2011/078398 | 6/2011 |
| WO | WO-2017/191499 | 11/2017 |
| WO | WO-2018/054917 | 3/2018 |

OTHER PUBLICATIONS

Written Opinion (Application No. PCT/IB2021/059304) Dated Jan. 25, 2022.

Boscke.T et al., "Ferroelectricity in hafnium oxide thin films", Appl. Phys. Lett. (Applied Physics Letters), Sep. 8, 2011, vol. 99, No. 10, pp. 102903-1-102903-3.

Fan.Z et al., "Ferroelectric HfO2-based materials for next-generation ferroelectric memories", Journal of Advanced Dielectrics, May 3, 2016, vol. 6, No. 2, pp. 1630003-1-1630003-11.

Fichtner.S et al., "AlScN: A III-V semiconductor based ferroelectric", J. Appl. Phys. (Journal of Applied Physics), Mar. 18, 2019, vol. 125, pp. 114103-1-114103-7.

* cited by examiner

FIG. 7A1
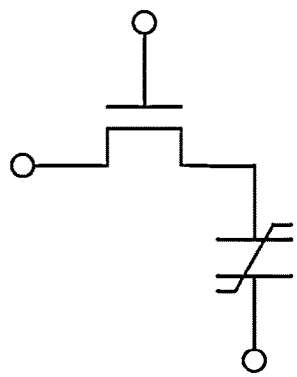
FIG. 7B1
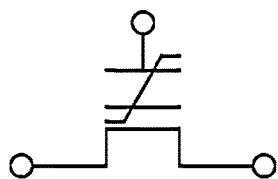
FIG. 7C1
FIG. 7A2
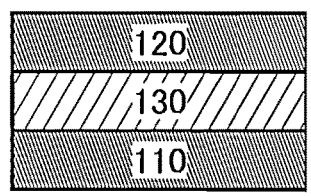
FIG. 7B2
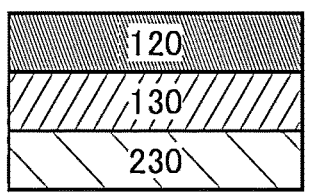
FIG. 7C2
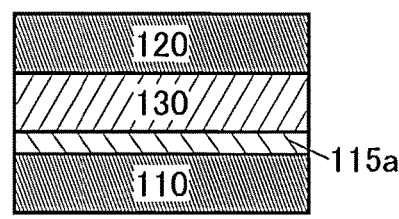
FIG. 7C3
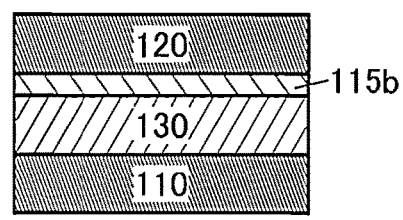
FIG. 7C4
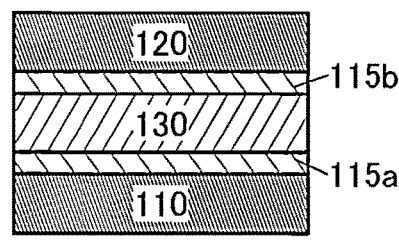

FIG. 10A
| Amorphous | Intermediate state<br>New crystalline phase<br>Crystalline | Crystal |
|---|---|---|
| • completely amorphous | • CAAC<br>• nc<br>• CAC<br>excluding single crystal and poly crystal | • single crystal<br>• poly crystal |
FIG. 10B
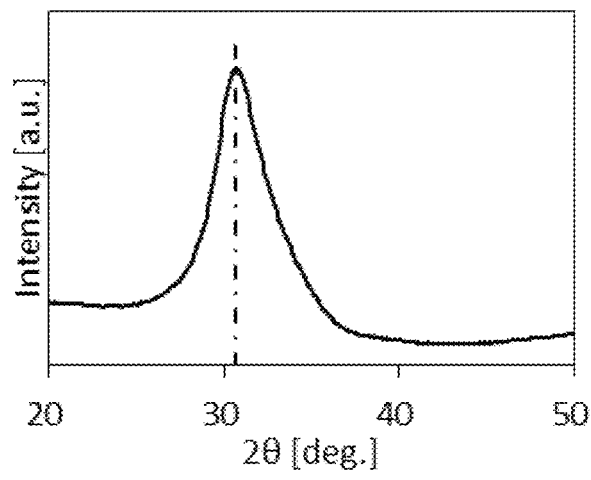
FIG. 10C
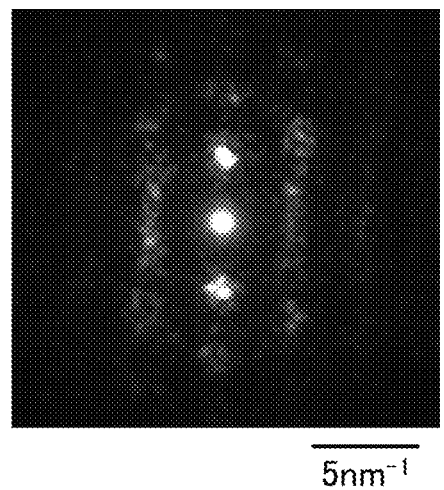

FIG. 29A
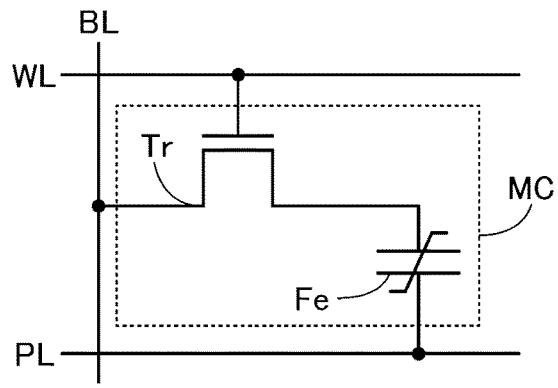
FIG. 29B1
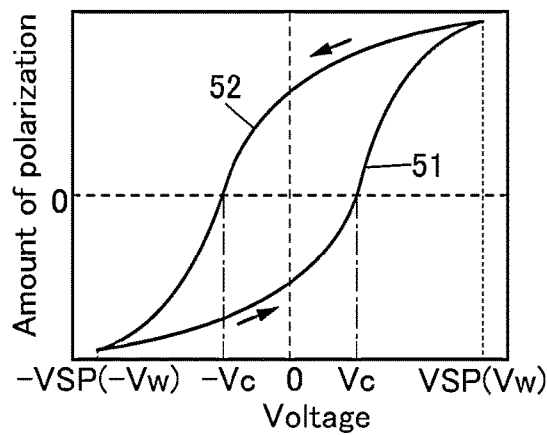
FIG. 29B2
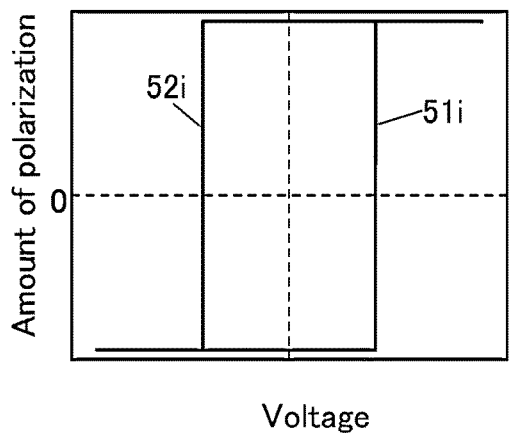
FIG. 29C
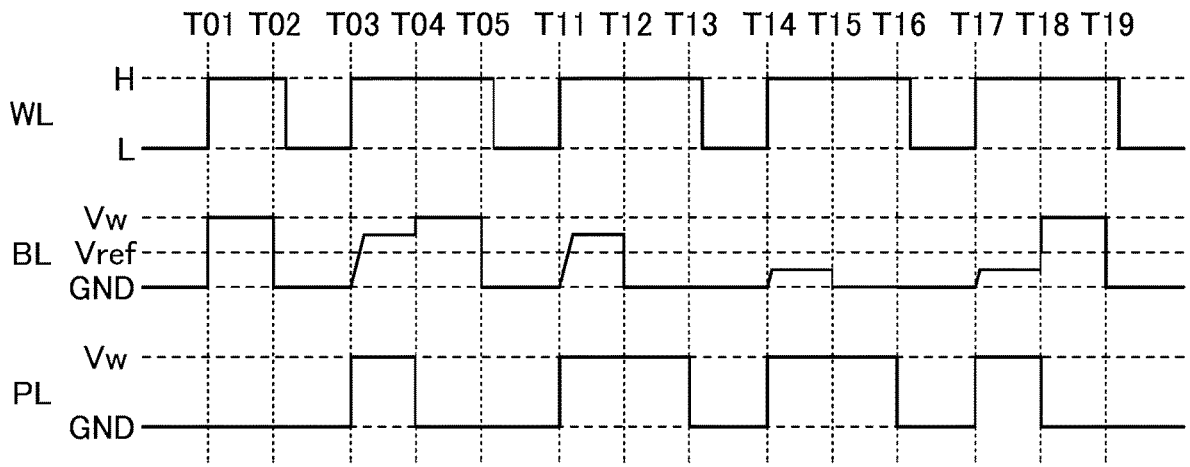

FERROELECTRIC DEVICE AND SEMICONDUCTOR DEVICE

TECHNICAL FIELD

One embodiment of the present invention relates to a metal nitride film, a ferroelectric device that includes the metal nitride film, and manufacturing methods thereof. Another embodiment of the present invention relates to a transistor, a semiconductor device, and an electronic device. Another embodiment of the present invention relates to a method for fabricating a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be sometimes said that a display device (a liquid crystal display device, a light-emitting display device, and the like), a projection device, a lighting device, an electro-optical device, a power storage device, a storage device, a semiconductor circuit, an image capturing device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

In recent years, semiconductor devices have been developed, and LSIs, CPUs, memories, and the like are mainly used as the semiconductor devices. A CPU is an aggregation of semiconductor elements; the CPU includes a semiconductor integrated circuit (including at least a transistor and a memory) formed into a chip by processing a semiconductor wafer, and is provided with an electrode that is a connection terminal.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). A silicon-based semiconductor material, an oxide semiconductor, and the like are known as semiconductor thin films usable for transistors.

As described in Non-Patent Document 1, a memory array that includes a ferroelectric has been actively researched and developed. As described in Non-Patent Document 2, a ferroelectric $HfO_2$-based material has been actively researched for next-generation ferroelectric memories. In recent years, research on the ferroelectricity of a Group 13 element nitride semiconductor disclosed in Non-Patent Document 3 has been reported.

REFERENCE

Non-Patent Documents

[Non-Patent Document 1] T. S. Boescke, et al., "Ferroelectricity in hafnium oxide thin films", APL99, 2011

[Non-Patent Document 2] Zhen Fan, et al., "Ferroelectric $HfO_2$-based materials for next-generation ferroelectric memories", JOURNAL OF ADVANCED DIELECTRICS, Vol. 6, No. 2, 2016

[Non-Patent Document 3] Simon Fichtner, et al., "AlScN: A III-V semiconductor based ferroelectric", Journal of Applied Physics, Vol. 125, 114103, 2019

SUMMARY OF THE INVENTION

Problems to be Solved by the Invention

As described in Non-Patent Document 1 to Non-Patent Document 3, various researches and developments on ferroelectrics have been carried out. For example, Non-Patent Document 1 has reported that the sign of polarization (P) changes due to oxygen atom movement in "orthorhombic phase Ferroelectric". Furthermore, Non-Patent Document 2 has reported that the magnitude of polarization and the permittivity ($\varepsilon_r$) change depending on the composition ratio between Hf and Zr. Non-Patent Document 3 has reported occurrence of ferroelectric switching in $Al_{1-x}Sc_xN$.

In view of this, an object of one embodiment of the present invention is to provide a material having favorable ferroelectricity, that is, a metal nitride film having ferroelectricity. Another object of one embodiment of the present invention is to provide a capacitor utilizing a material that can have ferroelectricity. Another object of one embodiment of the present invention is to provide a transistor utilizing a material that can have ferroelectricity. Another object of one embodiment of the present invention is to provide a capacitor and a diode each utilizing a material that can have ferroelectricity. Another object of one embodiment of the present invention is to provide an element utilizing a material that can have ferroelectricity and utilizing a tunnel junction.

Note that the description of these objects does not preclude the existence of other objects. In one embodiment of the present invention, there is no need to achieve all these objects. Other objects will be apparent from the description of the specification, the drawings, the claims, and the like, and other objects can be derived from the description of the specification, the drawings, the claims, and the like.

Means for Solving the Problems

One embodiment of the present invention is a ferroelectric device that includes an insulating film, a first conductor over the insulating film, a metal nitride film over the first conductor, a second conductor over the metal nitride film, a first insulator over the first conductor, over the metal nitride film, and over the second conductor, and a second insulator over the first insulator. The first conductor, the metal nitride film, and the second conductor are surrounded by the insulating film, the first insulator, and the second insulator; the metal nitride film has ferroelectricity; the metal nitride film contains a first element, a second element, and nitrogen; the first element is one or more elements selected from Group 13 elements; the second element is one or more elements selected from Group 2 elements to Group 6 elements and Group 13 elements other than the first element; the first conductor and the second conductor each contain nitrogen; the first insulator contains aluminum and oxygen; and the insulating film and the second insulator each contain silicon and nitrogen.

Another embodiment of the present invention is a ferroelectric device that includes a first conductor, a metal nitride film over the first conductor, a second conductor over the metal nitride film, a first insulator over the first conductor, over the metal nitride film, and over the second conductor, and a second insulator over the first insulator. The first insulator includes a region in contact with the side surface of the metal nitride film, a region in contact with the side surface of the second conductor, and a region in contact with the top surface of the second conductor; the metal nitride film has ferroelectricity; the metal nitride film contains a first element, a second element, and nitrogen; the first element is one or more elements selected from Group 13 elements; the second element is one or more elements selected from Group 2 elements to Group 6 elements and Group 13 elements other than the first element; the first conductor and the second conductor each contain nitrogen; the first insulator contains aluminum and oxygen; and the second insulator contains silicon and nitrogen.

In the above ferroelectric device, the first insulator preferably has an amorphous structure.

Another embodiment of the present invention is a ferroelectric device that includes an insulating film, a first conductor over the insulating film, a metal nitride film over the first conductor, a second conductor over the metal nitride film, and an insulator over the first conductor, over the metal nitride film, and over the second conductor. The insulator includes a region in contact with the top surface of the insulating film, a region in contact with the side surface of the metal nitride film, a region in contact with the side surface of the second conductor, and a region in contact with the top surface of the second conductor; the metal nitride film has ferroelectricity; the metal nitride film contains a first element, a second element, and nitrogen; the first element is one or more elements selected from Group 13 elements; the second element is one or more elements selected from Group 2 elements to Group 6 elements and Group 13 elements other than the first element; the first conductor and the second conductor each contain nitrogen; and the insulating film and the insulator each contain silicon and nitrogen.

In the above ferroelectric device, the metal nitride film preferably has a wurtzite type structure.

In the above ferroelectric device, the first element is preferably any one or more of aluminum (Al), gallium (Ga), and indium (In).

In the above ferroelectric device, the second element is preferably any one or more of boron (B), scandium (Sc), yttrium (Y), lanthanum (La), cerium (Ce), neodymium (Nd), and europium (Eu).

In the above ferroelectric device, it is preferable that the first element be aluminum (Al) and the second element be one or more selected from lanthanoids and actinoids.

In the above ferroelectric device, it is preferable that the first element be aluminum (Al) and the second element be one or more selected from titanium (Ti), zirconium (Zr), hafnium (Hf), vanadium (V), niobium (Nb), and tantalum (Ta).

In the above ferroelectric device, the first conductor preferably includes a crystal having a sodium chloride type structure.

In the above ferroelectric device, a silicon nitride film may be included between the first conductor and the metal nitride film. Alternatively, a silicon nitride film may be included between the metal nitride film and the second conductor.

Another embodiment of the present invention is a semiconductor device that includes the above ferroelectric device and a transistor whose channel formation region contains an oxide semiconductor.

Another embodiment of the present invention is a metal nitride film having ferroelectricity, and the metal nitride film contains aluminum, nitrogen, and one or more selected from lanthanoids and actinoids.

Another embodiment of the present invention is a metal nitride film having ferroelectricity, and the metal nitride film contains aluminum, nitrogen, one or more selected from titanium (Ti), zirconium (Zr), hafnium (Hf), vanadium (V), niobium (Nb), and tantalum (Ta), and one or more selected from magnesium (Mg), calcium (Ca), zinc (Zn), and the like.

Effect of the Invention

According to one embodiment of the present invention, a material having favorable ferroelectricity, that is, a metal nitride film having ferroelectricity can be provided. According to another embodiment of the present invention, a capacitor utilizing a material that can have ferroelectricity can be provided. According to another embodiment of the present invention, a transistor utilizing a material that can have ferroelectricity can be provided. According to another embodiment of the present invention, a capacitor and a diode each utilizing a material that can have ferroelectricity can be provided. According to another embodiment of the present invention, an element utilizing a material that can have ferroelectricity and utilizing a tunnel junction can be provided.

Note that the description of these effects does not preclude the existence of other effects. One embodiment of the present invention does not have to have all these effects. Note that other effects will be apparent from the description of the specification, the drawings, the claims, and the like and other effects can be derived from the description of the specification, the drawings, the claims, and the like.

BRIEF DESCRIPTION OF THE DRAWINGS

FIG. 7A1, FIG. 7B1, and FIG. 7C1 are diagrams each illustrating a circuit diagram of a semiconductor device of one embodiment of the present invention. FIG. 7A2, FIG. 7B2, FIG. 7C2, FIG. 7C3, and FIG. 7C4 are diagrams each illustrating a cross-sectional structure of a semiconductor device of one embodiment of the present invention.

FIG. 10A is a diagram illustrating classifications of crystal structures of IGZO. FIG. 10B is a diagram illustrating an XRD spectrum of a CAAC-IGZO film. FIG. 10C is a diagram illustrating nanobeam electron diffraction patterns of a CAAC-IGZO film.

FIG. 29A is a circuit diagram showing a structure example of a memory cell. FIG. 29B1 is a graph showing an example of hysteresis characteristics of a ferroelectric layer. FIG. 29B2 is a graph showing an example of hysteresis characteristics of an ideal ferroelectric layer. FIG. 29C is a timing chart showing an example of a method for driving the memory cell.

MODE FOR CARRYING OUT THE INVENTION

Figure 1A:
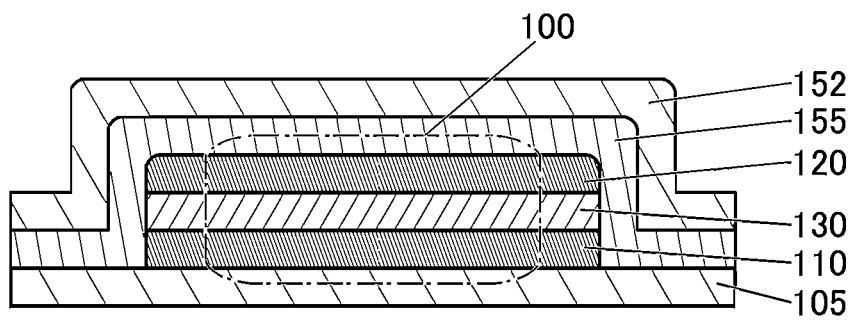
FIG. 1A to FIG. 1C are cross-sectional views of capacitors of embodiments of the present invention.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be illustrated.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

Moreover, in this specification and the like, terms for describing arrangement, such as "over" and "under", are used for convenience for describing the positional relationship between components with reference to drawings. The positional relationship between components is changed as appropriate in accordance with the direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and a current can flow between the source and the drain through the channel formation region. Note that in this specification and the like, a channel formation region refers to a region through which a current mainly flows.

Furthermore, functions of a source and a drain are sometimes interchanged with each other when transistors having different polarities are used or when the direction of a current is changed in a circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where a current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, the length of a channel formation region in a direction perpendicular to a channel length direction in a region where a semiconductor (or a portion where a current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, oxygen vacancies (also referred to as $V_O$) are formed in an oxide semiconductor in some cases by entry of impurities, for example.

Note that in this specification and the like, the oxygen content is higher than the nitrogen content in the composition of an oxynitride. For example, the oxygen content is higher than the nitrogen content in the composition of silicon oxynitride. The nitrogen content is higher than the oxygen content in the composition of a nitride oxide. For example, the nitrogen content is higher than the oxygen content in the composition of silicon nitride oxide.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included.

Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be referred to as a transistor including a metal oxide or an oxide semiconductor.

In this specification and the like, "normally off" means that a drain current per micrometer of channel width flowing through a transistor when no potential is applied to a gate or the gate is supplied with a ground potential is $1\times10^{-20}$ A or lower at room temperature, $1\times10^{-18}$ A or lower at 85° C., or $1\times10^{-16}$ A or lower at 125° C.

In this specification, in the case where the maximum value and the minimum value are specified, a structure in which the maximum value and the minimum value are freely combined is disclosed.

Note that in this specification, a barrier insulating film refers to an insulating film having a barrier property. A barrier property in this specification means a function of inhibiting diffusion of a targeted substance (also referred to as having low permeability). Alternatively, a barrier property in this specification refers to a function of capturing or fixing (also referred to as gettering) a targeted substance.

In this specification and the like, the description "A covers B", "A surrounds B", "A surrounds and covers B", or the like does not necessarily mean a state where the whole of B is obscured by A. The description "A covers B", "A surrounds B", "A surrounds and covers B", or the like encompasses a state where part of B is exposed out of A. In this specification and the like, the description "A covers B" can be referred to as "A surrounds B" or "A surrounds and covers B".

Embodiment 1

In this embodiment, structure examples of a capacitor and a ferroelectric device of embodiments of the present invention are described with reference to FIG. 1 to FIG. 7.

<Structure of Capacitor>

As illustrated in FIG. 1A, a capacitor 100 of one embodiment of the present invention includes a conductor 110, a conductor 120, and an insulator 130 interposed between the conductor 110 and the conductor 120. For example, the conductor 110 is placed over an insulator 105, the insulator 130 is placed over the conductor 110, and the conductor 120 is placed over the insulator 130. Here, the conductor 110 functions as a lower electrode of the capacitor 100, the conductor 120 functions as an upper electrode of the capacitor 100, and the insulator 130 functions as a dielectric of the capacitor 100.

Furthermore, as illustrated in FIG. 1A, an insulator 152 is placed so as to surround the capacitor 100, and an insulator 155 is placed at least between the insulator 152 and the insulator 130. For example, as illustrated in FIG. 1A, the insulator 155 is placed so as to surround the conductor 110, the insulator 130, and the conductor 120, and the insulator 152 is placed so as to surround the insulator 155. In this case, the insulator 155 in a region not overlapping with the conductor 110 may be in contact with the insulator 105. As shown in FIG. 1A, the insulator 155 includes a region in contact with the side surface of the conductor 110, a region in contact with the side surface of the insulator 130, a region in contact with the side surface of the conductor 120, and a region in contact with the top surface of the conductor 120.

At least one of the insulator 152 and the insulator 155 functions as a barrier insulating film against hydrogen. The insulator 152 has a function of inhibiting diffusion of at least one of hydrogen and a substance bonded with hydrogen (for example, OH$^-$). Thus, the insulator 152 is regarded as an insulator with higher capability of inhibiting diffusion of at least one of hydrogen and a substance bonded with hydrogen (for example, OH$^-$) than the insulator 130. The insulator 155 has a function of capturing or fixing (also referred to as gettering) at least one of hydrogen and a substance bonded with hydrogen. Thus, the insulator 155 is regarded as an insulator with higher capability of capturing or fixing at least one of hydrogen and a substance bonded with hydrogen than the insulator 130.

The insulator 130 is preferably formed using a material that can have ferroelectricity. An example of a material having ferroelectricity is a metal nitride having a wurtzite type structure (space group: P6$_3$mc). In a wurtzite type structure, spontaneous polarization along a c-axis occurs. Depending on the kinds and combination of cations placed at the cation sites of a wurtzite type structure, the polarity of polarization is inverted by an external electric field in the range in which dielectric breakdown does not occur. Changing the direction or strength of the external electric field is presumed to move some nitrogen atoms in a metal nitride and change the sign of internal polarization. At that time, ferroelectricity is exhibited.

In view of the above, a metal nitride containing a first element, a second element, and nitrogen can have ferroelectricity. Here, the first element is one or more elements selected from Group 13 elements. The second element is an element that lowers the barrier at the time of inversion of the polarity of polarization (also referred to as inversion barrier). For example, a metal nitride containing the second element as a main component is preferably able to have a crystal structure other than a wurtzite type structure, further preferably able to have a layered hexagonal structure (space group: P6$_3$/mmc) or a sodium chloride type structure (NaCl type structure, space group: Fm-3m). The second element is, specifically, one or more elements selected from Group 2 elements to Group 6 elements, Group 13 elements other than the first element, and the like. A metal nitride containing the first element as a main component is likely to have a wurtzite type crystal structure. Furthermore, when the metal nitride contains the second element, the polarity of polarization is sometimes inverted in the metal nitride by an external electric field in the range in which dielectric breakdown does not occur.

An example of the material that can have ferroelectricity is a metal nitride containing an element M1, an element M2, and nitrogen. Note that the element M1 corresponds to the first element and the element M2 corresponds to the second element. Here, the element M1 is one or more selected from aluminum (Al), gallium (Ga), indium (In), and the like. The element M2 is one or more selected from boron (B), rare earth elements, and actinoids (15 elements from actinium (Ac) to lawrencium (Lr)). Note that the rare earth element is a general term for scandium (Sc), yttrium (Y), and lanthanoids (15 elements from lanthanum (La) to lutetium (Lu)); accordingly, the element M2 is one or more selected from boron (B), scandium (Sc), yttrium (Y), lanthanoids, and actinoids. It is particularly preferable that the element M2 be one or more selected from boron (B), scandium (Sc), yttrium (Y), lanthanum (La), cerium (Ce), neodymium (Nd), europium (Eu), and the like. Note that the ratio between the number of nitrogen atoms and the sum of the numbers of atoms of the element M1 and the element M2 is 1:1 or in the neighborhood thereof. Note that the neighborhood includes the range of ±30% of an intended ratio between the numbers of atoms. Here, the ratio between the number of atoms of the element M1 and the number of atoms of the element M2 can be set as appropriate. For example, the number of atoms of the element M1 is preferably larger than the number of atoms of the element M2, further preferably 1.5 times as large as the number of atoms of the element M2. The ratio between the number of atoms of the element M1 and the number of atoms of the element M2 is preferably in the range in which the metal nitride can form a solid solution. In the case where two or more of aluminum, gallium, indium, and the like are selected as the element M1, a metal nitride containing the element M1 and nitrogen sometimes has ferroelectricity without the element M2.

Typical examples of a metal nitride containing the element M1, the element M2, and nitrogen include metal nitrides such as aluminum scandium nitride ($Al_{1-a}Sc_aN_b$ (a is a real number greater than 0 and less than 0.5, and b is 1 or a value in the neighborhood of 1)), Al—Ga—Sc nitride ($Al_{1-c-d}Ga_cSc_dN_b$ (c and d are each a positive real number, c+d is greater than 0 and less than 0.5, and b is 1 or a value in the neighborhood of 1)), and Ga—Sc nitride ($Ga_{1-e}Sc_eN_b$ (e is a real number greater than 0 and less than 1, and b is 1 or a value in the neighborhood of 1)). In other words, as an example of the material that can have ferroelectricity, a material containing aluminum nitride and/or scandium nitride can be given.

In some cases, it is preferable to use Al—Ga—Sc nitride as the material that can have ferroelectricity, rather than aluminum scandium nitride. The ion radius of gallium is larger than that of aluminum and smaller than that of scandium. It is thus presumable that the crystal structure and lattice constant of aluminum scandium nitride can be adjusted by addition of gallium to the aluminum scandium nitride so that exhibition of ferroelectricity is facilitated. Accordingly, exhibition of ferroelectricity in Al—Ga—Sc nitride is expected. The band gap of gallium nitride is narrower than that of aluminum nitride and wider than that of scandium nitride. Therefore, scandium aluminum nitride has an enhanced insulating property by addition of gallium to aluminum scandium nitride, thereby becoming usable in a later-described ferroelectric device.

Another example of the material that can have ferroelectricity is a metal nitride containing the element M1, an element M3, and nitrogen. Note that the element M1 corresponds to the first element and the element M3 corresponds to the second element. Here, the element M1 is one or more selected from aluminum (Al), gallium (Ga), indium (In), and the like. The element M3 is one or more selected from titanium (Ti), zirconium (Zr), hafnium (Hf), vanadium (V), niobium (Nb), tantalum (Ta), chromium (Cr), and the like. In a metal nitride of titanium, zirconium, hafnium, vanadium, niobium, tantalum, or chromium, the valence of these metal elements is +3. Accordingly, also in a metal nitride containing the element M1, the element M3, and nitrogen, the valence of the element M3 can be +3. Therefore, the electrical neutrality of the metal nitride is sometimes maintained when the ratio between the number of nitrogen atoms and the sum of the numbers of atoms of the element M1 and the element M3 is 1:1 or in the neighborhood thereof.

A metal nitride containing the element M1, the element M3, and nitrogen may contain an element M4. Here, the element M4 is an element that can maintain the electrical neutrality of the metal nitride. The element M4 is, for example, an element that easily has a valence of +1 or an element that easily has a valence of +2. The element M4 is, specifically, one or more selected from sodium (Na), potassium (K), rubidium (Ru), cesium (Cs), magnesium (Mg), calcium (Ca), strontium (Sr), zinc (Zn), cadmium (Cd), and the like. Titanium, zirconium, hafnium, vanadium, niobium, tantalum, and chromium, which are given as examples of the element M3, can have a valence greater than or equal to +4. It is thus presumable that the electrical neutrality of the metal nitride is maintained when the metal nitride contains the element M4 that can maintain the electrical neutrality of the metal nitride. Note that the ratio between the number of atoms of the element M3 and the number of atoms of the element M4 can be appropriately set in accordance with the kind of the element selected as the element M3 or the element M4. For example, in the case where the element M4 is an element that easily has a valence of +2 (e.g., Mg, Ca, Sr, Zn, or Cd) and the element M3 is an element that can have a valence of +4 (e.g., Ti, Zr, or Hf), the ratio between the number of atoms of the element M4 and the number of atoms of the element M3 is preferably 1:1 or in the neighborhood thereof. In the case where the element M4 is an element that easily has a valence of +2 and the element M3 is an element that can have a valence of +5 (e.g., V, Nb, or Ta), alternatively, the ratio between the number of atoms of the element M4 and the number of atoms of the element M3 is preferably 2:1 or in the neighborhood thereof. In the case where the element M4 is an element that easily has a valence of +1 (e.g., Na, K, Ru, or Cs) and the element M3 is an element that can have a valence of +5, further alternatively, the ratio between the number of atoms of the element M4 and the number of atoms of the element M3 is preferably 1:1 or in the neighborhood thereof. The ratio between the number of atoms of the element M1, the number of atoms of the element M3, and the number of atoms of the element M4 can be set as appropriate. For example, the number of atoms of the element M1 is preferably larger than the sum of the number of atoms of the element M3 and the number of atoms of the element M4.

A metal nitride containing the element M1, the element M2, and nitrogen may contain the element M3 or the element M4. In that case, the ratio of the number of atoms of the element M3 or the element M4 to the sum of the numbers of atoms of the element M1 and the element M2 is preferably less than or equal to 0.05, further preferably less than or equal to 0.02. That makes it possible to reduce the number of defects formed to maintain the electrical neutrality of the metal nitride. Reducing the number of defects increases the crystallinity of the metal nitride and facilitates exhibition of ferroelectricity.

A metal nitride containing the element M1, the element M3, and nitrogen may contain the element M2. In that case, there is no particular limitation on the ratio between the number of atoms of the element M2 and the sum of the numbers of atoms of the element M1 and the element M3.

This is because the electrical neutrality of the metal nitride is maintained even when the metal nitride contains the element M2.

A metal nitride containing the element M1, the element M3, the element M4, and nitrogen may contain the element M2. In that case, there is no particular limitation on the ratio between the number of atoms of the element M2 and the sum of the numbers of atoms of the element M1, the element M3, and the element M4. This is because the electrical neutrality of the metal nitride is maintained even when the metal nitride contains the element M2.

Since the above metal nitride contains at least a Group 13 element and nitrogen, which is a Group 15 element, the metal nitride is referred to as a ferroelectric of Group III-V, a ferroelectric of a Group III nitride, or the like in some cases.

<Calculation for Material that can have Ferroelectricity>

The material that can have ferroelectricity is described using results of first-principles calculation. Here, a metal nitride is given as an example of the material that can have ferroelectricity.

Figure 2A:
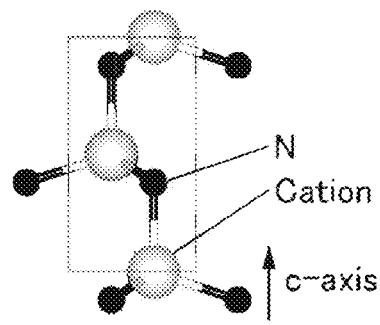
FIG. 2A to FIG. 2C are diagrams each illustrating atomic position in a metal nitride.
Figure 2B:
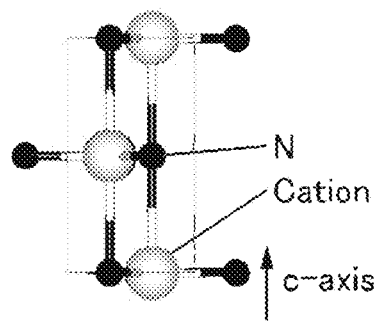
Figure 2C:
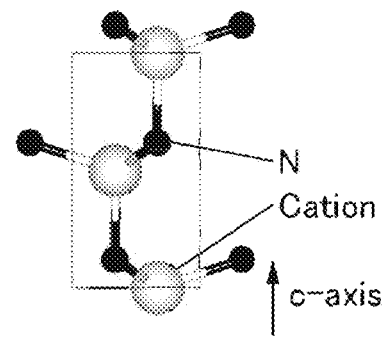

FIG. 2A to FIG. 2C show the atomic position in the metal nitride. FIG. 2A and FIG. 2C show the atomic position in a wurtzite type structure, and FIG. 2B shows the atomic position in a layered hexagonal structure. In FIG. 2A to FIG. 2C, the white spheres are cations (cation sites) and the black spheres are nitrogen (N) (nitrogen (N) sites). The arrow in each of FIG. 2A to FIG. 2C indicates the c-axis direction (c-axis) of the crystal structure of the metal nitride. A plane perpendicular to a c-axis is an a-b plane of the crystal structure of the metal nitride.

As described above, polarization along a c-axis occurs in a metal nitride having a wurtzite type structure. For example, polarization along a c-axis occurs in the case where the atomic position in the metal nitride is as shown in FIG. 2A. Furthermore, the polarity of polarization of the metal nitride is inverted by an external electric field in the range in which dielectric breakdown does not occur. For example, the polarity of polarization is inverted when the atomic position in the metal nitride changes from the atomic position shown in FIG. 2A to the atomic position shown in FIG. 2C.

From FIG. 2A and FIG. 2C, it is estimated that the polarity of polarization is inverted when a nitrogen atom traverses and moves across a cation-containing layer that is parallel to the a-b plane. That is, it is estimated that in the process of inversion of the polarity of polarization, the atomic position in the metal nitride is temporarily one where a nitrogen atom is positioned in the cation-containing layer that is parallel to the a-b plane. In the process of inversion of the polarity of polarization, the atomic position in the metal nitride is temporarily as shown in FIG. 2B, for example. In other words, it is estimated that the polarity of polarization of the metal nitride is inverted when the atomic position changes from the atomic position shown in FIG. 2A to the atomic position shown in FIG. 2C via the atomic position shown in FIG. 2B.

It can be said that the lower the barrier at the time of inversion of the polarity of polarization (also referred to as inversion barrier) is, the more easily the polarity of polarization is inverted. In view of this, an inversion barrier for each kind and proportion of atom positioned at a cation site is calculated by first-principles calculation using a calculation model of a wurtzite type structure and a calculation model of a layered hexagonal structure.

First, the calculation models used for the first-principles calculation are described.

First of all, a unit cell of a wurtzite type structure and a unit cell of a layered hexagonal structure are prepared. In each of the two unit cells, cation:nitrogen=1:1 [atomic ratio]. Then, the two unit cells are expanded to create supercells each having 32 atoms. At this time, the number of cations (cation sites) included in the supercell is 16, and the number of nitrogen atoms (nitrogen sites) included in the supercell is 16. In this manner, the supercell of a wurtzite type structure and the supercell of a layered hexagonal structure can be prepared.

Figure 2D:
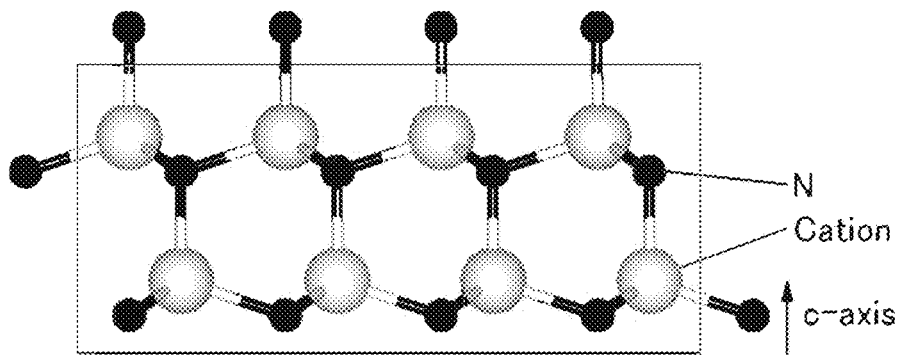
FIG. 2D and FIG. 2E are diagrams for illustrating calculation models.
Figure 2E:
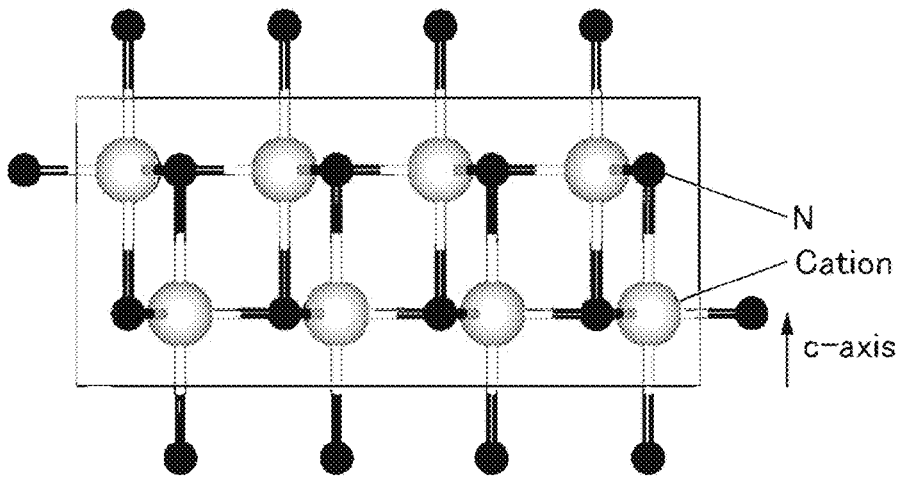

FIG. 2D and FIG. 2E show the above two supercells. In the supercell shown in FIG. 2D, the crystal structure is a wurtzite type structure and the periodicity of the atomic arrangement is the same as the periodicity of the atomic arrangement in the structure shown in FIG. 2A. In the calculation model shown in FIG. 2E, the crystal structure is a layered hexagonal structure and the periodicity of atomic arrangement is the same as the periodicity of atomic arrangement in the structure shown in FIG. 2B. The arrow in each of FIG. 2D and FIG. 2E indicates the c-axis direction of the crystal structure of the supercell. A plane perpendicular to a c-axis is an a-b plane of the crystal structure of the supercell.

Then, an aluminum atom (Al) or a metal atom different from an aluminum atom is placed at each cation site of the above two supercells, so that the calculation model of a wurtzite type structure and the calculation model of a layered hexagonal structure are created. Hereinafter, the metal atom different from an aluminum atom is referred to as an atom M0. The proportion of the number of atoms M0 placed at the cation sites in the calculation model to the number of cation sites in the calculation model is a [%]. For example, in the case where the atom M0 is placed at one cation site in the calculation model, the proportion is 6.25% (1/16).

Next, the kind and/or proportion a of the atom M0 are/is varied, so that 20 calculation models of a wurtzite type structure and 20 calculation models of a layered hexagonal structure are created. In this calculation, the atom M0 is a scandium atom (Sc), a titanium atom (Ti), a zirconium atom (Zr), a hafnium atom (Hf), a vanadium atom (V), a niobium atom (Nb), or a tantalum atom (Ta). The proportion a is 6.25%, 12.5%, 25%, or 50%. In one of the 20 calculation models, aluminum atoms are placed at all the cation sites.

Structure optimization is performed on the above 40 calculation models by first-principles calculation. For the first-principles calculation, the first-principles calculation software VASP (The Vienna Ab initio simulation) is used. The calculation conditions are listed in Table 1.

TABLE 1

| Calculation program | VASP |
| Basis function | Plane wave |
| Functional | GGA-PBE |
| Pseudopotential | PAW |
| Cutoff energy | 500 eV |
| Number of electrons | Neutral |
| k-point grid | 5 × 3 × 7 |
| Number of atoms | 32 |

As a pseudopotential of electronic states, a potential generated by a Projector Augmented Wave (PAW) method was used, and as a functional, GGA/PBE (Generalized-Gradient-Approximation/Perdew-Burke-Ernzerhof) was used. Symmetry is taken into consideration.

The structure optimization of the calculation models is performed by repetitively carrying out calculation in which an atomic coordinate is optimized with the shape and volume of the cell fixed and calculation in which the shape, volume, and atomic coordinate of the cell are optimized.

The inversion barriers are calculated with the use of the calculation models of a layered hexagonal structure after the structure optimization and the calculation models of a wurtzite type structure after the structure optimization. Specifically, the inversion barrier is the value obtained by dividing by 16 the value obtained by subtracting the total energy calculated from the calculation model of a wurtzite type structure after the structure optimization from the total energy calculated from the calculation model of a layered hexagonal structure after the structure optimization.

Figure 3A:
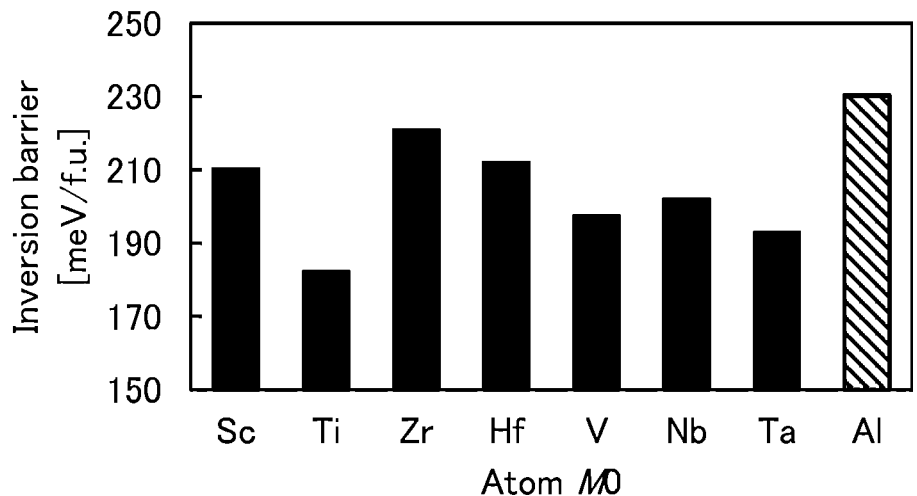
FIG. 3A and FIG. 3B are diagrams illustrating calculation results.

FIG. 3A shows the inversion barriers calculated using the calculation models in which the proportion a is 6.25%. In FIG. 3A, the horizontal axis represents the atom M0 and the vertical axis represents the inversion barrier [meV/f.u.] (f.u.: formula unit). As a reference, FIG. 3A also shows the inversion barrier calculated using the calculation model in which aluminum atoms are placed at all the cation sites (the calculation model in which the proportion a is 0%). Note that the calculation model in which the proportion a is 0% is referred to as a calculation model in which the atom M0 is Al.

FIG. 3A suggests that the inversion barrier is lowered by addition of Sc, Ti, Zr, Hf, V, Nb, or Ta to aluminum nitride. Specifically, FIG. 3A suggests that the inversion barrier is further lowered in the case where the atom added to aluminum nitride is Ti, V, Nb, or Ta. It is thus estimated that a metal nitride containing Al, nitrogen, and one or more selected from Sc, Ti, Zr, Hf, V, Nb, and Ta can have ferroelectricity.

Figure 3B:
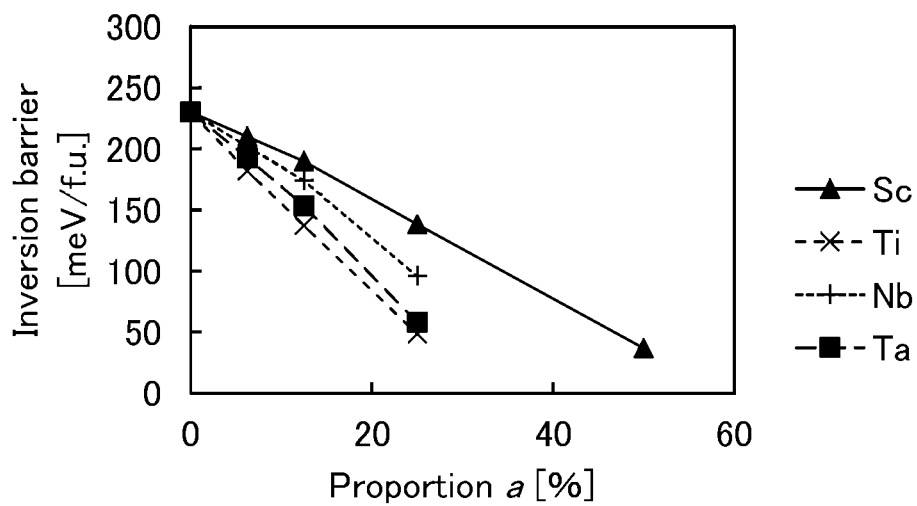

Next, the relationship between the proportion a and the inversion barrier is described with reference to FIG. 3B. FIG. 3B is a diagram illustrating the relationship between the proportion a and the inversion barrier. The inversion barriers shown in FIG. 3B are calculated using a calculation model in which the atom M0 is Sc, Ti, Nb, or Ta. In FIG. 3B, the horizontal axis represents the proportion a [%] and the vertical axis represents the inversion barrier [meV/f.u.]. When structure optimization is performed on a calculation model of a wurtzite type structure in which the proportion a is 50% and the atom M0 is Ti, Nb, or Ta, the structure is changed into a layered hexagonal structure. It is thus difficult to calculate an inversion barrier with the use of a calculation model in which the proportion a is 50% and the atom M0 is Ti, Nb, or Ta. For this reason, an inversion barrier for a calculation model in which the proportion a is 50% and the atom M0 is Ti, Nb, or Ta is not plotted in FIG. 3B.

FIG. 3B shows the tendency for the inversion barrier to become lower as the proportion a increases. FIG. 3B also suggests the possibility that no polarization occurs when the atom M0 is Ti, Nb, or Ta and the proportion a is 50%. It is thus estimated that a metal nitride containing Al, nitrogen, and Ti, Nb, or Ta can have ferroelectricity when the number of Al atoms is larger than the number of Ti atoms, Nb atoms, or Ta atoms.

The material that can have ferroelectricity has been described above using the results of the first-principles calculation.

As the material that can have ferroelectricity, a mixture or a compound containing a plurality of materials selected from the above-described materials can be used, for example. Alternatively, the insulator 130 can have a stacked-layer structure of a plurality of materials selected from the above-described materials. As a side note, since the crystal structures (properties) of the aforementioned materials and the like can be changed depending on the processes as well as the deposition conditions, only a material that exhibits ferroelectricity is referred to as a material that can have ferroelectricity as well as a ferroelectric in this specification and the like. Furthermore, the ferroelectric includes not only a material that exhibits ferroelectricity but also a material that can have ferroelectricity.

The above-described metal nitride, specifically, the material containing aluminum nitride and/or scandium nitride, is especially preferable as the material that can have ferroelectricity because of being able to have ferroelectricity even when processed into a several-nanometer-thick thin film. Here, the thickness of the insulator 130 can be less than or equal to 100 nm, preferably less than or equal to 50 nm, further preferably less than or equal to 20 nm, still further preferably less than or equal to 10 nm (typically greater than or equal to 2 nm and less than or equal to 9 nm). The thickness is preferably greater than or equal to 8 nm and less than or equal to 12 nm, for example. When having the above-described thickness, the material that can have ferroelectricity can be thin and exhibit ferroelectricity. When a ferroelectric layer that can be thin is used, the capacitor 100 can be combined with a semiconductor element such as a miniaturized transistor to form a semiconductor device. Note that in this specification and the like, a layer of the material that can have ferroelectricity is referred to as a ferroelectric layer or a metal nitride film, in some cases. In this specification and the like, a device that includes such a ferroelectric layer (metal nitride film) is sometimes referred to as a ferroelectric device.

When the above-described metal nitride layer is used as the insulator 130, oxidation of the conductor 110 and the conductor 120 and resultant reduction of conductivity can be inhibited.

The material that can have ferroelectricity is an insulator, and a property of the material is that internal polarization occurs by application of an electric field from the outside and the polarization remains even after the electric field is set to zero. Thus, with a capacitor that includes this material as a dielectric (hereinafter, the capacitor may be referred to as a ferroelectric capacitor), a nonvolatile storage element can be formed. A nonvolatile storage element that includes a ferroelectric capacitor is sometimes referred to as an FeRAM (Ferroelectric Random Access Memory), a ferroelectric memory, or the like. For example, a ferroelectric memory can have a structure which includes a transistor and a ferroelectric capacitor and in which one of a source and a drain of the transistor is electrically connected to one terminal of the ferroelectric capacitor. Thus, the semiconductor device that includes the capacitor 100 described in this embodiment and a transistor can function as a ferroelectric memory.

Figure 4A:
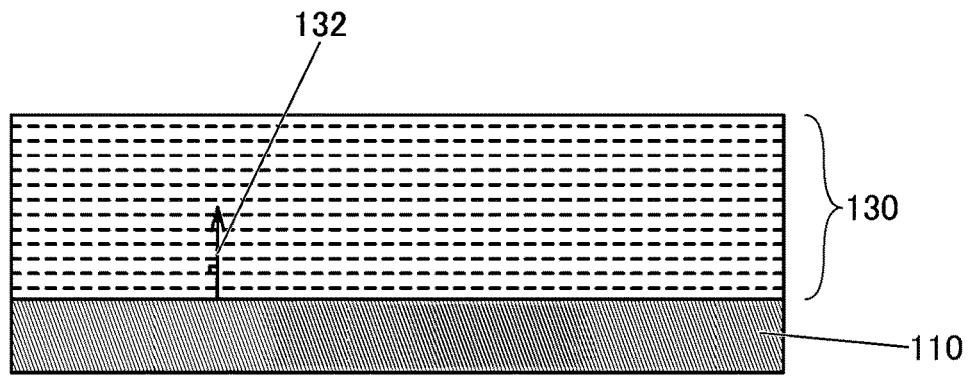
FIG. 4A to FIG. 4C are schematic views of a ferroelectric included in a capacitor.
Figure 4B:
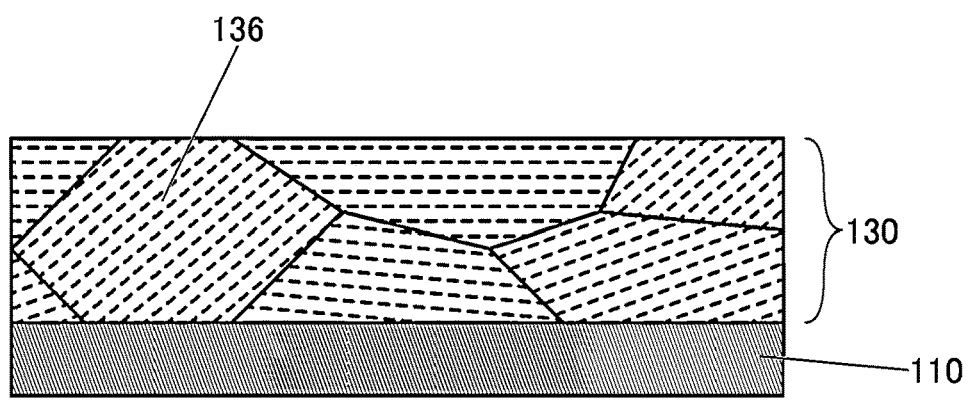
Figure 4C:
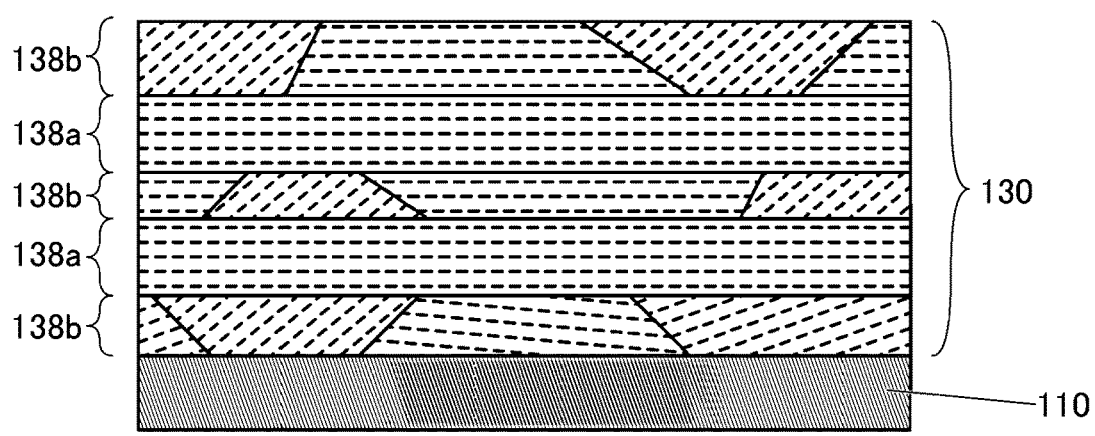

FIG. 4A to FIG. 4C are enlarged views showing the vicinity of the insulator 130 that functions as a ferroelectric layer and is illustrated in FIG. 1A or the like.

As illustrated in FIG. 4A, the insulator 130 preferably has a crystal structure where layers each formed by crystals are stacked. Furthermore, the layers each preferably include a single crystal structure. Note that dashed lines in the insulator 130 illustrated in FIG. 4A represent crystal layers and an arrow 132 represents the c-axis of the crystals.

The crystal layers included in the insulator 130 extend in the a-b plane direction. In addition, the crystal layers included in the insulator 130 grow in the c-axis direction (sometimes referred to as axial growth), and the plurality of crystal layers are stacked in the c-axis direction. The c-axis preferably faces in a direction substantially perpendicular to the formation surface or top surface of the insulator 130. For example, an angle θ formed by a normal with respect to the top surface of the conductor 110 and the arrow 132 is preferably less than or equal to 30°, further preferably less than or equal to 5°.

Although a ferroelectric layer having a single crystal structure illustrated in FIG. 4A or the like is used as the insulator 130 in the example described above, the present invention is not limited thereto. For example, as illustrated in FIG. 4B, the insulator 130 may have a polycrystalline structure that includes a plurality of grains 136 with different crystallinities. Here, at least one of the plurality of grains 136 preferably has a hexagonal crystal structure, further preferably a wurtzite type structure. At least one of the plurality of grains 136 preferably has a hexagonal crystal structure, in which case the insulator 130 exhibits ferroelectricity.

The insulator 130 may include a layer 138a having a single crystal structure and a polycrystalline layer 138b. For example, as illustrated in FIG. 4C, a plurality of the layers 138a each having a single crystal structure and a plurality of the polycrystalline layers 138b may be stacked over the conductor 110.

The insulator 130 preferably has a hexagonal crystal structure to exhibit ferroelectricity. Alternatively, the insulator 130 may have an amorphous structure. Alternatively, the insulator 130 may have a composite structure that includes an amorphous structure and a crystal structure.

In order to form the insulator 130 with favorable crystallinity, impurities such as hydrogen, carbon, a hydrocarbon, and chlorine in the insulator 130 are preferably reduced. Here, the above impurities do not indicate only atoms of single elements. It is preferable that the amount of substances bonded with any of the above impurity elements be reduced in the insulator 130. For example, it is also preferable to reduce a substance bonded with hydrogen (e.g., OH⁻) or the like in the insulator 130. Such impurities form nitrogen vacancies in crystals in the insulator 130 in some cases. Furthermore, an impurity element such as hydrogen is bonded to the nitrogen vacancy part to reduce crystallinity of the insulator 130 in some cases. Accordingly, when the impurities are contained in the insulator 130, crystallization of the insulator 130 is inhibited in some cases. As described above, nitrogen is displaced by an external electric field, resulting in exhibiting ferroelectricity. Thus, in order to improve the ferroelectricity of the insulator 130, impurities such as hydrogen, carbon, a hydrocarbon, and chlorine are preferably reduced.

Therefore, the insulator 130 is preferably formed using a material that contains no or an extremely small amount of impurities such as hydrogen, carbon, a hydrocarbon, and chlorine. For example, the concentration of hydrogen contained in the insulator 130 is preferably lower than or equal to $5\times10^{20}$ atoms/cm³, further preferably lower than or equal to $1\times10^{20}$ atoms/cm³. For example, the concentration of a hydrocarbon contained in the insulator 130 is preferably lower than or equal to $5\times10^{20}$ atoms/cm³, further preferably lower than or equal to $1\times10^{20}$ atoms/cm³, still further preferably lower than or equal to $5\times10^{19}$ atoms/cm³. For example, the concentration of carbon contained in the insulator 130 is preferably lower than or equal to $5\times10^{20}$ atoms/cm³, further preferably lower than or equal to $1\times10^{20}$ atoms/cm³, still further preferably lower than or equal to $5\times10^{19}$ atoms/cm³. For example, the concentration of chlorine contained in the insulator 130 is preferably lower than or equal to $5\times10^{21}$ atoms/cm³, further preferably lower than or equal to $1\times10^{21}$ atoms/cm³, still further preferably lower than or equal to $5\times10^{20}$ atoms/cm³.

Note that the impurities can be quantified by secondary ion mass spectrometry (SIMS), X-ray photoelectron spectroscopy (XPS), or auger electron spectroscopy (AES). For example, impurities such hydrogen, carbon, a hydrocarbon, and chlorine in the insulator 130 can be quantified by SIMS analysis.

Thus, in one embodiment of the present invention, the insulator 152 is provided to surround the capacitor 100 to employ a structure where the insulator 155 is provided between the insulator 152 and the insulator 130. With the insulator 152, diffusion of impurities such as hydrogen into the insulator 130 from outside the insulator 152 can be inhibited. Furthermore, with the insulator 155, impurities such as hydrogen existing in a region surrounded by the insulator 152 can be captured or fixed, whereby the concentration of impurities such as hydrogen included in the insulator 130 can be reduced.

For each of the insulator 152 and the insulator 155, aluminum oxide, magnesium oxide, hafnium oxide, gallium oxide, indium gallium zinc oxide, silicon nitride, silicon nitride oxide, or the like can be used, for example. As the insulator 152 having high capability of inhibiting diffusion of impurities such as hydrogen, for example, silicon nitride ($SiN_x$: x is a given number greater than 0) is preferably used. In that case, the insulator 152 is an insulator containing at least nitrogen and silicon.

As the insulator 155 having high capability of capturing or fixing impurities such as hydrogen, an oxide having an amorphous structure is preferably used. For example, a metal oxide such as aluminum oxide ($AlO_x$: x is a given number greater than 0) or magnesium oxide ($MgO_y$: y is a given number greater than 0) is preferably used. In the case where aluminum oxide is used for the insulator 155, the insulator 155 is an insulator containing at least oxygen and aluminum. In such a metal oxide having an amorphous structure, an oxygen atom has a dangling bond and sometimes has a property of capturing or fixing hydrogen with the dangling bond. When such a metal oxide having an amorphous structure is used as a component of the capacitor 100 or provided around the capacitor 100, hydrogen included in the capacitor 100 or hydrogen existing around the capacitor 100 can be captured or fixed. It is particularly preferable to capture or fix hydrogen included in the insulator 130.

Note that an amorphous structure is preferable as the structure of the insulator 155, but it may include a crystal region partly. Alternatively, the insulator 155 may have a multilayer structure in which a layer with an amorphous structure and a layer including a crystal region are stacked. For example, the insulator 155 can have a stacked-layer structure where a layer with a crystal region, typically, a layer with a polycrystalline structure, is provided over a layer with an amorphous structure.

Furthermore, the insulator 105 is preferably formed using an insulator having high capability of inhibiting diffusion of impurities such as hydrogen, like the insulator 152. The insulator 155 and the insulator 105 are in contact with each other in a region not overlapping with the capacitor 100. That is, the conductor 110, the insulator 130, and the conductor 120 are surrounded by the insulator 105, the insulator 152, and the insulator 155. In other words, the capacitor 100 is sealed with the insulator 155, the insulator 152, and the insulator 105. In this structure, the insulator 155, the insulator 152, and the insulator 105 function as sealing films. Thus, diffusion of hydrogen from outside the insulator 152 and the insulator 105 into the capacitor 100 can be inhibited, and moreover, hydrogen on the inner side of the insulator 152 and the insulator 105 can be captured or fixed by the insulator 155, so that the hydrogen concentration of the insulator 130 of the capacitor 100 can be reduced. As a result, the ferroelectricity of the insulator 130 can be enhanced.

Note that the insulator 105 can be formed using any kind of insulating materials without being limited to the above, and for example, any of insulating material described later in a section <<Insulator>> in Embodiment 2 can be used.

As described above, the insulator 130 avoids including impurities such as hydrogen or makes the amount of included impurities such as hydrogen extremely small, whereby the crystallinity of the insulator 130 can be increased, resulting in a structure with high ferroelectricity.

For the conductor 110, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. As an alloy containing any of the above metal elements, a nitride of the alloy or an oxide of the alloy may be used. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Alternatively, a semiconductor having high electrical conductivity, typified by polycrystalline silicon containing an impurity element such as phosphorus, or a silicide such as nickel silicide may be used.

A stack of a plurality of conductive layers formed of the above materials may be used. For example, a stacked-layer structure combining a material containing the above metal element and a conductive material containing oxygen may be employed. Alternatively, a stacked-layer structure combining a material containing the above metal element and a conductive material containing nitrogen may be employed. Alternatively, a stacked-layer structure combining a material containing the above metal element, a conductive material containing oxygen, and a conductive material containing nitrogen may be employed.

In order to form the insulator 130 that includes layered crystals as described above, the top surface of the conductor 110 serving as the base of the insulator 130 preferably has favorable planarity. For example, the top surface roughness of the conductor 110 serving as the base, which is represented by arithmetic mean roughness (Ra) or root mean square roughness (RMS), is less than or equal to 2 nm, preferably less than or equal to 1 nm, further preferably less than or equal to 0.8 nm, still further preferably less than or equal to 0.5 nm, yet still further preferably less than or equal to 0.4 nm. Making the planarity of the top surface of the conductor 110 favorable as described above can improve the crystallinity of the insulator 130 and enhance the ferroelectricity of the insulator 130.

Furthermore, a layer increasing the crystallinity of the insulator 130 may be provided between the insulator 130 and the conductor 110 and/or between the insulator 130 and the conductor 120. In the case where the insulator 130 is formed using the above-described metal nitride, the layer increasing the crystallinity is preferably formed using a material that stabilizes a wurtzite type structure, for example. As the layer increasing the crystallinity, a layer containing at least one of elements contained in the insulator 130 is preferably used, for example. The composition of the layer increasing the crystallinity and the composition of the insulator 130 are preferably different from each other. In the case where the insulator 130 is formed using Al—Ga—Sc nitride, the layer increasing the crystallinity is preferably formed using, specifically, aluminum, gallium, scandium, or a metal nitride such as aluminum nitride, gallium nitride, or scandium nitride.

The composition of the layer increasing the crystallinity does not necessarily include an element contained in the insulator 130. Examples of the element applicable in this case include indium, silicon, yttrium, hafnium, and zirconium. With the layer increasing the crystallinity, the crystallinity of the insulator 130 can be increased and the ferroelectricity of the insulator 130 can be enhanced. Since the increase in the crystallinity of the insulator 130 is followed by the enhancement of the ferroelectricity of the insulator 130, the layer increasing the crystallinity can be also referred to as a layer increasing the remanent polarization of the insulator 130.

A conductive material that can be used for the conductor 110 can be used for the conductor 120.

In the case where the insulator 130 is formed using the above-described metal nitride, it is preferable that the conductor 110 or the conductor 120 contain nitrogen and it is further preferable that each of the conductor 110 and the conductor 120 contain nitrogen. It is particularly preferable that the conductor 110 and/or the conductor 120 be formed using tantalum nitride or titanium nitride. This structure inhibits formation of a different layer at the interface(s) between the insulator 130 and the conductor 110 and/or the conductor 120 and enables formation of the insulator 130 that includes the layered crystals as described above. Note that the different layer contains a compound containing a component of the insulator 130 and a component of the conductor 110 (the conductor 120).

In the case where the insulator 130 is formed using the above-described metal nitride, using tantalum nitride or titanium nitride for the conductor 110 can improve the crystallinity of the insulator 130 in some cases. Tantalum nitride and titanium nitride easily have a sodium chloride type structure. Furthermore, the atomic arrangement of the case where a sodium chloride type structure is seen from the [111] direction resembles the atomic arrangement of the case where a wurtzite type structure is seen from the [001] direction. That is, the lattice matching between the conductor 110 and the insulator 130 may be favorable depending on the compositions and the combination of elements. In view of this, the conductor 110 preferably contains a crystal having a sodium chloride type structure. In addition, the crystal preferably has (111) orientation with respect to a surface of the insulator 105. The conductor 110 containing the crystal can improve the crystallinity of the insulator 130 in some cases.

Note that the above crystal can be identified, for example, by observing regularity of metal ions with the use of a cross-sectional TEM. For example, the crystal can be identified with the use of an FFT pattern obtained when a cross-sectional TEM is subjected to fast Fourier transform (FFT). As another example, the crystal can be identified by a diffraction pattern observed by an electron diffraction method.

In the case where the conductor 110 has a stacked-layer structure that includes two or more layers, a layer that is in contact with the insulator 130 is preferably formed using tantalum nitride or titanium nitride. Such a structure inhibits formation of a different layer at the interface between the insulator 130 and the conductor 110 and enables formation of the insulator 130 that includes the layered crystals as described above. Note that a layer that is not in contact with the insulator 130 (e.g., a layer that is in contact with the insulator 105) can be formed using, for example, a conductive material containing tungsten, copper, or aluminum as a main component.

In the case where the conductor 120 has a stacked-layer structure that includes two or more layers, a layer that is in contact with the insulator 130 is preferably formed using tantalum nitride or titanium nitride. Such a structure can inhibit formation of a different layer at the interface between the insulator 130 and the conductor 120. Note that a layer that is not in contact with the insulator 130 (e.g., a layer that is in contact with the insulator 155) can be formed using, for example, a conductive material containing tungsten, copper, or aluminum as a main component.

The capacitor 100 illustrated in FIG. 1A has a structure where the side surfaces of the conductor 110, the insulator 130, and the conductor 120 are aligned with each other; however, the present invention is not limited thereto.

Figure 1B:
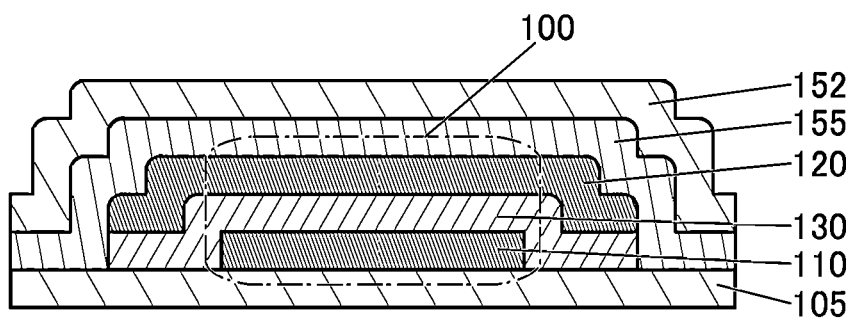

For example, as illustrated in FIG. 1B, a structure where the side surface of the conductor 110 is located inward from the side surfaces of the insulator 130 and the conductor 120 may be employed. The insulator 130 is formed to cover the top surface and the side surface of the conductor 110, and a region of the insulator 130 not overlapping with the conductor 110 is in contact with the insulator 105. In this case, the periphery of the conductor 110 is located inward from the peripheries of the insulator 130 and the conductor 120, seen in the top view. In such a structure, the conductor 110 and the conductor 120 can be sufficiently apart from each other with the insulator 130.

Figure 1C:
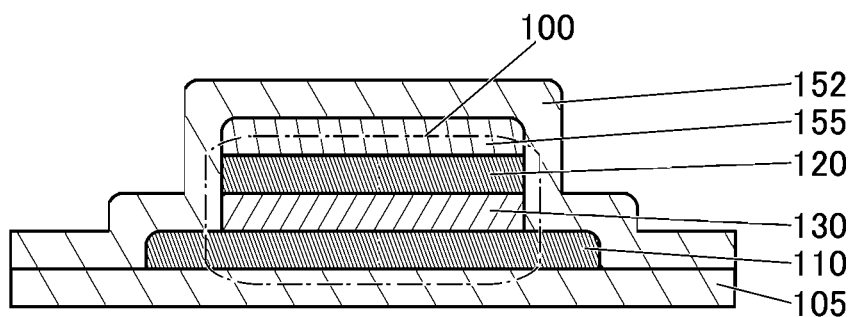

For example, as illustrated in FIG. 1C, a structure where the side surfaces of the insulator 130 and the conductor 120 are located inward from the side surface of the conductor 110 may be employed. In that case, the peripheries of the insulator 130 and the conductor 120 are located inward from the periphery of the conductor 110, seen in the top view.

In the structure described above, the insulator 130 is not formed in the vicinity of a step of the formation surface formed by the conductor 110; accordingly, a region with low crystallinity, which has been formed in the vicinity of the step at the time of depositing the insulator 130, can be eliminated in the formed capacitor 100. Thus, the whole of the insulator 130 illustrated in FIG. 1C is in contact with the top surface of the conductor 110 with high planarity and can include many regions with high crystallinity.

Furthermore, as illustrated in FIG. 1C, the insulator 155 may be formed to have a side surface located inward from the side surface of the conductor 110. In that case, it is preferable that the side surfaces of the insulator 130, the conductor 120, and the insulator 155 be substantially aligned with each other. The insulator 152 is provided to cover the conductor 110, the insulator 130, the conductor 120, and the insulator 155. In this structure, the insulator 155 can capture or fix an impurity such as hydrogen contained in the insulator 130 via the conductor 120. The insulator 130 and the insulator 155 are not in contact with each other; thus, formation of a mixed layer at the interface between the insulator 130 and the insulator 155 can be inhibited even when an oxide is used for the insulator 155. It is also possible to inhibit entry of oxygen into the insulator 130.

Note that the insulator 155 is not necessarily provided in the case where the impurity concentration of the insulator 130 can be reduced by optimization of a deposition method of the insulator 130 or the like. In the case where the insulator 155 is not provided, the insulator 152 has a region that is in contact with the top surface of the insulator 105, a region that is in contact with the side surface of the insulator 130, a region that is in contact with the side surface of the conductor 120, and a region that is in contact with the top surface of the conductor 120. The capacitor 100 is sealed with the insulator 152 and the insulator 105. It is thus possible to inhibit diffusion of hydrogen from outside the insulator 152 and the insulator 105 into the capacitor 100. Therefore, the ferroelectricity of the insulator 130 can be enhanced.

The material that can have ferroelectricity and can be used for the insulator 130 is not limited to the above-described metal nitride. As the material that can have ferroelectricity, a metal oxide such as hafnium oxide, zirconium oxide, or $HfZrO_X$ (X is a real number greater than 0) may be used. As the material that can have ferroelectricity, a material obtained by adding an element J1 (the element J1 here is one or more selected from zirconium (Zr), silicon (Si), aluminum (Al), gadolinium (Gd), yttrium (Y), lanthanum (La), strontium (Sr), and the like) to hafnium oxide may be used. The ratio of the number of hafnium atoms to the number of atoms of the element J1 can be appropriately set here; for example, the ratio of the number of hafnium atoms to the number of atoms of the element J1 is 1:1 or in the neighborhood thereof. As the material that can have ferroelectricity, a material obtained by adding an element J2 (the element J2 here is one or more selected from hafnium (Hf), silicon (Si), aluminum (Al), gadolinium (Gd), yttrium (Y), lanthanum (La), strontium (Sr), and the like) to zirconium oxide may be used. The ratio of the number of zirconium atoms to the number of atoms of the element J2 can be appropriately set; for example, the ratio of the number of zirconium atoms to the number of atoms of the element J2 is 1:1 or in the neighborhood thereof. The crystal structure of the material containing hafnium oxide or hafnium oxide and zirconium oxide is any one or more selected from a cubic crystal structure, a tetragonal crystal structure, an orthorhombic crystal structure, and a monoclinic crystal structure.

As the material that can have ferroelectricity, a piezoelectric ceramic having a perovskite structure such as lead titanate ($PbTiO_X$), barium strontium titanate (BST), strontium titanate, lead zirconate titanate (PZT), strontium bismuth tantalate (SBT), bismuth ferrite (BFO), or barium titanate may be used. Alternatively, a perovskite-type oxynitride such as $SrTaO_2N$ or $BaTaO_2N$, $GaFeO_3$ with a κ-alumina-type structure, or the like may be used as the material that can have ferroelectricity.

Although metal oxides and metal nitrides are given as examples in the above description, the material that can have ferroelectricity is not limited thereto. For example, a metal oxynitride obtained by adding nitrogen to any of the above metal oxides, a metal nitride oxide obtained by adding oxygen to any of the above metal nitrides, or the like may be used.

<Fabrication Method of Capacitor>

In this section, a method for fabricating a capacitor of one embodiment of the present invention is described with reference to FIG. 5A to FIG. 5C.

Figure 5A:
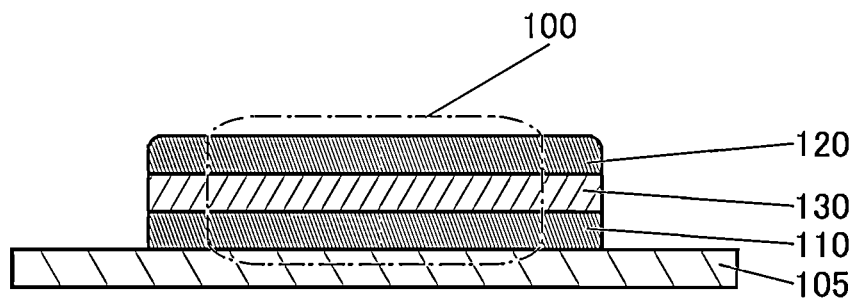
FIG. 5A to FIG. 5C are cross-sectional views showing a method for fabricating a capacitor of one embodiment of the present invention.

As illustrated in FIG. 5A, the insulator 105 is formed over a substrate (not shown). In the case where an insulator similar to the insulator 152 is used as the insulator 105, later description relating to the insulator 152 can be referred to.

Next, as illustrated in FIG. 5A, the conductor 110 is deposited over the insulator 105. The conductor 110 can be deposited by a sputtering method, a chemical vapor deposition (CVD) method, a molecular beam epitaxy (MBE) method, a pulsed laser deposition (PLD) method, an atomic layer deposition (ALD) method, or the like. Examples of an ALD method include a thermal ALD method, in which a precursor and a reactant react with each other only by a thermal energy, and a PEALD (Plasma Enhanced ALD) method, in which a reactant excited by plasma is used. By using the ALD method, a conductive film with high planarity can be deposited relatively easily as the conductor 110, in some cases. For example, titanium nitride may be deposited by a thermal ALD method.

The conductor 110 may be patterned by a lithography method or the like as appropriate. When the conductor 110 is patterned before the insulator 130 is deposited, the capacitor 100 with the structure illustrated in FIG. 1B or FIG. 1C can be formed.

The surface over which the conductor 110 is formed (also referred to as a formation surface) or the top surface of the conductor 110 preferably has high planarity. For example, the surface over which the conductor 110 is formed or the top surface of the conductor 110 may be planarized by planarization treatment using a chemical mechanical polishing (CMP) method or the like to have improved planarity. In the case where the planarity of the surface over which the conductor 110 is formed or the top surface of the conductor 110 is improved, the crystallinity of the component above the surface, specifically the crystallinity of the insulator 130, can be improved.

Next, as illustrated in FIG. 5A, the insulator 130 is deposited over the conductor 110. The insulator 130 can be deposited by a sputtering method, a CVD method, an ALD method, or the like. For example, the insulator 130 can be deposited over the conductor 110 with good coverage by using an ALD method. This can inhibit the occurrence of a leakage current between the upper electrode and the lower electrode of the capacitor 100.

The insulator 130 is preferably formed using a material that can have ferroelectricity. As the material that can have ferroelectricity, any of the above materials can be used. Here, the thickness of the insulator 130 can be less than or equal to 100 nm, preferably less than or equal to 50 nm, further preferably less than or equal to 20 nm, still further preferably less than or equal to nm (typically greater than or equal to 2 nm and less than or equal to 9 nm).

When formed using any of the above-described metal nitrides, the insulator 130 is preferably deposited by a thermal ALD method or a PEALD method. Details about a method for depositing the insulator 130 by an ALD method will be described later.

Furthermore, in the case where the insulator 130 is deposited by a thermal ALD method, a material that does not contain a hydrocarbon (also referred to as Hydro Carbon or HC) may be used as a precursor. In the case where one or both of hydrogen and carbon are contained in the insulator 130, crystallization of the insulator 130 might be inhibited. Thus, using a precursor that does not contain a hydrocarbon in the above-described manner is preferable in order to reduce the concentration of one or both of hydrogen and carbon in the insulator 130. For example, as the precursor that does not contain a hydrocarbon, a chlorine-based material can be given.

Note that the insulator 130 can also be deposited using a precursor containing a hydrocarbon without being limited to the above. In this case, it is preferable that the insulator 155 sufficiently capture or fix impurities such as hydrogen included in the insulator 130 so as to reduce the concentration of impurities such as hydrogen in the insulator.

A sputtering method is preferably employed for deposition of the insulator 130 that includes any of the above-described metal nitrides. Employing a sputtering method makes it possible to reduce the impurity concentration of a film or to form a dense film; thus, a sputtering method is suitable for deposition of the insulator 130. Deposition of the insulator 130 by a sputtering method is preferably performed in, for example, an atmosphere containing nitrogen. Specifically, a nitrogen gas or a mixed gas of nitrogen and a noble gas is preferably used as the sputtering gas. In the case where the insulator 130 is deposited by a sputtering method, a target including an element contained in the insulator 130 is preferably used.

Note that the insulator 130 may be deposited by sputtering of one target. For example, when the insulator 130 is formed using two or more kinds of elements and nitrogen, a target containing the two or more kinds of elements may be used, or a target containing the two or more kinds of elements and nitrogen may be used.

The insulator 130 can also be deposited by sputtering of a plurality of targets at the same time. Note that a method in which a plurality of targets are sputtered at the same time is sometimes called a co-sputtering method. For example, when the insulator 130 is formed using two or more kinds of elements and nitrogen, a first target containing part of the two or more kinds of elements and a second target containing the rest of the two or more kinds of elements may be used. Note that nitrogen may be contained in one or both of the first target and the second target. Alternatively, a first target containing part of the two or more kinds of elements, a second target containing another part of the two or more kinds of elements, and a third target containing the rest of the two or more kinds of elements may be used. Nitrogen may be contained in any one or some of the first to third targets.

Specifically, in the case where the insulator 130 is Al—Ga—Sc nitride, an Al—Ga—Sc alloy target or an Al—Ga—Sc nitride target can be used for deposition of the insulator 130 by a sputtering method. Alternatively, either a metal aluminum target or an aluminum nitride target and a Ga—Sc nitride target may be used. Further alternatively, a gallium nitride target and an Al—Sc alloy target may be used. Still further alternatively, a gallium nitride target, either a metal aluminum target or an aluminum nitride target, and a metal scandium target may be used. In the case where two or more targets are used, the insulator 130 is deposited by a cosputtering method.

In the case where the insulator 130 is deposited by a cosputtering method using at least an aluminum nitride target, an RF sputtering method is used for the aluminum nitride target, which has an insulating property. In the case where the insulator 130 contains gallium, a target of a gallium-containing nitride or a target of a gallium-containing alloy is used since metallic gallium has a low melting point.

Next, as illustrated in FIG. 5A, the conductor 120 is deposited over the insulator 130. Here, the conductor 120 is placed so as to be separated from the conductor 110 with the insulator 130 positioned therebetween. The conductor 120 may be deposited by a sputtering method, an ALD method, a CVD method, or the like. For example, titanium nitride may be deposited by a thermal ALD method. Here, the conductor 120 is preferably deposited by a method in which deposition is performed while the substrate is heated, such as a thermal ALD method. For example, the substrate temperature during the deposition is higher than or equal to room temperature, preferably higher than or equal to 300° C., further preferably higher than or equal to 325° C., still further preferably higher than or equal to 350° C. Furthermore, for example, the substrate temperature during the deposition is lower than or equal to 500° C., preferably lower than or equal to 450° C. For example, the substrate temperature is set to approximately 400° C.

The deposition of the conductor 120 within the above-described temperature range enables the insulator 130 to have ferroelectricity even without high-temperature baking treatment (e.g., baking treatment at a heat treatment temperature of 400° C. or higher or 500° C. or higher) after the formation of the conductor 120. When the conductor 120 is deposited by an ALD method, which causes relatively little damage to a base, as described above, the crystal structure of the insulator 130 can be inhibited from being broken excessively, which enhances the ferroelectricity of the insulator 130. Note that improving the crystallinity or ferroelectricity of the insulator 130 by utilizing the temperature during the deposition of the conductor 120 without performing baking treatment after the deposition of the conductor 120 is referred to as self-annealing, in some cases.

In the case where the conductor 110, the insulator 130, and the conductor 120 are deposited by a sputtering method, the conductor 110, the insulator 130, and the conductor 120 are preferably deposited successively without exposure to the air. For example, a multi-chamber deposition apparatus is used. The deposition without exposure to the air makes it possible that an impurity or moisture from the air environment is prevented from attaching onto the conductor 110 and the insulator 130 and the vicinity of the interface between the conductor 110 and the insulator 130 and the vicinity of the interface between the insulator 130 and the conductor 120 are kept clean.

The conductor 120 and the insulator 130 may be patterned by a lithography method or the like as appropriate. When the conductor 120 and the insulator 130 are patterned before the insulator 155 is deposited, the capacitor 100 with the structure illustrated in FIG. 1B can be formed. Alternatively, when the conductor 120, the insulator 130, and the conductor 110 are patterned before the insulator 155 is deposited, the capacitor 100 with the structure illustrated in FIG. 1A can be formed.

Figure 5B:
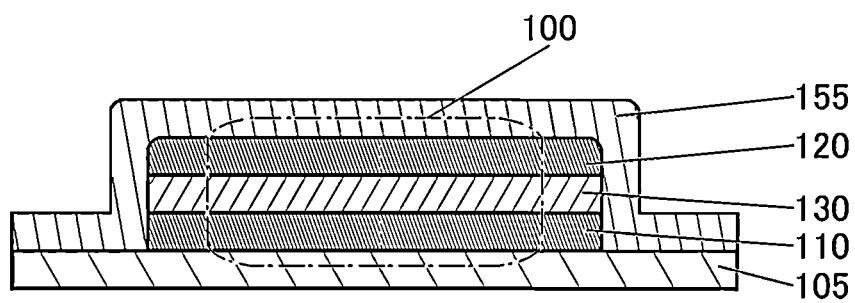

Next, as illustrated in FIG. 5B, the insulator 155 is deposited so as to surround the conductor 110, the insulator 130, and the conductor 120. The insulator 155 can be deposited by a sputtering method, a CVD method, an MBE method, a PLD method, an ALD method, or the like. In this embodiment, for the insulator 155, aluminum oxide is deposited by a pulsed DC sputtering method using an aluminum target in an atmosphere containing an oxygen gas.

A metal oxide having an amorphous structure and high capability of capturing or fixing hydrogen, such as aluminum oxide, is preferably used for the insulator 155. In that case, impurities such as hydrogen included in the insulator 130 can be captured or fixed. Aluminum oxide having an amorphous structure or amorphous aluminum oxide is particularly preferably used for the insulator 155, in which case hydrogen can sometimes be captured or fixed more effectively.

When the insulator 155 is deposited by a sputtering method, which does not use a gas containing hydrogen molecules as a deposition gas, as described above, the hydrogen concentrations in the insulator 155 and the conductor 120 serving as a base can be reduced. As a result, more impurities such as hydrogen included in the insulator 130 can be captured or fixed.

Furthermore, the insulator 155 may have a stacked-layer structure of two or more layers. For example, the insulator 155 may be formed using a stacked-layer film of aluminum oxide deposited by an ALD method and aluminum oxide deposited thereover by a sputtering method. With such a structure, even when a pinhole, disconnection, or the like is generated in the aluminum oxide film deposited by a sputtering method, a portion overlapping with such a defect can be filled with an ALD-deposited aluminum oxide film with excellent coverage.

The insulator 155 may be patterned by a lithography method or the like. When the insulator 155, the conductor 120, and the insulator 130 are patterned after the insulator 155 is deposited, the capacitor 100 with the structure illustrated in FIG. 1C can be formed.

Figure 5C:
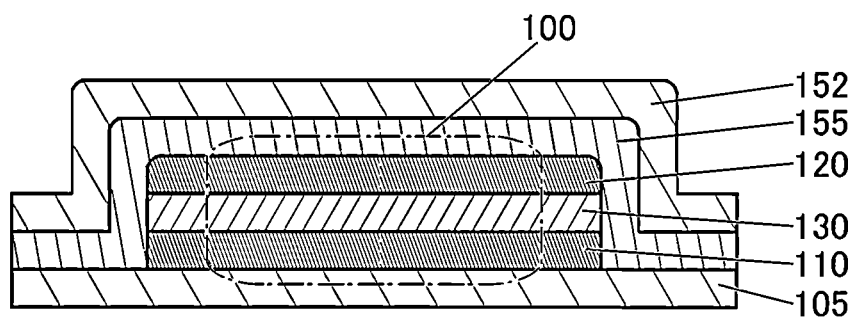

Next, as illustrated in FIG. 5C, the insulator 152 is deposited so as to surround the conductor 110, the insulator 130, the conductor 120, and the insulator 155. The insulator 152 can be deposited by a sputtering method, a CVD method, an MBE method, a PLD method, an ALD method, or the like. As the insulator 152, silicon nitride having high capability of inhibiting diffusion of hydrogen is preferably used. In this embodiment, for the insulator 152, silicon nitride is deposited by a pulsed DC sputtering method in an atmosphere containing a nitrogen gas.

Since the sputtering method does not need to use a molecule containing hydrogen in a deposition gas, the deposition of the insulator 152 by a sputtering method enables the hydrogen concentrations in the insulator 152 and the insulator 155 serving as a base in the deposition to be reduced.

The insulator 152 may have a stacked-layer structure of two or more layers. For example, the insulator 152 may be formed using a stacked-layer film of silicon nitride deposited by a sputtering method and silicon nitride deposited thereover by a PEALD method. With such a structure, even when a pinhole, disconnection, or the like is generated in the silicon nitride film deposited by a sputtering method, a portion overlapping with such a defect can be covered with an ALD-deposited silicon nitride film with excellent coverage.

Heat treatment is preferably performed after the deposition of the insulator 152. The heat treatment is performed with the substrate temperature set to higher than or equal to 300° C., preferably higher than or equal to 325° C., still further preferably higher than or equal to 350° C., for example. The heat treatment is performed with the substrate temperature set to lower than or equal to 600° C., preferably lower than or equal to 500° C., further preferably lower than or equal to 450° C. For example, the substrate temperature is set to approximately 400° C. The heat treatment time is approximately longer than or equal to one hour and shorter than or equal to 10 hours, for example. The heat treatment can be performed in an atmosphere containing an oxygen gas, a nitrogen gas, or an inert gas.

With such heat treatment, hydrogen included in the insulator 130 and a substance bonded with hydrogen are released and diffused from the insulator 130 to the insulator 155. At this time, the hydrogen and the substance bonded with hydrogen diffuse through the conductor 120 up to the insulator 155 in some cases. In the above manner, hydrogen diffusing in the insulator 155 is captured or fixed by the insulator 155, whereby the concentration of hydrogen included in the insulator 130 can be reduced. Furthermore, at this time, the insulator 155 and the capacitor 100 are surrounded by the insulator 152; thus, diffusion of hydrogen from outside the insulator 152 can be inhibited. Hence, the ferroelectricity of the insulator 130 can be enhanced.

In the above-described manner, the capacitor 100 illustrated in FIG. 5C, which includes the insulator 130 between the conductor 110 and the conductor 120 and is surrounded by the insulator 155 and the insulator 152, can be fabricated.

<Deposition by ALD Method>

A method for depositing the insulator 130 by an ALD method and a deposition apparatus used for the deposition are described below with reference to FIG. 6A and FIG. 6B.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition.

In an ALD method, a first source gas (also referred to as a precursor) and a second source gas (also referred to as a nitriding agent), both of which are for reaction, are alternately introduced into a chamber and repetitive introduction of these source gases forms a film. At the time of introduction of the precursor or the nitriding agent, $N_2$, Ar, or the like may be introduced into a reaction chamber as a carrier purge gas, together with the precursor or the nitriding agent. By using the carrier purge gas, the precursor or the nitriding agent can be inhibited from being adsorbed onto the insides of a pipe and a valve and can be introduced into the reaction chamber (also referred to as a carrier gas). Furthermore, the precursor or the nitriding agent remaining in the reaction chamber can be exhausted quickly (also referred to as a purge gas). Because of the two functions of introduction (carrier) and exhaustion (purge), the $N_2$, Ar, or the like introduced into the reaction chamber together with the precursor or the nitriding agent is sometimes referred to as a carrier purge gas. The use of the carrier purge gas improves the uniformity of a film to be formed and is thus preferable.

Figure 6A:
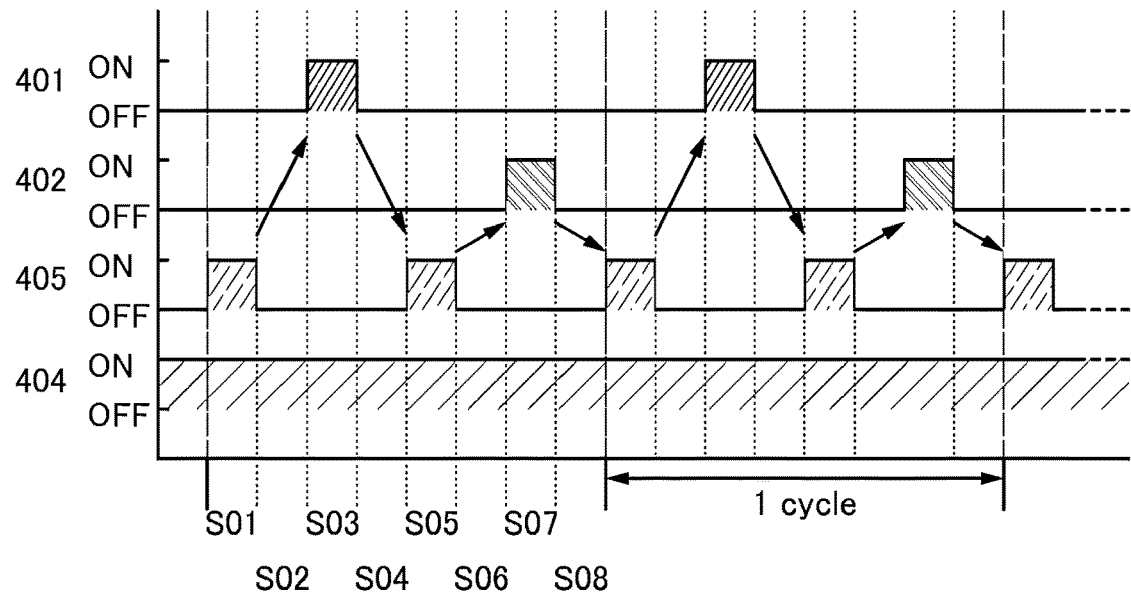
FIG. 6A is a diagram showing a deposition sequence of a metal nitride film of one embodiment of the present invention.

FIG. 6A shows a deposition sequence of a film of the material that can have ferroelectricity (hereinafter referred to as a ferroelectric layer) by an ALD method. An example of depositing a ferroelectric layer containing aluminum nitride and scandium nitride as the insulator 130 is described below.

A precursor containing aluminum (Al) can be used as a precursor 401. A precursor containing scandium (Sc) can be used as a precursor 402. Note that a precursor formed using an inorganic material (referred to as an inorganic precursor in some cases) or a precursor formed using an organic material (referred to as an organic precursor in some cases) may be used as each of the precursor 401 and the precursor 402. As the precursor containing aluminum, trim ethyl aluminum, tri ethyl aluminum, triisobutylaluminum, dim ethyl aluminum hydride, tris(dimethylamino)aluminum, tris(diethylamino)aluminum, aluminum trichloride, or the like can be used.

Note that the precursor 401 and the precursor 402 are formed by gasifying a liquid source material or a solid source material by heating. Impurities are preferably reduced in the precursor 401 and the precursor 402. Examples of the impurities include Ba, Co, Cu, Fe, Li, Mn, Na, and Ni.

As a nitriding agent 405, ammonia ($NH_3$) can be used. Furthermore, as a carrier purge gas 404, any one or more selected from $N_2$, He, Ar, Kr, and Xe can be used. In this section, $N_2$ is used as the carrier purge gas 404.

First, the carrier purge gas 404 is introduced into a reaction chamber (ON). Then, the nitriding agent 405 is introduced into the reaction chamber (Step S01). Next, the introduction of the nitriding agent 405 is stopped (OFF) and the nitriding agent 405 remaining in the reaction chamber is purged, so that only the carrier purge gas 404 is left (Step S02). Next, the precursor 401 is introduced into the reaction chamber, and the pressure in the reaction chamber is kept constant (Step S03). In this way, the precursor 401 is adsorbed onto the formation surface. Next, the introduction of the precursor 401 is stopped and the precursor 401 remaining in the reaction chamber is purged, so that only the carrier purge gas 404 is left (Step S04). Subsequently, the nitriding agent 405 is introduced into the reaction chamber (Step S05). The introduction of the nitriding agent 405 causes nitriding of the precursor 401 to form aluminum nitride. Next, the introduction of the nitriding agent 405 is stopped and the nitriding agent 405 remaining in the reaction chamber is purged, so that only the carrier purge gas 404 is left (Step S06).

Next, the precursor 402 is introduced into the reaction chamber, and the pressure in the reaction chamber is kept constant (Step S07). In this way, the precursor 402 is adsorbed onto a nitrogen layer of the above aluminum nitride. Next, the introduction of the precursor 402 is stopped and the precursor 402 remaining in the reaction chamber is purged, so that only the carrier purge gas 404 is left (Step S08). Next, the process returns to Step S01, and the nitriding agent 405 is introduced into the reaction chamber. The introduction of the nitriding agent 405 causes nitriding of the precursor 402 to form scandium nitride on the aluminum nitride.

Step S01 to Step S08 described above are defined as one cycle, and the cycle is repeated until a desired thickness is reached. Note that Step S01 to Step S08 are each performed within a temperature range of 250° C. to 450° C., preferably a temperature range of 350° C. to 400° C.

In the case where the above ferroelectric layer is deposited by a PEALD method, it is preferable that any one or more selected from nitrogen ($N_2$), ammonia ($NH_3$), and a mixed gas of nitrogen ($N_2$) and hydrogen ($H_2$) be excited by plasma and introduced into the reaction chamber as the nitriding agent 405. As the mixed gas, for example, a mixed gas of 95 vol % nitrogen ($N_2$) and 5 vol % hydrogen ($H_2$) can be used. The ferroelectric layer can be formed by performing deposition while plasma-excited nitrogen and/or ammonia are/is introduced.

In the case where a PEALD method is used to deposit the above ferroelectric layer, the nitriding agent 405 may serve as the carrier purge gas 404. For example, in the case where nitrogen ($N_2$) is used as the carrier purge gas 404, a plasma generation apparatus is turned on in the steps of introducing the nitriding agent 405 (Step S01 and Step S05) to excite nitrogen with plasma, so that nitrogen plasma can serve as the nitriding agent 405.

A film with a certain composition can be deposited by control of the amounts of the source gases to be introduced and the number of times the source gases are introduced (also referred to as the number of pulses).

By the deposition by an ALD method in the above-described manner, a layered crystal structure can be formed. Furthermore, by the deposition using the precursors with reduced impurities in the above-described manner, hindrance to the formation of the layered crystal structure due to impurity entry during the deposition can be inhibited. Thus, when the insulator 130 has a layered crystal structure with high crystallinity, the insulator 130 can have high ferroelectricity.

Note that the insulator 130 does not necessarily exhibit ferroelectricity right after being deposited. As described above, the insulator 130 exhibits ferroelectricity not right after being deposited but after the conductor 120 is formed over the insulator 130, in some cases.

Next, deposition of Al—Ga—Sc nitride will be described as an example. Since a method for depositing a ferroelectric layer containing aluminum nitride and scandium nitride has been already described, differences will be mainly described, and the above description can be referred to for common portions.

In deposition of Al—Ga—Sc nitride, a gallium (Ga)-containing precursor is used in addition to the precursor 401 and the precursor 402 described above. As the gallium-containing precursor, an inorganic precursor or an organic precursor may be used. As the gallium-containing organic precursor, trimethylgallium, triethylgallium, tris(dimethylamide)gallium, gallium(III) acetylacetonate, tris(2,2,6,6-tetramethyl-3,5-heptanedionato)gallium, dimethylchlorogallium, diethylchlorogallium, dimethyl gallium isopropoxide, or the like can be used. As the gallium-containing inorganic precursor, for example, a halogen-based gallium compound such as gallium trichloride, gallium tribromide, or gallium triiodide can be used.

After Step S07 is performed, the nitriding agent 405 is introduced into the reaction chamber. The introduction of the nitriding agent 405 causes nitriding of the precursor 402 to form scandium nitride. Next, the introduction of the nitriding agent 405 is stopped and the nitriding agent 405 remaining in the reaction chamber is purged, so that only the carrier purge gas 404 is left. Then, the gallium-containing precursor is introduced into the reaction chamber, and the pressure in the reaction chamber is kept constant. In this way, the gallium-containing precursor is adsorbed onto a nitrogen layer of the above scandium nitride. Next, the introduction of the gallium-containing precursor is stopped and the gallium-containing precursor remaining in the reaction chamber is purged, so that only the carrier purge gas 404 is left. Next, the process returns to Step SOL and the nitriding agent 405 is introduced into the reaction chamber. The introduction of the nitriding agent 405 causes nitriding of the gallium-containing precursor to form gallium nitride on the scandium nitride.

Step SOL which is described above, through the step of purging the gallium-containing precursor remaining in the reaction chamber are defined as one cycle, and the cycle is repetitively performed until a desired thickness is reached. In the above manner, Al—Ga—Sc nitride can be deposited.

Note that the order of introduction of the precursor 401, the precursor 402, and the gallium-containing precursor into the reaction chamber is not limited to the above-described order. For example, the precursor 402 may be introduced in Step S03 and the precursor 401 may be introduced in Step S07. A film with a certain composition can be deposited by control of the amounts of the source gases to be introduced and the number of times the source gases are introduced (also referred to as the number of pulses).

Next, an example of depositing a ferroelectric layer containing hafnium oxide and zirconium oxide as the insulator 130 is described. Since a method for depositing a ferroelectric layer by an ALD method has been already described, differences will be mainly described, and the above description can be referred to for common portions.

As the precursor 401, a precursor that contains hafnium and any one or more selected from chlorine, fluorine, bromine, iodine, and hydrogen can be used. Furthermore, as the precursor 402, a precursor that contains zirconium and any one or more selected from chlorine, fluorine, bromine, iodine, and hydrogen can be used. Here, $HfCl_4$ is used as the precursor 401 containing hafnium, and $ZrCl_4$ is used as the precursor 402 containing zirconium.

The precursor 401 is formed of a solid source material of $HfCl_4$, and the precursor 402 is formed of a solid source material of $ZrCl_4$. Impurities are preferably reduced in the solid source materials. Examples of the impurities include Ba, Cd, Co, Cr, Cu, Fe, Ga, Li, Mg, Mn, Na, Ni, Sr, V, and Zn. In the solid source material of $HfCl_4$ and the solid source material of $ZrCl_4$, the above-described impurities preferably exist at less than 1000 wppb. Here, wppb is a unit representing the concentration of an impurity converted into weight in parts per billion.

An oxidizing gas is used instead of the nitriding agent 405. As the oxidizing gas, any one or more selected from $O_2$, $O_3$, $N_2O$, $NO_2$, $H_2O$, and $H_2O_2$ can be used. In this section, a gas containing $H_2O$ is used as the oxidizing gas.

Next, a manufacturing apparatus used for the above-described deposition by an ALD method is described with reference to FIG. 6B. FIG. 6B is a schematic view of a manufacturing apparatus 900 used for deposition by the ALD method.

Figure 6B:
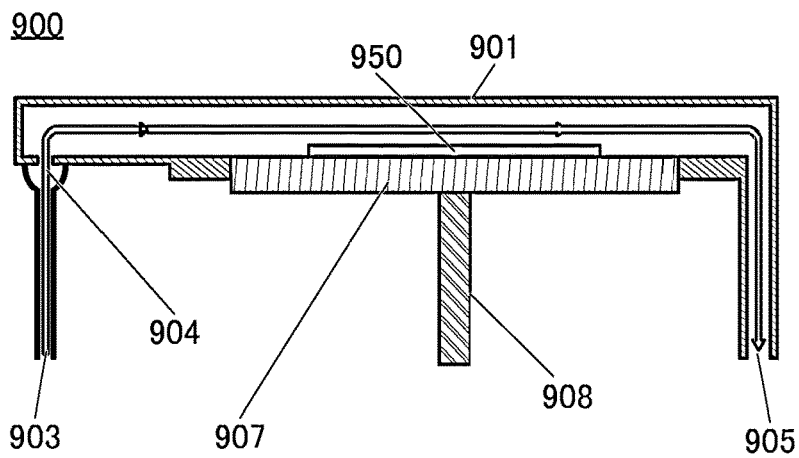
FIG. 6B is a cross-sectional view of a manufacturing apparatus for the metal nitride film of one embodiment of the present invention.

As illustrated in FIG. 6B, the manufacturing apparatus 900 includes a reaction chamber 901, a gas inlet 903, a reaction chamber entrance 904, an exhaust port 905, a wafer stage 907, and a shaft 908. In FIG. 6B, a wafer 950 is placed over the wafer stage 907.

A heater system for heating the inside of the reaction chamber 901, the precursor 401, the precursor 402, the nitriding agent 405, and the carrier purge gas 404 may be placed in the reaction chamber 901. Furthermore, the wafer stage 907 may be provided with a heater system for heating the wafer 950. Moreover, the wafer stage 907 may be provided with a rotation mechanism which rotates horizontally with the shaft 908 as a rotation axis. Although not illustrated, a gas supply system for introducing each of the precursor 401, the precursor 402, the nitriding agent 405, and the carrier purge gas 404 into the gas inlet 903 with an appropriate timing for an appropriate time at an appropriate flow rate is placed upstream from the gas inlet 903. Furthermore, although not illustrated, an exhaust system that includes a vacuum pump is placed downstream from the exhaust port 905.

The manufacturing apparatus 900 illustrated in FIG. 6B is what is called a crossflow ALD apparatus. The flow of the precursor 401, the precursor 402, the nitriding agent 405, and the carrier purge gas 404 in the crossflow type is described below. The precursor 401, the precursor 402, the nitriding agent 405, and the carrier purge gas 404 flow from the gas inlet 903 to the reaction chamber 901 through the reaction chamber entrance 904, reach the wafer 950, and are exhausted through the exhaust port 905. Arrows shown in FIG. 6B schematically indicate the directions of gas flow.

As described above, in Step S05 of introducing the nitriding agent 405 into the reaction chamber 901, which is shown in FIG. 6A, the precursor 401 adsorbed on the wafer 950 is nitrided by the nitriding agent 405 to form aluminum nitride. Owing to the structure of the crossflow manufacturing apparatus 900, the nitriding agent 405 reaches the wafer 950 after being exposed to a heated component in the reaction chamber for a long time. In the case where the wafer stage 907 is rotated horizontally with the shaft 908 as a center, the periphery of the wafer 950 first reaches the nitriding agent 405; therefore, the thickness of aluminum nitride becomes larger toward the periphery of the wafer 950 and smaller in the center portion than in the periphery.

Thus, to inhibit the nitriding agent 405 from being decomposed and having reduced nitriding power, the heating temperature of the reaction chamber needs to be set to an appropriate temperature. Note that although the description has been made by giving nitriding of the precursor 401 as an example, the same applies to nitriding of the precursor 402.

In the above-described manner, a ferroelectric layer with excellent thickness uniformity over the substrate plane can be formed. The thickness uniformity over the substrate plane is preferably less than or equal to ±1.5%, further preferably less than or equal to ±1.0%. Furthermore, when (the maximum thickness over the substrate plane)–(the minimum thickness over the substrate plane) is defined as RANGE and the thickness uniformity over the substrate plane is defined as ±PNU (Percent Non Uniformity) (%), ±PNU (%) can be calculated as (RANGE×100)/(2×the average value of the thickness over the substrate plane).

By using the above-described method, the insulator 130 formed of the material that can have ferroelectricity can be formed. By forming the capacitor 100 using such an insulator 130, the capacitor 100 can be a ferroelectric capacitor.

According to one embodiment of the present invention, a capacitor containing a material that can have ferroelectricity can be provided. According to another embodiment of the present invention, the above capacitor can be provided with favorable productivity. According to another embodiment of the present invention, a capacitor that can be miniaturized or highly integrated can be provided.

Variation Example of Ferroelectric Device

In this embodiment, a ferroelectric device of one embodiment of the present invention is described with reference to FIG. 7A1, FIG. 7A2, FIG. 7B1, FIG. 7B2, FIG. 7C1, FIG. 7C2, FIG. 7C3, and FIG. 7C4. The ferroelectric device described in this section is a variation example of the above ferroelectric device including the conductor 110, the insulator 130, and the conductor 120; accordingly, for the conductor 110, the insulator 130, and the conductor 120, the above description can be referred to.

FIG. 7A1, FIG. 7B1, and FIG. 7C1 are circuit diagrams of ferroelectric devices of embodiments of the present invention. The circuit diagram in FIG. 7A1 includes one transistor (a field-effect transistor, also referred to as FET) and one capacitor, and the capacitor contains a material that can have ferroelectricity. The circuit diagram in FIG. 7B1 includes one transistor, and a gate insulating film of the transistor contains a material that can have ferroelectricity. The circuit diagram in FIG. 7C1 includes one capacitor and one diode, and the capacitor contains a material that can have ferroelectricity. Although the one capacitor and the one diode are separately illustrated in the circuit diagram in FIG. 7C1, the present invention is not limited thereto. For example, in the case where one element has functions of both the one capacitor and the one diode, there is no need to separate the functions. As a structure corresponding to the circuit diagram in FIG. 7C1, for example, it is possible to employ an element structure where an insulator is included between a pair of electrodes and a tunnel junction between the insulator and the electrodes is utilized.

Note that the circuit diagram in FIG. 7A1 can be regarded as a 1Tr1C (one transistor and one capacitor) element structure, and may be referred to as an FeRAM (Ferroelectric Random Access Memory) or a Type 1 structure. The circuit diagram in FIG. 7B1 can be regarded as a 1Tr (one transistor) element structure, and may be referred to as an FeFET (Ferroelectric Field Effect Transistor) or a Type 2 structure. The circuit diagram in FIG. 7C1 can be regarded as one capacitor element structure utilizing a tunnel junction, and may be referred to as an FTJ (Ferroelectric Tunnel Junction) element or a Type 3 structure.

Next, examples of a ferroelectric device of one embodiment of the present invention applicable to the structures illustrated in the circuit diagrams in FIG. 7A1, FIG. 7B1, and FIG. 7C1 are described with reference to FIG. 7A2, FIG. 7B2, FIG. 7C2, FIG. 7C3, and FIG. 7C4. FIG. 7A2, FIG. 7B2, FIG. 7C2, FIG. 7C3, and FIG. 7C4 are cross-sectional views illustrating examples of the ferroelectric device of one embodiment of the present invention. Note that white circles in the circuit diagrams in FIG. 7A1, FIG. 7B1, and FIG. 7C1 represent terminals.

FIG. 7A2 is a cross-sectional view corresponding to the capacitor illustrated in FIG. 7A1, FIG. 7B2 is a cross-sectional view corresponding to the transistor containing a material that can have ferroelectricity in FIG. 7B1, and FIG. 7C2, FIG. 7C3, and FIG. 7C4 are each a cross-sectional view corresponding to the capacitor and the diode illustrated in FIG. 7C1.

FIG. 7A2 includes the conductor 110, the insulator 130 over the conductor 110, and the conductor 120 over the insulator 130. Note that the insulator 130 is preferably formed using a material that can have ferroelectricity. The insulator 130 may be rephrased as a dielectric or a ferroelectric. Although not illustrated in FIG. 7A2, a structure where the conductor 120 is connected to a source or a drain of the transistor as illustrated in FIG. 7A1 is employed.

FIG. 7B2 includes an oxide 230, the insulator 130 over the oxide 230, and the conductor 120 over the insulator 130. Note that the insulator 130 is preferably formed using a material that can have ferroelectricity. FIG. 7B2 can also be regarded as a structure where the oxide 230 is in contact with the insulator 130, i.e., the material that can have ferroelectricity. Note that details of the oxide 230 are described later (refer to Embodiment 2).

FIG. 7C2 includes the conductor 110, an insulator 115a over the conductor 110, the insulator 130 over the insulator 115a, and the conductor 120 over the insulator 130. Note that FIG. 7C2 can be regarded as a structure where the insulator 115a is included between the conductor 110 and the insulator 130 in FIG. 7A2. FIG. 7C3 includes the conductor 110, the insulator 130 over the conductor 110, an insulator 115b over the insulator 130, and the conductor 120 over the insulator 115b. Note that FIG. 7C3 can be regarded as a structure where the insulator 115b is included between the insulator 130 and the conductor 120 in FIG. 7A2.

FIG. 7C4 includes the conductor 110, the insulator 115a over the conductor 110, the insulator 130 over the insulator 115a, the insulator 115b over the insulator 130, and the conductor 120 over the insulator 115b. Note that in the structure of the circuit diagram in FIG. 7C1, certain polarization is preferably obtained in the P-E (Polarization density-Electric field) characteristics. For example, in the case where a first section is set from 0 (V) to 3 (V), a second section is set from 3 (V) to 0 (V), a third section is set from −Va (V) to Va (V), a fourth section is set from 0 (V) to −3 (V), a fifth section is set from −3 (V) to 0 (V), and a sixth section is set from −Va (V) to Va (V) in the I-V characteristics, the current value preferably differs between the third section and the sixth section. In addition, Va is preferably a voltage lower than or equal to a coercive electric field (Ec) in this circuit diagram. In order to satisfy the characteristics, at least one of the film kind, the film quality, and the film thickness is made to be different between the insulator 115a and the insulator 115b, for example.

The insulator 115a and the insulator 115b are each a paraelectric material; for example, silicon oxide, silicon nitride, silicon oxynitride, silicon nitride, aluminum oxide, aluminum nitride, or aluminum oxynitride can be used. It is particularly preferable that the insulator 115a and the insulator 115b each be a silicon nitride film. The insulator 115a and the insulator 115b can each be deposited by a sputtering method, a CVD method, an MBE method, a PLD method, an ALD method, or the like. It is particularly preferable that the insulator 115a and the insulator 115b be deposited by a PEALD method. For example, in the case where a silicon nitride film is deposited by a PEALD method, a precursor containing a halogen such as fluorine, chlorine, bromine, or iodine is suitably used. After the precursor is introduced, plasma treatment is performed in an atmosphere to which a nitriding agent such as $N_2$, $N_2O$, $NH_3$, $NO$, $NO_2$, or $N_2O_2$ is introduced, so that a high-quality silicon nitride film can be deposited.

In the case where a silicon nitride film is used as the insulator 115a, the insulator 130 containing a metal nitride and the insulator 115a contain nitrogen as a common main component. Thus, formation of a mixed layer at the interface between the insulator 130 and the insulator 115a and the vicinity of the interface is inhibited, which can improve the crystallinity of the insulator 130.

In the case where a PEALD method is used to deposit the insulator 115a, it is preferable to employ a PEALD method also in the deposition of the insulator 130. In that case, a common manufacturing apparatus can be used. Moreover, switching a precursor while not switching a nitriding agent makes it possible to successively deposit the insulator 130 over the insulator 115a. Thus, the insulator 115a and the insulator 130 can be successively deposited without exposure to the air, so that the vicinity of the interface between the insulator 115a and the insulator 130 can be kept clean.

According to one embodiment of the present invention, a material that can have ferroelectricity, i.e., a metal nitride film having ferroelectricity, can be provided. According to another embodiment of the present invention, a ferroelectric device utilizing a material that can have ferroelectricity can be provided. According to another embodiment of the present invention, a capacitor utilizing a material that can have ferroelectricity can be provided. According to another embodiment of the present invention, a transistor utilizing a material that can have ferroelectricity can be provided. According to another embodiment of the present invention, a capacitor and a diode each utilizing a material that can have ferroelectricity can be provided.

In other words, the metal oxide film of one embodiment of the present invention can be used for any one or more of a capacitor, a transistor, and a diode that are ferroelectric devices.

The structure illustrated in FIG. 7A1 and FIG. 7A2 is similar to that of the capacitor 100 illustrated in FIG. 1 or the like, and the description thereof can be referred to. Likewise, the structure relating to FIG. 1 or the like can be applied to the structure illustrated in FIG. 7B1 and FIG. 7B2 and the structures illustrated in FIG. 7C1, FIG. 7C2, FIG. 7C3, and FIG. 7C4 when some of the components (e.g., the oxide 230, the insulator 115a, and the insulator 115b) are changed. In addition, the same can apply to the following description of the specification and the like.

At least part of the structure, method, and the like described in this embodiment can be implemented in appropriate combination with any of the other embodiments described in this specification.

Embodiment 2

In this embodiment, an example of a semiconductor device that includes a transistor 200 of one embodiment of the present invention, an example of a semiconductor device that includes the transistor 200 and the capacitor 100 of embodiments of the present invention, and a fabrication method thereof are described with reference to FIG. 8A to FIG. 21C. Here, the description of the capacitor 100 in Embodiment 1 can be referred to for the capacitor 100 used in the above-described semiconductor device.

Structure Example of Semiconductor Device

Figure 8A:
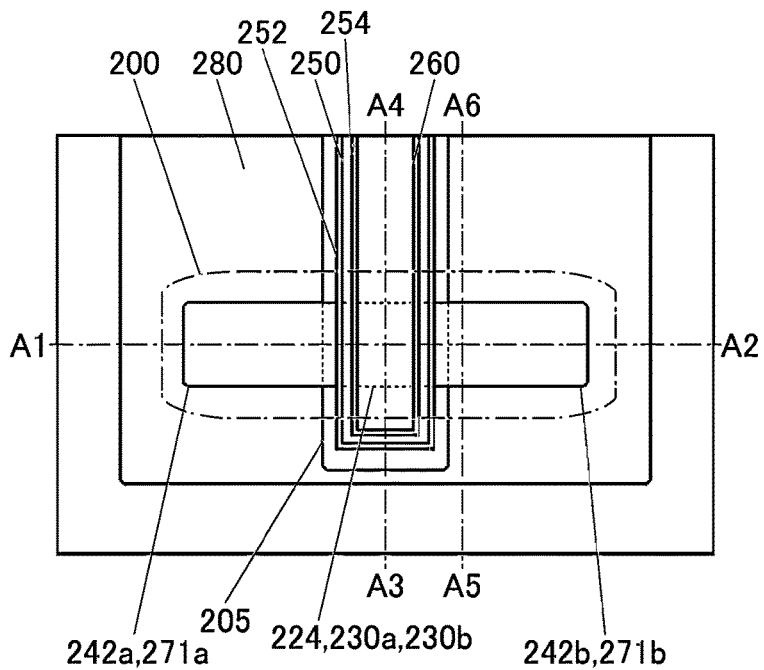
FIG. 8A is a top view of a semiconductor device of one embodiment of the present invention.
Figure 8C:
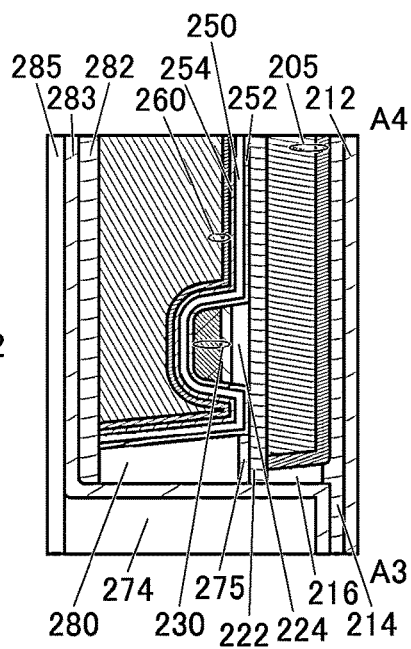
FIG. 8B to FIG. 8D are cross-sectional views of the semiconductor device of one embodiment of the present invention.
Figure 8B:
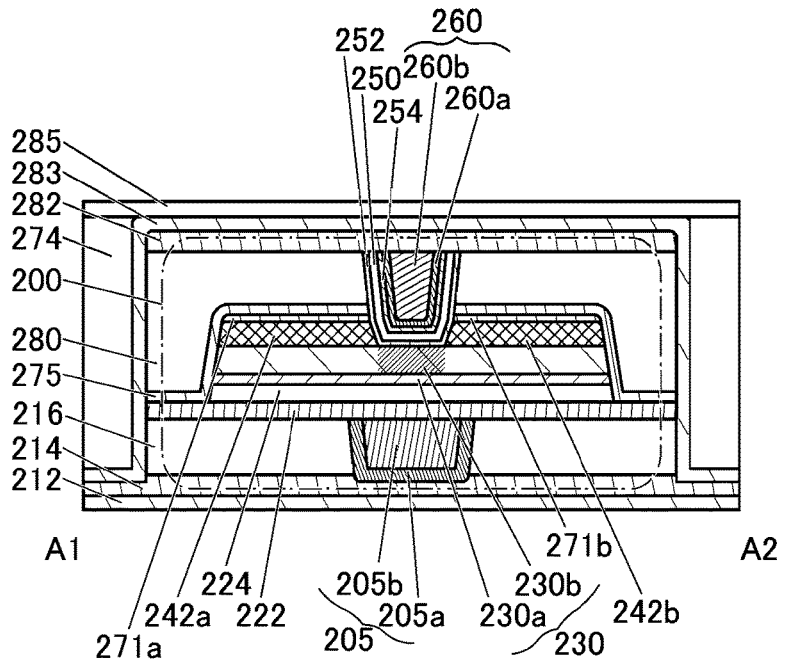
Figure 8D:
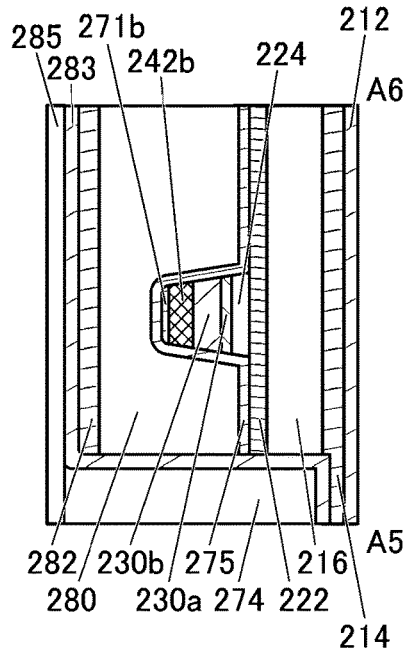

FIG. 8A to FIG. 8D are a top view and cross-sectional views of the semiconductor device that includes the transistor 200. FIG. 8A is a top view of the semiconductor device. FIG. 8B to FIG. 8D are cross-sectional views of the semiconductor device. FIG. 8B is a cross-sectional view of a portion indicated by the dashed-dotted line A1-A2 in FIG. 8A, which corresponds to a cross-sectional view in the channel length direction of the transistor 200. FIG. 8C is a cross-sectional view of a portion indicated by the dashed-dotted line A3-A4 in FIG. 8A, which corresponds to a cross-sectional view in the channel width direction of the transistor 200. FIG. 8D is a cross-sectional view of a portion indicated by the dashed-dotted line A5-A6 in FIG. 8A. Note that for clarity of the drawing, some components are not illustrated in the top view of FIG. 8A.

The semiconductor device of one embodiment of the present invention includes the insulator 212 over a substrate (not illustrated), an insulator 214 over the insulator 212, the transistor 200 over the insulator 214, an insulator 280 over an insulator 275 provided in the transistor 200, an insulator 282 over the insulator 280, an insulator 283 over the insulator 282, an insulator 274 over the insulator 283, and an insulator 285 over the insulator 283 and the insulator 274. The insulator 212, the insulator 214, the insulator 275, the insulator 280, the insulator 282, the insulator 283, the insulator 285, and the insulator 274 function as interlayer films. The insulator 283 is in contact with part of the top surface of the insulator 214, the side surface of the insulator 275, the side surface of the insulator 280, and the side surface and the top surface of the insulator 282.

Here, the transistor 200 includes a semiconductor layer, a first gate, a second gate, a source, and a drain. An insulator 271 (an insulator 271a and an insulator 271b) is provided on and in contact with the source and the drain of the transistor 200.

[Transistor 200]

As illustrated in FIG. 8A to FIG. 8D, the transistor 200 includes an insulator 216 over the insulator 214, a conductor 205 (a conductor 205a and a conductor 205b) placed to be embedded in the insulator 214 and/or the insulator 216, an insulator 222 over the insulator 216 and the conductor 205, an insulator 224 over the insulator 222, an oxide 230a over the insulator 224, an oxide 230b over the oxide 230a, a conductor 242a over the oxide 230b, the insulator 271a over the conductor 242a, a conductor 242b over the oxide 230b, the insulator 271b over the conductor 242b, an insulator 252 over the oxide 230b, an insulator 250 over the insulator 252, an insulator 254 over the insulator 250, a conductor 260 (a conductor 260a and a conductor 260b) positioned over the insulator 254 and overlapping with part of the oxide 230b, and the insulator 275 placed over the insulator 222, the insulator 224, the oxide 230a, the oxide 230b, the conductor 242a, the conductor 242b, the insulator 271a, and the insulator 271b. Here, as illustrated in FIG. 8B and FIG. 8C, the insulator 252 is in contact with the top surface of the insulator 222, the side surface of the insulator 224, the side surface of the oxide 230a, the side surface and the top surface of the oxide 230b, the side surface of the conductor 242, the side surface of the insulator 271, the side surface of the insulator 275, the side surface of the insulator 280, and the bottom surface of the insulator 250. The top surface of the conductor 260 is placed to be substantially level with the uppermost portion of the insulator 254, the uppermost portion of the insulator 250, the uppermost portion of the insulator 252, and the top surface of the insulator 280. The insulator 282 is in contact with at least parts of the top surfaces of the conductor 260, the insulator 252, the insulator 250, the insulator 254, and the insulator 280.

Hereinafter, the oxide 230a and the oxide 230b are collectively referred to as the oxide 230 in some cases. The conductor 242a and the conductor 242b are collectively referred to as the conductor 242 in some cases. The insulator 271a and the insulator 271b are collectively referred to as the insulator 271 in some cases.

An opening reaching the oxide 230b is provided in the insulator 280 and the insulator 275. The insulator 252, the insulator 250, the insulator 254, and the conductor 260 are placed in the opening. The conductor 260, the insulator 252, the insulator 250, and the insulator 254 are provided between the insulator 271a and the conductor 242a, and the insulator 271b and the conductor 242b in the channel length direction of the transistor 200. The insulator 254 includes a region in contact with the side surface of the conductor 260 and a region in contact with the bottom surface of the conductor 260.

The oxide 230 preferably includes the oxide 230a placed over the insulator 224 and the oxide 230b placed over the oxide 230a. Including the oxide 230a under the oxide 230b makes it possible to inhibit diffusion of impurities into the oxide 230b from components formed below the oxide 230a.

Although a structure in which two layers, the oxide 230a and the oxide 230b, are stacked as the oxide 230 in the transistor 200 is described, the present invention is not limited thereto. For example, the oxide 230 may be provided as a single layer of the oxide 230b or to have a stacked-layer structure of three or more layers, or the oxide 230a and the oxide 230b may each have a stacked-layer structure.

The conductor 260 functions as a first gate (also referred to as a top gate) electrode, and the conductor 205 functions as a second gate (also referred to as a back gate) electrode. The insulator 252, the insulator 250, and the insulator 254 function as a first gate insulator, and the insulator 222 and the insulator 224 function as a second gate insulator. Note that the gate insulator is also referred to as a gate insulating layer or a gate insulating film in some cases. The conductor 242a functions as one of the source and the drain, and the conductor 242b functions as the other of the source and the drain. At least part of a region of the oxide 230 overlapping with the conductor 260 functions as a channel formation region.

Figure 9A:
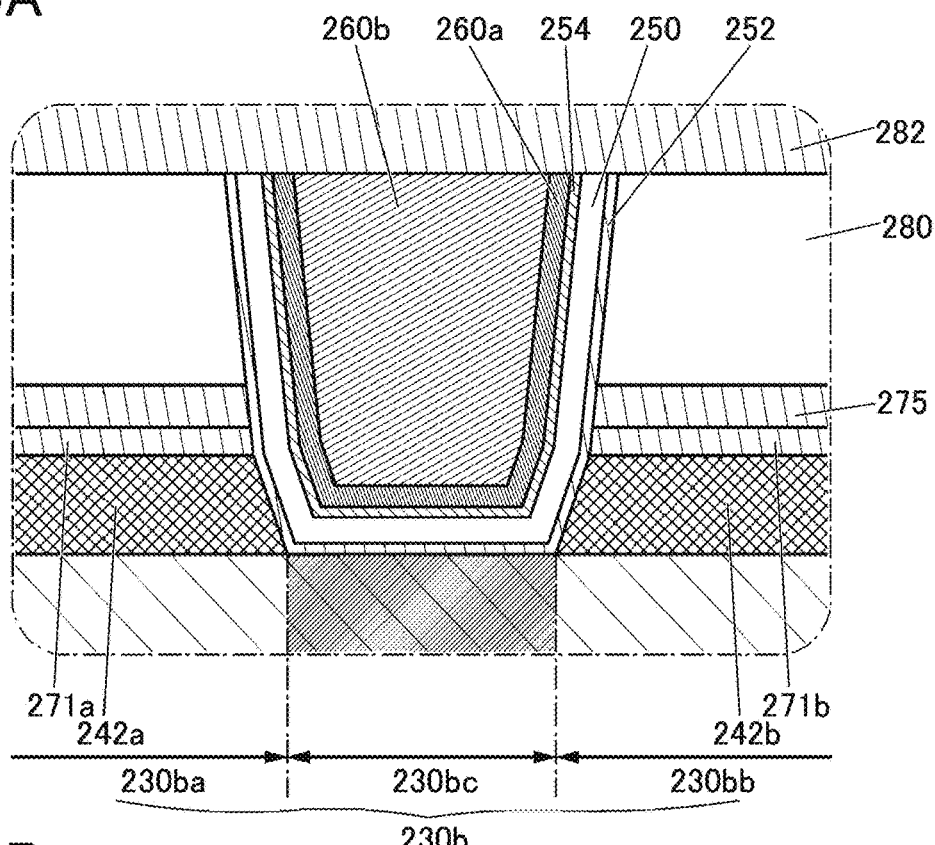
FIG. 9A and FIG. 9B are cross-sectional views of a semiconductor device of one embodiment of the present invention.

FIG. 9A is an enlarged view of the vicinity of the channel formation region in FIG. 8B. Supply of oxygen to the oxide 230b forms the channel formation region in a region between the conductor 242a and the conductor 242b. As illustrated in FIG. 9A, the oxide 230b includes a region 230bc functioning as the channel formation region of the transistor 200 and a region 230ba and a region 230bb that are provided to sandwich the region 230bc and function as a source region and a drain region. At least part of the region 230bc overlaps with the conductor 260. In other words, the region 230bc is provided between the conductor 242a and the conductor 242b. The region 230ba is provided to overlap with the conductor 242a, and the region 230bb is provided to overlap with the conductor 242b.

The region 230bc functioning as the channel formation region has a smaller amount of oxygen vacancies or a lower impurity concentration than those of the region 230ba and the region 230bb, and thus is a high-resistance region with a low carrier concentration. Thus, the region 230bc can be regarded as being i-type (intrinsic) or substantially i-type. Performing microwave treatment in an atmosphere containing oxygen facilitates formation of the region 230bc, for example. Here, the microwave treatment refers to, for example, treatment using an apparatus including a power source that generates high-density plasma with the use of a microwave. Note that in this specification and the like, a microwave refers to an electromagnetic wave having a frequency higher than or equal to 300 MHz and lower than or equal to 300 GHz.

The region 230ba and the region 230bb functioning as the source region and the drain region include a large amount of oxygen vacancies or have a high concentration of an impurity such as hydrogen, nitrogen, or a metal element, and thus are each a low-resistance region with an increased carrier concentration. In other words, the region 230ba and the region 230bb are each an n-type region having a higher carrier concentration and a lower resistance than the region 230bc.

The carrier concentration in the region 230bc functioning as the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration in the region 230bc functioning as the channel formation region is not particularly limited and can be, for example, $1\times10^{-9}$ cm$^{-3}$.

Between the region 230bc and the region 230ba or the region 230bb, a region having a carrier concentration that is lower than or substantially equal to the carrier concentrations in the region 230ba and the region 230bb and higher than or substantially equal to the carrier concentration in the region 230bc may be formed. That is, the region functions as a junction region between the region 230bc and the region 230ba or the region 230bb. The hydrogen concentration in the junction region is lower than or substantially equal to the hydrogen concentrations in the region 230ba and the region 230bb and higher than or substantially equal to the hydrogen concentration in the region 230bc in some cases. The amount of oxygen vacancies in the junction region is smaller than or substantially equal to the amounts of oxygen vacancies in the region 230ba and the region 230bb and larger than or substantially equal to the amount of oxygen vacancies in the region 230bc in some cases.

Although FIG. 9A illustrates an example where the region 230ba, the region 230bb, and the region 230bc are formed in the oxide 230b, the present invention is not limited thereto. For example, the above regions may be formed not only in the oxide 230*b* but also in the oxide 230*a*.

In the oxide 230, the boundaries between the regions are difficult to detect clearly in some cases. The concentrations of a metal element and impurity elements such as hydrogen and nitrogen, which are detected in each region, may be gradually changed not only between the regions but also in each region. That is, the region closer to the channel formation region has lower concentrations of a metal element and impurity elements such as hydrogen and nitrogen.

In the transistor 200, a metal oxide functioning as a semiconductor (such a metal oxide is hereinafter also referred to as an oxide semiconductor) is preferably used for the oxide 230 (the oxide 230*a* and the oxide 230*b*) including the channel formation region.

The metal oxide functioning as a semiconductor preferably has a band gap of 2 eV or more, further preferably 2.5 eV or more. With the use of such a metal oxide having a wide band gap, the off-state current of the transistor can be reduced.

As the oxide 230, it is preferable to use, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, In—Ga oxide, In—Zn oxide, or indium oxide may be used as the oxide 230.

The oxide 230*b* preferably has crystallinity. It is particularly preferable to use a CAAC-OS (c-axis aligned crystalline oxide semiconductor) as the oxide 230*b*.

The CAAC-OS is a metal oxide having a dense structure with high crystallinity and a small amount of impurities and defects (for example, oxygen vacancies). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide that includes a CAAC-OS is physically stable. Therefore, the metal oxide that includes a CAAC-OS is resistant to heat and has high reliability.

If impurities and oxygen vacancies exist in a region of an oxide semiconductor where a channel is formed, a transistor that includes the oxide semiconductor might have variable electrical characteristics and poor reliability. In some cases, hydrogen in the vicinity of an oxygen vacancy forms a defect that is the oxygen vacancy into which hydrogen enters (hereinafter sometimes referred to as VOH), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and a current flows through the transistor). Thus, impurities, oxygen vacancies, and VOH are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and VOH. However, supply of an excess amount of oxygen to the source region or the drain region might cause a decrease in the on-state current or field-effect mobility of the transistor 200. Furthermore, a variation in the amount of oxygen supplied to the source region or the drain region in the substrate plane leads to a variation in characteristics of the semiconductor device that includes the transistor.

Therefore, the region 230*bc* functioning as the channel formation region in the oxide semiconductor is preferably an i-type or substantially i-type region with reduced carrier concentration, whereas the region 230*ba* and the region 230*bb* functioning as the source region and the drain region are preferably n-type regions with high carrier concentrations. That is, it is preferable that oxygen vacancies and VOH in the region 230*bc* of the oxide semiconductor be reduced and the region 230*ba* and the region 230*bb* not be supplied with an excess amount of oxygen.

As illustrated in FIG. 8C, a curved surface may be provided between the side surface of the oxide 230*b* and the top surface of the oxide 230*b* in a cross-sectional view of the transistor 200 in the channel width direction. In other words, an end portion of the side surface and an end portion of the top surface may be curved (hereinafter referred to as rounded).

The radius of curvature of the curved surface is preferably greater than 0 nm and less than the thickness of the oxide 230*b* in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 230*b* with the insulator 252, the insulator 250, the insulator 254, and the conductor 260.

The oxide 230 preferably has a stacked-layer structure of a plurality of oxide layers with different chemical compositions. Specifically, the atomic ratio of the element M to a metal element that is a main component of the metal oxide used as the oxide 230*a* is preferably greater than the atomic ratio of the element M to a metal element that is a main component of the metal oxide used as the oxide 230*b*. Moreover, the atomic ratio of the element M to In in the metal oxide used as the oxide 230*a* is preferably greater than the atomic ratio of the element M to In in the metal oxide used as the oxide 230*b*. Furthermore, the atomic ratio of In to the element Min the metal oxide used as the oxide 230*b* is preferably greater than the atomic ratio of In to the element M in the metal oxide used as the oxide 230*a*.

The oxide 230*b* is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 230*b* by a source electrode or a drain electrode. This can reduce oxygen extraction from the oxide 230*b* even when heat treatment is performed; thus, the transistor 200 is stable with respect to high temperatures in a manufacturing process (what is called thermal budget).

Here, the conduction band minimum gradually changes at a junction portion of the oxide 230a and the oxide 230b. In other words, the conduction band minimum at the junction portion of the oxide 230a and the oxide 230b continuously changes or is continuously connected. To achieve this, the density of defect states in a mixed layer formed at the interface between the oxide 230a and the oxide 230b is preferably made low.

Specifically, when the oxide 230a and the oxide 230b contain a common element as a main component besides oxygen, the density of defect states at the interface between the oxide 230a and the oxide 230b can be low. Alternatively, a mixed layer with a low density of defect states can be formed. For example, in the case where the oxide 230b is an In-M-Zn oxide, an In-M-Zn oxide, an M-Zn oxide, an oxide of the element M, In—Zn oxide, indium oxide, or the like may be used as the oxide 230a.

Specifically, as the oxide 230a, a metal oxide with In:M: Zn=1:3:4 [atomic ratio] or a composition in the neighborhood thereof, or In:M:Zn=1:1:0.5 [atomic ratio] or a composition in the neighborhood thereof is used. As the oxide 230b, a metal oxide with In:M:Zn=1:1:1 [atomic ratio] or a composition in the neighborhood thereof, In:M:Zn=1:1:2 [atomic ratio] or a composition in the neighborhood thereof, or In:M:Zn=4:2:3 [atomic ratio] or a composition in the neighborhood thereof can be used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 8C or the like, the insulator 252 formed using aluminum oxide or the like is provided in contact with the top surface and the side surface of the oxide 230, whereby indium contained in the oxide 230 is unevenly distributed, in some cases, at the interface between the oxide 230 and the insulator 252 and in its vicinity. Accordingly, the vicinity of a surface of the oxide 230 comes to have an atomic ratio close to that of indium oxide or that of In—Zn oxide. Such an increase in the atomic ratio of indium in the vicinity of the surface of the oxide 230, especially the vicinity of a surface of the oxide 230b, can increase the field-effect mobility of the transistor 200.

When the oxide 230a and the oxide 230b have the above structure, the density of defect states at the interface between the oxide 230a and the oxide 230b can be made low. Thus, the influence of interface scattering on carrier conduction is small, and the transistor 200 can have a high on-state current and excellent frequency characteristics.

At least one of the insulator 212, the insulator 214, the insulator 271, the insulator 275, the insulator 282, the insulator 283, and the insulator 285 preferably functions as a barrier insulating film, which inhibits diffusion of impurities such as water and hydrogen from the substrate side or from above the transistor 200 into the transistor 200. Thus, for at least one of the insulator 212, the insulator 214, the insulator 271, the insulator 275, the insulator 282, the insulator 283, and the insulator 285, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

An insulator having a function of inhibiting diffusion of oxygen and impurities such as water and hydrogen is preferably used for the insulator 212, the insulator 214, the insulator 271, the insulator 275, the insulator 282, the insulator 283, and the insulator 285; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 212, the insulator 275, and the insulator 283, as in the case of the insulator 152 described in the above embodiment. For example, aluminum oxide or magnesium oxide, which has high capability of capturing or fixing hydrogen, is preferably used for the insulator 214, the insulator 271, the insulator 282, and the insulator 285, as in the case of the insulator 155 in the above embodiment. In that case, impurities such as water and hydrogen can be inhibited from diffusing to the transistor 200 side from the substrate side through the insulator 212 and the insulator 214. Impurities such as water and hydrogen can be inhibited from diffusing to the transistor 200 side from an interlayer insulating film and the like which are placed outward from the insulator 285. Alternatively, oxygen contained in the insulator 224 and the like can be inhibited from diffusing to the substrate side through the insulator 212 and the insulator 214. Alternatively, oxygen contained in the insulator 280 and the like can be inhibited from diffusing to above the transistor 200 through the insulator 282 and the like. In this manner, it is preferable that the transistor 200 be surrounded by the insulator 212, the insulator 214, the insulator 271, the insulator 275, the insulator 282, the insulator 283, and the insulator 285, which have a function of inhibiting diffusion of oxygen and impurities such as water and hydrogen.

Here, an oxide having an amorphous structure is preferably used for the insulator 212, the insulator 214, the insulator 271, the insulator 275, the insulator 282, the insulator 283, and the insulator 285. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as a component of the transistor 200 or provided around the transistor 200, hydrogen contained in the transistor 200 or hydrogen present around the transistor 200 can be captured or fixed. In particular, hydrogen contained in the channel formation region of the transistor 200 is preferably captured or fixed. When the metal oxide having an amorphous structure is used as a component of the transistor 200 or provided around the transistor 200, the transistor 200 and a semiconductor device which have favorable characteristics and high reliability can be fabricated.

Although each of the insulator 212, the insulator 214, the insulator 271, the insulator 275, the insulator 282, the insulator 283, and the insulator 285 preferably has an amorphous structure, a region having a polycrystalline structure may be partly formed. Alternatively, each of the insulator 212, the insulator 214, the insulator 271, the insulator 275, the insulator 282, the insulator 283, and the insulator 285 may have a multilayer structure in which a layer with an amorphous structure and a layer with a polycrystalline structure are stacked. For example, a stacked-layer structure in which a layer with a polycrystalline structure is formed over a layer with an amorphous structure may be employed.

The insulator 212, the insulator 214, the insulator 271, the insulator 275, the insulator 282, the insulator 283, and the insulator 285 can be deposited by a sputtering method, for example. Since a sputtering method does not need to use a molecule containing hydrogen as a deposition gas, the hydrogen concentrations in the insulator 212, the insulator 214, the insulator 271, the insulator 275, the insulator 282, the insulator 283, and the insulator 285 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like can be used as appropriate.

The resistivities of the insulator 212, the insulator 275, and the insulator 283 are preferably low in some cases. For example, by setting the resistivities of the insulator 212, the insulator 275, and the insulator 283 to approximately $1 \times 10^{13}$ $\Omega$cm, the insulator 212, the insulator 275, and the insulator 283 can sometimes reduce charge up of the conductor 205, the conductor 242, the conductor 260, or the conductor 110 in treatment using plasma or the like in the fabrication process of a semiconductor device. The resistivities of the insulator 212, the insulator 275, and the insulator 283 are preferably higher than or equal to $1 \times 10^{10}$ $\Omega$cm and lower than or equal to $1 \times 10^{15}$ $\Omega$cm.

The insulator 216, the insulator 274, the insulator 280, and the insulator 285 each preferably have a lower permittivity than the insulator 214. When a material with a low permittivity is used for an interlayer film, parasitic capacitance generated between wirings can be reduced. For the insulator 216, the insulator 274, the insulator 280, and the insulator 285, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The conductor 205 is placed to overlap with the oxide 230 and the conductor 260. Here, the conductor 205 is preferably provided to be embedded in an opening formed in the insulator 216. Part of the conductor 205 is embedded in the insulator 214 in some cases.

The conductor 205 includes the conductor 205a and the conductor 205b. The conductor 205a is provided in contact with the bottom surface and the sidewall of the above opening. The conductor 205b is provided to be embedded in a depressed portion formed in the conductor 205a. Here, the top surface of the conductor 205b is substantially level with the top surfaces of the conductor 205a and the insulator 216.

Here, for the conductor 205a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 205a is formed using a conductive material having a function of inhibiting diffusion of hydrogen, impurities such as hydrogen contained in the conductor 205b can be prevented from diffusing into the oxide 230 through the insulator 224, the insulator 216, and the like. When the conductor 205a is formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205a may be a single layer or a stacked layer of the above conductive materials. For example, titanium nitride is used for the conductor 205a.

Moreover, the conductor 205b is preferably formed using a conductive material containing tungsten, copper, or aluminum as its main component. For example, tungsten is used for the conductor 205b.

The conductor 205 sometimes functions as the second gate electrode. In that case, by changing a potential applied to the conductor 205 not in conjunction with but independently of a potential applied to the conductor 260, the threshold voltage (Vth) of the transistor 200 can be controlled. In particular, Vth of the transistor 200 can be higher in the case where a negative potential is applied to the conductor 205, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

In the case where the oxide 230 is a highly purified intrinsic oxide and as many impurities as possible are eliminated from the oxide 230, the transistor 200 can be expected to become normally off (the threshold voltage of the transistor 200 can be expected to be higher than 0 V) in some cases with no potential application to the conductor 205 and/or the conductor 260. In that case, it is suitable to connect the conductor 260 and the conductor 205 to each other such that the same potential is supplied.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. When the thickness of the insulator 216 is reduced, the absolute amount of impurities such as hydrogen contained in the insulator 216 can be reduced, thereby reducing the amount of the impurities to be diffused into the oxide 230.

As illustrated in FIG. 8A, the conductor 205 is preferably provided to be larger than a region of the oxide 230 that does not overlap with the conductor 242a or the conductor 242b. As illustrated in FIG. 8C, it is particularly preferable that the conductor 205 extend to a region located outward from end portions of the oxide 230a and the oxide 230b in the channel width direction. That is, the conductor 205 and the conductor 260 preferably overlap with each other with the insulators therebetween, in a region located outward from the side surface of the oxide 230 in the channel width direction. With this structure, the channel formation region of the oxide 230 can be electrically surrounded by the electric field of the conductor 260 functioning as the first gate electrode and the electric field of the conductor 205 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

When the transistor 200 becomes normally off and has the above-described S-Channel structure, the channel formation region can be electrically surrounded. Accordingly, the transistor 200 can be regarded as having a GAA (Gate All Around) structure or an LGAA (Lateral Gate All Around) structure. When the transistor 200 has the S-Channel structure, the GAA structure, or the LGAA structure, the channel formation region that is formed at the interface between the oxide 230 and the gate insulating film or in the vicinity of the interface can be formed in the entire bulk of the oxide 230. In other words, the transistor 200 having the S-Channel structure, the GAA structure, or the LGAA structure can be what is called a Bulk-Flow type, in which a carrier path is used as the entire bulk. A transistor structure with a Bulk-Flow type can improve the density of a current flowing in the transistor and thus can be expected to improve the on-state current of the transistor or increase the field-effect mobility of the transistor.

Furthermore, as illustrated in FIG. 8C, the conductor 205 is extended to function as a wiring as well. However, without limitation to this structure, a structure in which a conductor functioning as a wiring is provided below the conductor 205 may be employed. In addition, the conductor 205 is not necessarily provided in each transistor. For example, the conductor 205 may be shared by a plurality of transistors.

Although the transistor 200 having a structure in which the conductor 205 is a stack of the conductor 205a and the conductor 205b is described, the present invention is not limited thereto. For example, the conductor 205 may be provided to have a single-layer structure or a stacked-layer structure of three or more layers.

The insulator 222 and the insulator 224 function as the gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of inhibiting diffusion of one or both of hydrogen and oxygen more than the insulator 224.

As the insulator 222, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. Alternatively, an oxide containing hafnium and zirconium, e.g., hafnium zirconium oxide, is preferably used. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. As the insulator 222, any of these insulators over which silicon oxide, silicon oxynitride, or silicon nitride is stacked may be used.

For example, a single layer or stacked layers of an insulator(s) containing what is called a high-k material such as aluminum oxide, hafnium oxide, tantalum oxide, zirconium oxide, or hafnium zirconium oxide may be used for the insulator 222. As miniaturization and high integration of transistors progress, a problem such as a leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) can be sometimes used for the insulator 222.

Silicon oxide or silicon oxynitride, for example, can be used as appropriate for the insulator 224 that is in contact with the oxide 230.

In a fabrication process of the transistor 200, heat treatment is preferably performed with a surface of the oxide 230 exposed. For example, the heat treatment is performed at higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies. The heat treatment may be performed under reduced pressure. Alternatively, the heat treatment may be performed in the following manner: heat treatment is performed in a nitrogen gas or inert gas atmosphere and then another heat treatment is performed in an atmosphere containing an oxidizing gas at 10 ppm or more, 1% or more, or 10% or more in order to compensate for released oxygen. Alternatively, the heat treatment may be performed in the following manner: heat treatment is performed in an atmosphere containing an oxidizing gas at 10 ppm or more, 1% or more, or 10% or more, and then another heat treatment is successively performed in a nitrogen gas or inert gas atmosphere.

Note that oxygen adding treatment performed on the oxide 230 can promote a reaction in which oxygen vacancies in the oxide 230 are repaired with supplied oxygen, i.e., a reaction of "$V_O+O \rightarrow null$". Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and resultant formation of VOH.

Note that the insulator 222 and the insulator 224 may each have a stacked-layer structure of two or more layers. In that case, without limitation to a stacked-layer structure formed of the same material, a stacked-layer structure formed of different materials may be employed. The insulator 224 may be formed into an island shape so as to overlap with the oxide 230a. In this case, the insulator 275 is in contact with the side surface of the insulator 224 and the top surface of the insulator 222.

The conductor 242a and the conductor 242b are provided in contact with the top surface of the oxide 230b. The conductor 242a and the conductor 242b function as the source electrode and the drain electrode of the transistor 200.

For the conductor 242 (the conductor 242a and the conductor 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 230b or the like diffuses into the conductor 242a or the conductor 242b in some cases. In particular, when a nitride containing tantalum is used for the conductor 242a and the conductor 242b, hydrogen contained in the oxide 230b or the like is likely to diffuse into the conductor 242a or the conductor 242b, and the diffused hydrogen is bonded to nitrogen contained in the conductor 242a or the conductor 242b in some cases. That is, hydrogen contained in the oxide 230b or the like is absorbed by the conductor 242a or the conductor 242b in some cases.

No curved surface is preferably formed between the side surface of the conductor 242 and the top surface of the conductor 242. When no curved surface is formed in the conductor 242, the conductor 242 can have a large cross-sectional area in the channel width direction as illustrated in FIG. 8D. Accordingly, the conductivity of the conductor 242 is increased, so that the on-state current of the transistor 200 can be increased.

The insulator 271a is provided in contact with the top surface of the conductor 242a, and the insulator 271b is provided in contact with the top surface of the conductor 242b. The insulator 271 preferably functions as at least a barrier insulating film against oxygen. Thus, the insulator 271 preferably has a function of inhibiting oxygen diffusion. For example, the insulator 271 preferably has a function of inhibiting diffusion of oxygen more than the insulator 280. As the insulator 271, an insulator such as aluminum oxide or magnesium oxide is used, for example.

The insulator 275 is provided to cover the insulator 224, the oxide 230a, the oxide 230b, the conductor 242, and the insulator 271. The insulator 275 preferably has a function of capturing or fixing hydrogen. In that case, the insulator 275 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 275.

When the insulator 271 and the insulator 275 as described above are provided, the conductor 242 can be surrounded by the insulators having a barrier property against oxygen. That is, oxygen contained in the insulator 224 and the insulator 280 can be prevented from diffusing into the conductor 242. As a result, the conductor 242 can be inhibited from being directly oxidized by oxygen contained in the insulator 224 and the insulator 280, so that an increase in resistivity and a reduction in an on-state current can be inhibited.

The insulator 252 functions as part of the gate insulator. As the insulator 252, a barrier insulating film against oxygen is preferably used. As the insulator 252, an insulator that can be used as the insulator 282 described above may be used. An insulator containing an oxide of one or both of aluminum and hafnium is preferably used as the insulator 252. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 252. In this case, the insulator 252 is an insulator containing at least oxygen and aluminum.

As illustrated in FIG. 8C, the insulator 252 is provided in contact with the top surface and the side surface of the oxide 230b, the side surface of the oxide 230a, the side surface of the insulator 224, and the top surface of the insulator 222. That is, the regions of the oxide 230a, the oxide 230b, and the insulator 224 that overlap with the conductor 260 are covered with the insulator 252 in the cross section in the channel width direction. With this structure, the insulator 252 having a barrier property against oxygen can prevent release of oxygen from the oxide 230a and the oxide 230b at the time of heat treatment or the like. This can inhibit formation of oxygen vacancies in the oxide 230a and the oxide 230b. Therefore, oxygen vacancies and VOH formed in the region 230bc can be reduced. Thus, the transistor 200 can have favorable electrical characteristics and higher reliability.

Even when an excess amount of oxygen is contained in the insulator 280, the insulator 250, and the like, oxygen can be inhibited from being excessively supplied to the oxide 230a and the oxide 230b. Thus, the region 230ba and the region 230bb are inhibited from being excessively oxidized by oxygen through the region 230bc, so that a reduction in an on-state current or field-effect mobility of the transistor 200 can be inhibited.

As illustrated in FIG. 8B, the insulator 252 is provided in contact with the side surfaces of the conductor 242, the insulator 271, the insulator 275, and the insulator 280. This can inhibit formation of an oxide film on the side surface of the conductor 242 by oxidization of the side surface. Accordingly, a reduction in an on-state current or field-effect mobility of the transistor 200 can be inhibited.

Furthermore, the insulator 252 needs to be provided in an opening formed in the insulator 280 and the like, together with the insulator 254, the insulator 250, and the conductor 260. The thickness of the insulator 252 is preferably thin for miniaturization of the transistor 200. The thickness of the insulator 252 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In this case, at least part of the insulator 252 includes a region having the above-described thickness. The thickness of the insulator 252 is preferably smaller than that of the insulator 250. In this case, at least part of the insulator 252 includes a region having a thickness smaller than that of the insulator 250.

To deposit the insulator 252 having a small thickness as described above, an ALD method is preferably used for the deposition. Examples of an ALD method include a thermal ALD method, in which a precursor and a reactant react with each other only by a thermal energy, and a PEALD method, in which a reactant excited by plasma is used. A PEALD method is sometimes preferred because the use of plasma allows deposition at a lower temperature.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 252 can be deposited on the side surface of the opening formed in the insulator 280 and the like to have a small thickness like the above-described thickness and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS), X-ray photoelectron spectroscopy (XPS), or auger electron spectroscopy (AES).

The insulator 250 functions as part of the gate insulator. The insulator 250 is preferably in contact with the top surface of the insulator 252. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 250 in this case is an insulator containing at least oxygen and silicon.

As in the insulator 224, the concentration of impurities such as water and hydrogen in the insulator 250 is preferably reduced. The thickness of the insulator 250 is preferably greater than or equal to 1 nm and less than or equal to 20 nm, further preferably greater than or equal to 0.5 nm and less than or equal to 15.0 nm. In this case, at least part of the insulator 250 includes a region with the above-described thickness.

Although FIG. 8A to FIG. 8D and the like illustrate a single-layer structure of the insulator 250, the present invention is not limited to this structure, and a stacked-layer structure of two or more layers may be employed. For example, as illustrated in FIG. 9B, the insulator 250 may have a stacked-layer structure including two layers of an insulator 250a and an insulator 250b over the insulator 250a.

Figure 9B:
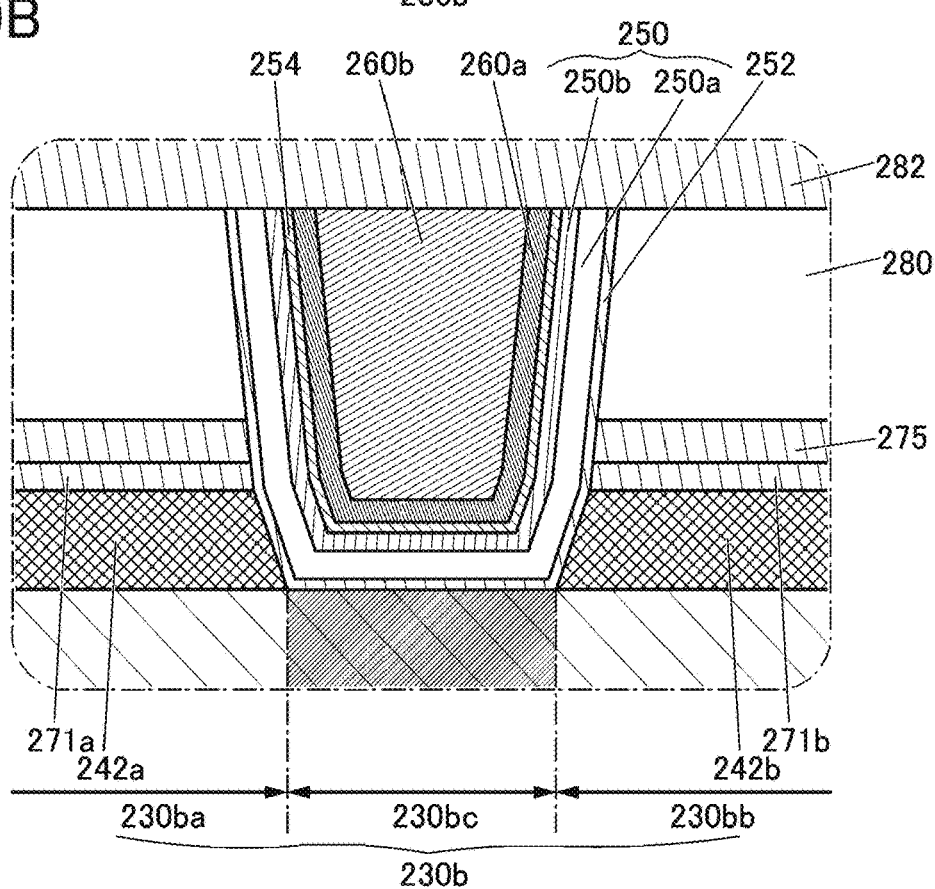

In the case where the insulator 250 has a stacked-layer structure of two layers as illustrated in FIG. 9B, it is preferable that the insulator 250a in the lower layer be formed using an insulator that is likely to transmit oxygen and the insulator 250b in the upper layer be formed using an insulator having a function of inhibiting oxygen diffusion. With such a structure, oxygen contained in the insulator 250a can be inhibited from diffusing into the conductor 260. That is, a reduction in the amount of oxygen supplied to the oxide 230 can be inhibited. In addition, oxidation of the conductor 260 due to oxygen contained in the insulator 250a can be inhibited. For example, it is preferable that the insulator 250a be provided using any of the above-described materials that can be used for the insulator 250 and the insulator 250b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 250b. In this case, the insulator 250b is an insulator containing at least oxygen and hafnium. The thickness of the insulator 250b is greater than or equal to 0.5 nm and less than or equal to 5.0 nm, preferably greater than or equal to 1.0 nm and less than or equal to 5.0 nm, further preferably greater than or equal to 1.0 nm and less than or equal to 3.0 nm. In that case, at least part of the insulator 250b includes a region having the above-described thickness.

In the case where silicon oxide, silicon oxynitride, or the like is used for the insulator 250a, the insulator 250b may be formed using an insulating material that is a high-k material having a high dielectric constant. The gate insulator having a stacked-layer structure of the insulator 250a and the insulator 250b can be thermally stable and can have a high dielectric constant. Thus, a gate potential that is applied during operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 250 can be increased.

The insulator 254 functions as part of the gate insulator. As the insulator 254, a barrier insulating film against hydrogen is preferably used. This can prevent diffusion of impurities such as hydrogen contained in the conductor 260 into the insulator 250 and the oxide 230b. As the insulator 254, an insulator that can be used as the insulator 283 described above may be used. For example, silicon nitride deposited by a PEALD method may be used as the insulator 254. In this case, the insulator 254 is an insulator containing at least nitrogen and silicon.

Furthermore, the insulator 254 may have a barrier property against oxygen. Thus, diffusion of oxygen contained in the insulator 250 into the conductor 260 can be inhibited.

Furthermore, the insulator 254 needs to be provided in an opening formed in the insulator 280 and the like, together with the insulator 252, the insulator 250, and the conductor 260. The thickness of the insulator 254 is preferably thin for miniaturization of the transistor 200. The thickness of the insulator 254 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In this case, at least part of the insulator 254 includes a region having the above-described thickness. The thickness of the insulator 254 is preferably smaller than that of the insulator 250. In this case, at least part of the insulator 254 may include a region having a thickness that is smaller than that of the insulator 250.

The conductor 260 functions as the first gate electrode of the transistor 200. The conductor 260 preferably includes the conductor 260a and the conductor 260b placed over the conductor 260a. For example, the conductor 260a is preferably placed to surround the bottom surface and the side surface of the conductor 260b. Moreover, as illustrated in FIG. 8B and FIG. 8C, the uppermost portion of the conductor 260 is substantially level with the uppermost portion of the insulator 250. Although the conductor 260 is illustrated to have a two-layer structure of the conductor 260a and the conductor 260b in FIG. 8B and FIG. 8C, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As the conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of the conductive material and titanium or titanium nitride may be employed.

In the transistor 200, the conductor 260 is formed in a self-aligned manner to fill the opening formed in the insulator 280 and the like. The formation of the conductor 260 in this manner allows the conductor 260 to be placed properly in a region between the conductor 242a and the conductor 242b without alignment.

As illustrated in FIG. 8C, in the channel width direction of the transistor 200, with reference to the bottom surface of the insulator 222, the level of the bottom surface of the conductor 260 in a region where the conductor 260 and the oxide 230b do not overlap with each other is preferably lower than the level of the bottom surface of the oxide 230b. When the conductor 260 functioning as the gate electrode covers the side surface and the top surface of the channel formation region of the oxide 230b with the insulator 250 and the like therebetween, the electric field of the conductor 260 can easily act on the entire channel formation region of the oxide 230b. Thus, the on-state current of the transistor 200 can be increased and the frequency characteristics of the transistor 200 can be improved. With reference to the bottom surface of the insulator 222, the difference between the level of the bottom surface of the conductor 260 in a region where the conductor 260 do not overlap with the oxide 230a or the oxide 230b and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 275, and the opening is formed in a region where the insulator 250 and the conductor 260 are provided. In addition, the top surface of the insulator 280 may be planarized.

The insulator 280 functioning as an interlayer film preferably has a low permittivity. When a material with a low permittivity is used for an interlayer film, parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide, in each of which a region containing oxygen to be released by heating can be easily formed, are particularly preferable.

The insulator 280 preferably includes an excess-oxygen region or excess oxygen. The concentration of impurities such as water and hydrogen in the insulator 280 is preferably reduced. Silicon oxide, silicon oxynitride, or the like may be used as appropriate for the insulator 280, for example. When an insulator containing excess oxygen is provided in the vicinity of the oxide 230, oxygen vacancies in the oxide 230 can be reduced and the reliability of the transistor 200 can be improved.

The insulator 282 preferably functions as a barrier insulating film that inhibits impurities such as water and hydrogen from diffusing into the insulator 280 from above and preferably has a function of capturing impurities such as hydrogen. The insulator 282 preferably functions as a barrier insulating film that inhibits passage of oxygen. For the insulator 282, a metal oxide having an amorphous structure, for example, an insulator such as aluminum oxide can be used. In this case, the insulator 282 is an insulator containing at least oxygen and aluminum. The insulator 282, which has a function of capturing impurities such as hydrogen, is provided in contact with the insulator 280 in a region interposed between the insulator 212 and the insulator 283, whereby impurities such as hydrogen contained in the insulator 280 and the like can be captured and the amount of hydrogen in the region can be constant. Aluminum oxide having an amorphous structure is particularly preferably used for the insulator 282, in which case hydrogen can sometimes be captured or fixed more effectively. Accordingly, the transistor 200 and a semiconductor device which have favorable characteristics and high reliability can be fabricated.

The insulator 283 functions as a barrier insulating film that inhibits impurities such as water and hydrogen from diffusing into the insulator 280 from above. The insulator 283 is placed over the insulator 282. The insulator 283 is preferably formed using a nitride containing silicon such as silicon nitride or silicon nitride oxide. For example, silicon nitride deposited by a sputtering method may be used for the insulator 283. When a sputtering method is employed, a high-density silicon nitride film can be formed as the insulator 283. To obtain the insulator 283, silicon nitride deposited by a PEALD method or a CVD method may be stacked over silicon nitride deposited by a sputtering method.

<Component Materials of Semiconductor Device>

Component materials that can be used for the semiconductor device are described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate having an insulator region in the semiconductor substrate described above, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a storage element.

<<Insulator>>

Examples of the insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as a leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low dielectric constant is used for the insulator functioning as an interlayer film, parasitic capacitance generated between wirings can be reduced. Thus, a material is preferably selected depending on the function of an insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including a metal oxide is surrounded by an insulator having a function of inhibiting passage of oxygen and impurities such as hydrogen, the transistor can have stable electrical characteristics. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen to be released by heating. For example, when a structure is employed in which silicon oxide or silicon oxynitride including a region containing oxygen to be released by heating is in contact with the oxide 230, oxygen vacancies included in the oxide 230 can be compensated for.

<<Conductor>>

As a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Alternatively, a semiconductor having high electrical conductivity, typified by polycrystalline silicon containing an impurity element such as phosphorus, or a silicide such as nickel silicide may be used.

A stack of a plurality of conductive layers formed of the above materials may be used. For example, a stacked-layer structure combining a material containing the above metal element and a conductive material containing oxygen may be employed. Alternatively, a stacked-layer structure combining a material containing the above metal element and a conductive material containing nitrogen may be employed. Alternatively, a stacked-layer structure combining a material containing the above metal element, a conductive material containing oxygen, and a conductive material containing nitrogen may be employed.

In the case where an oxide is used for the channel formation region of the transistor, the conductor functioning as the gate electrode preferably employs a stacked-layer structure combining a material containing the above metal element and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. Alternatively, a conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used.

With the use of such a material, hydrogen contained in the metal oxide where the channel is formed can be captured in some cases. Alternatively, hydrogen entering from an external insulator or the like can be captured in some cases.

<<Metal Oxide>>

The oxide 230 is preferably formed using a metal oxide functioning as a semiconductor (an oxide semiconductor). A metal oxide that can be used as the oxide 230 of the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, the element M, and zinc is considered. The element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that a combination of two or more of the above elements may be used as the element M in some cases.

Note that in this specification and the like, a metal oxide containing nitrogen is also collectively referred to as a metal oxide in some cases. A metal oxide containing nitrogen may be referred to as a metal oxynitride.

<Classification of Crystal Structures>

First, the classification of crystal structures of an oxide semiconductor is described with reference to FIG. 10A. FIG. 10A is a diagram showing the classification of crystal structures of an oxide semiconductor, typically IGZO (a metal oxide containing In, Ga, and Zn).

As shown in FIG. 10A, an oxide semiconductor is roughly classified into "Amorphous", "Crystalline", and "Crystal". "Amorphous" includes completely amorphous. "Crystalline" includes CAAC (c-axis-aligned crystalline), nc (nanocrystalline), and CAC (cloud-aligned composite). Note that "Crystalline" excludes single crystal, poly crystal, and completely amorphous (excluding single crystal and poly crystal). "Crystal" includes single crystal and poly crystal.

Note that the structures in the thick frame in FIG. 10A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. FIG. 10B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 10B and obtained by GIXD measurement may be hereinafter simply referred to as an XRD spectrum in this specification. The CAAC-IGZO film in FIG. 10B has a composition in the neighborhood of In:Ga:Zn=4:2:3 [atomic ratio]. The CAAC-IGZO film in FIG. 10B has a thickness of 500 nm.

In FIG. 10B, the horizontal axis represents 2θ [deg.], and the vertical axis represents Intensity [a.u.]. As shown in FIG. 10B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 10B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 10C shows a diffraction pattern of the CAAC-IGZO film. FIG. 10C shows a diffraction pattern obtained by the NBED in which an electron beam is incident in the direction parallel to the substrate. The CAAC-IGZO film in FIG. 10C has a composition in the neighborhood of In:Ga:Zn=4:2:3 [atomic ratio]. In the nanobeam electron diffraction method, electron diffraction is performed with a probe diameter of 1 nm.

As shown in FIG. 10C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 10A when classified in terms of the crystal structure. Oxide semiconductors are classified into a single crystal oxide semiconductor and a non-single-crystal oxide semiconductor, for example.

Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, In—Zn oxide and In—Ga—Zn oxide are suitable because they can inhibit generation of a crystal grain boundary as compared with In oxide.

The CAAC-OS is an oxide semiconductor with high crystallinity in which no clear crystal grain boundary is observed. Thus, in the CAAC-OS, reduction in electron mobility due to the crystal grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or less than the diameter of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] than the second region and has lower [Ga] than the second region. Moreover, the second region has higher [Ga] than the first region and has lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), a high field-effect mobility ($\mu$) and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with a high field-effect mobility can be obtained. In addition, a transistor having high reliability can be obtained.

An oxide semiconductor with a low carrier concentration is preferably used for a channel formation region of the transistor. For example, the carrier concentration in the channel formation region in an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film also be reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the channel formation region in the oxide semiconductor and the concentration of silicon or carbon in the vicinity of an interface with in the channel formation region in the oxide semiconductor (the concentrations obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor including an oxide semiconductor that contains an alkali metal or an alkaline earth metal is likely to have normally-on characteristics. Thus, the concentration of an alkali metal or an alkaline earth metal in the channel formation region in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor including an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region in the oxide semiconductor, which is obtained by SIMS, is set lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor that includes an oxide semiconductor containing hydrogen is likely to have normally-on characteristics. Accordingly, hydrogen in the channel formation region in the oxide semiconductor is preferably reduced as much as possible. Specifically, the hydrogen concentration in the channel formation region in the oxide semiconductor, which is obtained by SIMS, is set lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, yet still further preferably lower than $1\times10^{18}$ atoms/cm$^3$.

When an oxide semiconductor with sufficiently reduced impurities is used for the channel formation region of the transistor, stable electrical characteristics can be given.

<<Other Semiconductor Materials>>

A semiconductor material that can be used for the oxide 230 is not limited to the above metal oxides. A semiconductor material that has a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered material include graphene, silicene, and a chalcogenide. A chalcogenide is a compound containing a chalcogen. Chalcogen is a general term of elements belonging to Group 16, which includes oxygen, sulfur, selenium, tellurium, polonium, and livermorium. Examples of chalcogenides include transition metal chalcogenides and chalcogenides of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

Application Example of Semiconductor Device

An example of the semiconductor device of one embodiment of the present invention will be described below with reference to FIG. 11.

Figure 11A:
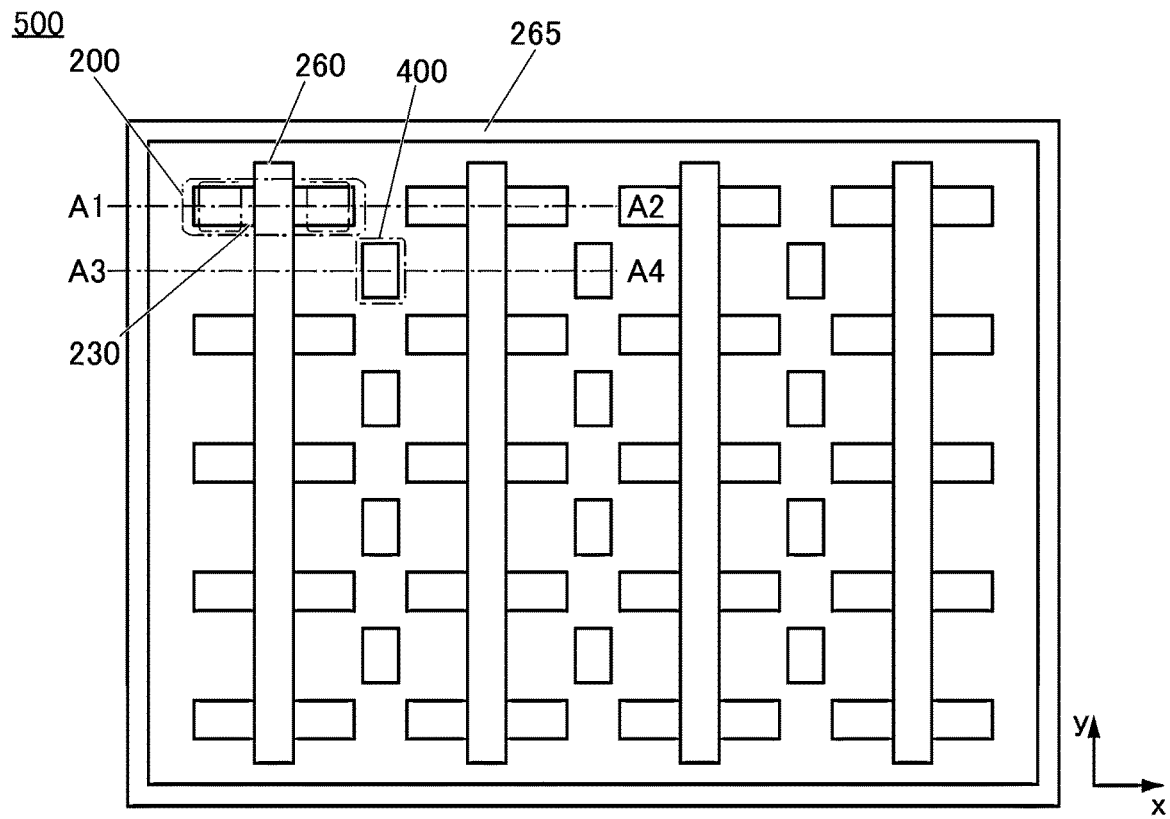
FIG. 11A is a top view of a semiconductor device of one embodiment of the present invention.
Figure 11B:
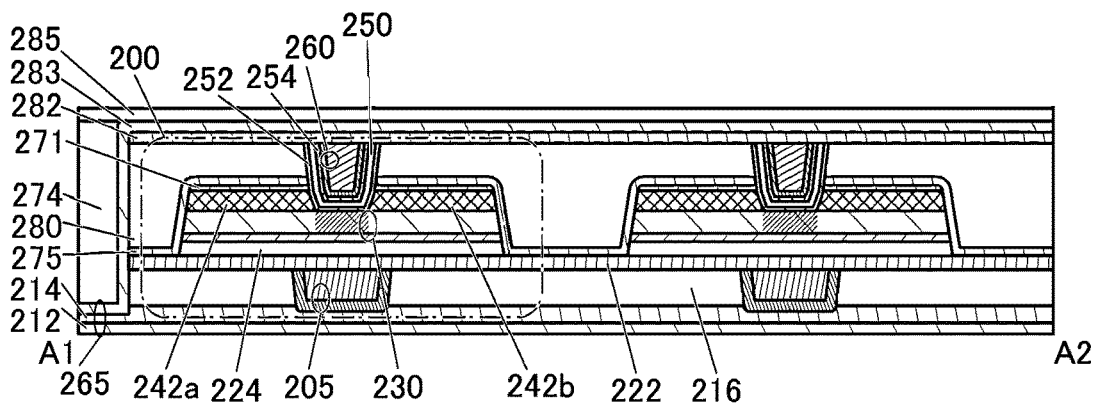
FIG. 11B and FIG. 11C are cross-sectional views of the semiconductor device of one embodiment of the present invention.
Figure 11C:
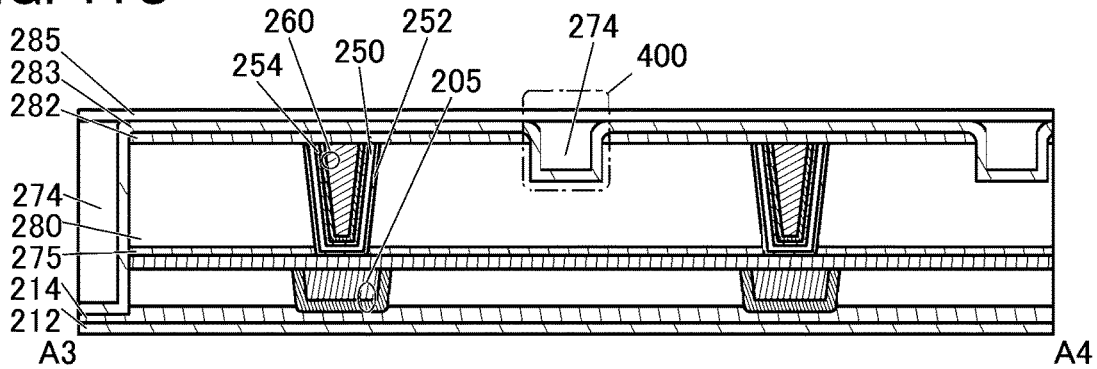
Figure 12A:
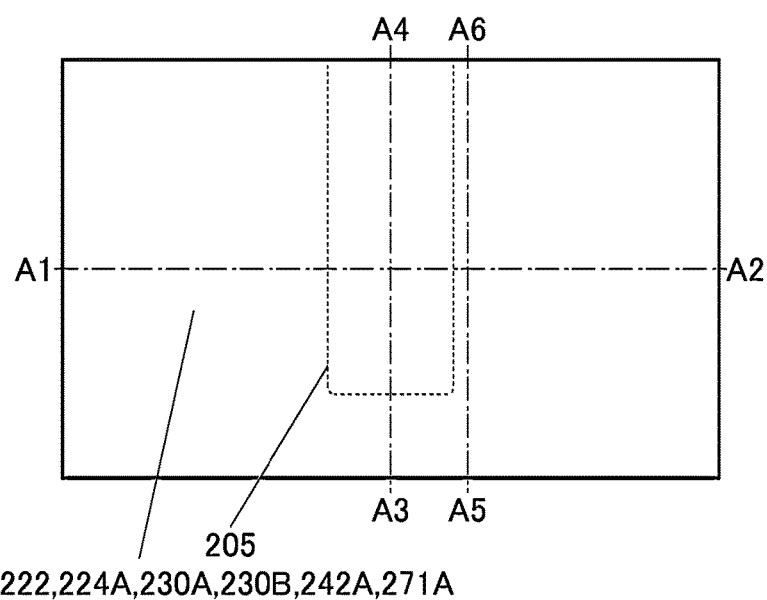
FIG. 12A is a top view showing a method for fabricating a semiconductor device of one embodiment of the present invention.
Figure 12C:
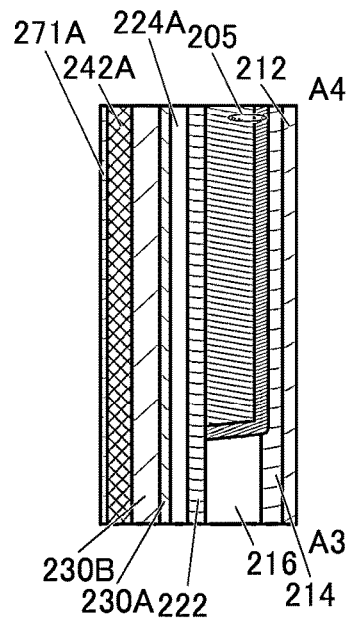
FIG. 12B to FIG. 12D are cross-sectional views showing the method for fabricating the semiconductor device of one embodiment of the present invention.
Figure 12B:
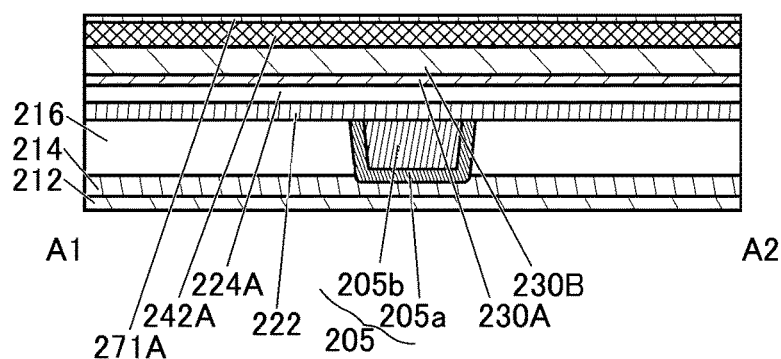
Figure 12D:
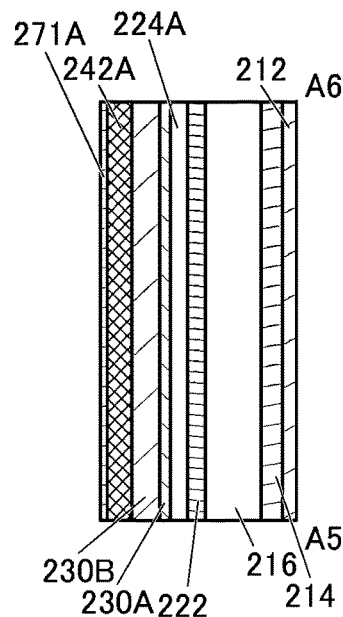

FIG. 11A is a top view of a semiconductor device 500. In FIG. 11A, the x-axis is parallel to the channel length direction of the transistor 200, and the y-axis is perpendicular to the x-axis. FIG. 11B is a cross-sectional view taken along the dashed-dotted line A1-A2 in FIG. 11A, which corresponds to a cross-sectional view in the channel length direction of the transistor 200. FIG. 11C is a cross-sectional view taken along the dashed-dotted line A3-A4 in FIG. 11A, which corresponds to a cross-sectional view of an opening region 400 and the vicinity thereof. Note that for clarity of the drawing, some components are omitted in the top view in FIG. 11A.

Note that in the semiconductor device illustrated in FIG. 11A to FIG. 11C, components having the same functions as the components in the semiconductor device described in <Structure example of semiconductor device> are denoted by the same reference numerals. Note that also in this section, the materials described in detail in <Structure example of semiconductor device> can be used as component materials of the semiconductor device.

The semiconductor device 500 illustrated in FIG. 11A to FIG. 11C is a variation example of the semiconductor device illustrated in FIG. 8A to FIG. 8D. The semiconductor device 500 illustrated in FIG. 11A to FIG. 11C is different from the semiconductor device in FIG. 8A to FIG. 8D in that the opening region 400 is formed in the insulator 282 and the insulator 280. Moreover, a sealing portion 265 is formed to surround a plurality of the transistors 200, which is a different point from the semiconductor device illustrated in FIG. 8A to FIG. 8D.

The semiconductor device 500 includes the plurality of transistors 200 and a plurality of the opening regions 400 arranged in a matrix. In addition, a plurality of the conductors 260 functioning as the gate electrodes of the transistors 200 are provided to extend in the y-axis direction. The opening regions 400 are formed in regions not overlapping with the oxide 230 or the conductor 260. The sealing portion 265 is formed so as to surround the plurality of transistors 200, the plurality of conductors 260, and the plurality of opening regions 400. Note that the number, the position, and the size of the transistors 200, the conductors 260, and the opening regions 400 are not limited to those illustrated in FIG. 11A to FIG. 11C and may be set as appropriate in accordance with the design of the semiconductor device 500.

As illustrated in FIG. 11B and FIG. 11C, the sealing portion 265 is provided to surround the plurality of transistors 200, the insulator 216, the insulator 222, the insulator 275, the insulator 280, and the insulator 282. In other words, the insulator 283 is provided to cover the insulator 216, the insulator 222, the insulator 275, the insulator 280, and the insulator 282. In the sealing portion 265, the insulator 283 is in contact with the top surface of the insulator 214. Over the sealing portion 265, the insulator 274 is provided between the insulator 283 and the insulator 285. The top surface of the insulator 274 is substantially level with the uppermost surface of the insulator 283. As the insulator 274, an insulator similar to the insulator 280 can be used.

Such a structure enables the plurality of transistors 200 to be surrounded (sealed) by the insulator 283, the insulator 214, and the insulator 212. One or more of the insulator 283, the insulator 214, and the insulator 212 preferably function as a barrier insulating film against hydrogen. In that case, hydrogen contained outside the region surrounded by the sealing portion 265 can be inhibited from entering the region surrounded by the sealing portion 265. The insulator 283, the insulator 214, and the insulator 212 having such a function are referred to as sealing films in some cases.

As illustrated in FIG. 11C, the insulator 282 in the opening region 400 has an opening portion. In the opening region 400, the insulator 280 may have a groove portion overlapping with the opening portion in the insulator 282. The depth of the groove portion of the insulator 280 is less than or equal to the depth at which the top surface of the insulator 275 is exposed and is, for example, approximately greater than or equal to ¼ and less than or equal to ½ of the maximum thickness of the insulator 280.

As illustrated in FIG. 11C, the insulator 283 inside the opening region 400 is in contact with the side surface of the insulator 282, the side surface of the insulator 280, and the top surface of the insulator 280. Part of the insulator 274 is formed in the opening region 400 to fill the depressed portion formed in the insulator 283, in some cases. At this time, the top surface of the insulator 274 formed in the opening region 400 is substantially level with the uppermost surface of the insulator 283, in some cases.

When heat treatment is performed in such a state that the opening region 400 is formed and the insulator 280 is exposed in the opening portion of the insulator 282, part of oxygen contained in the insulator 280 can be made to diffuse outwardly from the opening region 400 while oxygen is supplied to the oxide 230. This enables oxygen to be sufficiently supplied to the region functioning as the channel formation region and its vicinity in the oxide semiconductor from the insulator 280 containing oxygen to be released by heating, and also prevents an excess amount of oxygen from being supplied thereto.

At this time, hydrogen contained in the insulator 280 can be bonded to oxygen and released to the outside through the opening region 400. The hydrogen bonded to oxygen is released as water. Thus, the amount of hydrogen contained in the insulator 280 can be reduced, and hydrogen contained in the insulator 280 can be inhibited from entering the oxide 230.

In FIG. 11A, the shape of the opening region 400 in the top view is substantially rectangular; however, the present invention is not limited to the shape. For example, the shape of the opening region 400 in the top view can be a rectangular shape, an elliptical shape, a circular shape, a rhombus shape, or a shape obtained by combining any of these shapes. The area and arrangement interval of the opening regions 400 can be set as appropriate in accordance with the design of the semiconductor device including the transistor 200. For example, in the region where the density of the transistors 200 is low, the area of the opening region 400 may be increased or the arrangement interval of the opening regions 400 may be narrowed. For example, in the region where the density of the transistors 200 is high, the area of the opening region 400 may be decreased, or the arrangement interval of the opening regions 400 may be increased.

<Fabrication Method of Semiconductor Device>

Next, a method for fabricating the semiconductor device of one embodiment of the present invention illustrated in FIG. 8A to FIG. 8D is described with reference to FIG. 12A to FIG. 17D.

Note that A of each drawing is a top view. Moreover, B of each drawing is a cross-sectional view corresponding to a portion indicated by the dashed-dotted line A1-A2 in A of each drawing, and is also a cross-sectional view in the channel length direction of the transistor 200. Furthermore, C of each drawing is a cross-sectional view corresponding to a portion indicated by the dashed-dotted line A3-A4 in A of each drawing, and is also a cross-sectional view in the channel width direction of the transistor 200. Furthermore, D of each drawing is a cross-sectional view of a portion indicated by the dashed-dotted line A5-A6 in A of each drawing. Note that for clarity of the drawing, some components are not illustrated in the top view of A of each drawing.

Hereinafter, an insulating material for forming an insulator, a conductive material for forming a conductor, or a semiconductor material for forming a semiconductor can be deposited by a sputtering method, a CVD method, an MBE method, a PLD method, an ALD method, or the like as appropriate.

Examples of the sputtering method include an RF sputtering method in which a high-frequency power source is used as a sputtering power source, a DC sputtering method in which a DC power source is used, and a pulsed DC sputtering method in which a voltage applied to an electrode is changed in a pulsed manner. An RF sputtering method is mainly used in the case where an insulating film is deposited, and a DC sputtering method is mainly used in the case where a metal conductive film is deposited. The pulsed DC sputtering method is mainly used in the case where a compound such as an oxide, a nitride, or a carbide is deposited by a reactive sputtering method.

Note that the CVD method can be classified into a plasma CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

A high-quality film can be obtained at a relatively low temperature by a plasma enhanced CVD method. Furthermore, a thermal CVD method is a deposition method that does not use plasma and thus causes less plasma damage to an object to be processed. For example, a wiring, an electrode, an element (a transistor, a capacitor, or the like), or the like included in a semiconductor device might be charged up by receiving electric charge from plasma. In this case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As an ALD method, a thermal ALD method, in which a precursor and a reactant react with each other only by a thermal energy, a PEALD method, in which a reactant excited by plasma is used, or the like can be used.

A CVD method and an ALD method are different from a sputtering method in which particles ejected from a target or the like are deposited. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

By a CVD method, a film with a certain composition can be deposited depending on the flow rate ratio of the source gases. For example, by a CVD method, by changing the flow rate ratio of the source gases during the deposition, a film in which the composition is continuously changed can be deposited. In the case where the film is deposited while the flow rate ratio of the source gases is changed, as compared to the case where the film is deposited using a plurality of deposition chambers, the time taken for the deposition can be shortened because the time taken for transfer or pressure adjustment is not required. Thus, the productivity of the semiconductor device can be increased in some cases.

In an ALD method, a film with a freely selected composition can be deposited by concurrently introducing different kinds of precursors. In the case where different kinds of precursors are introduced, a film with a freely selected composition can be deposited by controlling the cycle number of each of the precursors.

First, a substrate (not illustrated) is prepared, and the insulator 212 is deposited over the substrate (see FIG. 12A to FIG. 12D). The insulator 212 is preferably deposited by a sputtering method. By using a sputtering method, which does not need to use a molecule containing hydrogen as a deposition gas, the hydrogen concentration in the insulator 212 can be reduced. Without limitation to a sputtering method, the insulator 212 may be deposited by a CVD method, an MBE method, a PLD method, an ALD method, or the like as appropriate. In this embodiment, for the insulator 212, silicon nitride is deposited by a pulsed DC sputtering method using a silicon target in an atmosphere containing a nitrogen gas.

The use of an insulator through which impurities such as water and hydrogen are less likely to pass, such as silicon nitride, can inhibit diffusion of impurities such as water and hydrogen contained in a layer below the insulator 212. When an insulator through which copper is less likely to pass, such as silicon nitride, is used for the insulator 212, even in the case where a metal that is likely to diffuse, such as copper, is used for a conductor in a layer (not illustrated) below the insulator 212, upward diffusion of the metal through the insulator 212 can be inhibited.

Next, the insulator 214 is deposited over the insulator 212 (see FIG. 12A to FIG. 12D). The insulator 214 is preferably deposited by a sputtering method. By using a sputtering method, which does not need to use a molecule containing hydrogen as a deposition gas, the hydrogen concentration in the insulator 214 can be reduced. Without limitation to a sputtering method, the insulator 214 may be deposited by a CVD method, an MBE method, a PLD method, an ALD method, or the like as appropriate. In this embodiment, for the insulator 214, aluminum oxide is deposited by a pulsed DC sputtering method using an aluminum target in an atmosphere containing an oxygen gas.

A metal oxide having an amorphous structure and high capability of capturing or fixing hydrogen, such as aluminum oxide, is preferably used for the insulator 214. In this case, the insulator 214 captures or fixes hydrogen contained in the insulator 216 and the like and prevents the hydrogen from diffusing into the oxide 230. In particular, it is preferable to use aluminum oxide having an amorphous structure or amorphous aluminum oxide for the insulator 214, in which case hydrogen can sometimes be captured or fixed more effectively. Accordingly, the transistor 200 and a semiconductor device which have favorable characteristics and high reliability can be fabricated.

Next, the insulator 216 is deposited over the insulator 214. The insulator 216 is preferably deposited by a sputtering method. By using a sputtering method, which does not need to use a molecule containing hydrogen as a deposition gas, the hydrogen concentration in the insulator 216 can be reduced. Without limitation to a sputtering method, the insulator 216 may be deposited by a CVD method, an MBE method, a PLD method, an ALD method, or the like as appropriate. In this embodiment, for the insulator 216, silicon oxide is deposited by a pulsed DC sputtering method using a silicon target in an atmosphere containing an oxygen gas.

The insulator 212, the insulator 214, and the insulator 216 are preferably successively deposited without exposure to the air. For example, a multi-chamber deposition apparatus is used. As a result, the amounts of hydrogen in the deposited insulator 212, insulator 214, and insulator 216 can be reduced, and furthermore, entry of hydrogen into the films in intervals between deposition steps can be inhibited.

Then, an opening reaching the insulator 214 is formed in the insulator 216. Examples of the opening include a groove and a slit. A region where an opening is formed is referred to as an opening portion in some cases. Wet etching can be used for the formation of the opening; however, use of dry etching is preferable for microfabrication. As the insulator 214, it is preferable to select an insulator that functions as an etching stopper film used in forming the groove by etching the insulator 216. For example, in the case where silicon oxide or silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the conductor 205a is deposited. The conductive film desirably includes a conductor having a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be deposited by a sputtering method, a CVD method, an MBE method, a PLD method, an ALD method, or the like.

In this embodiment, titanium nitride is deposited as the conductive film to be the conductor 205a. When such a metal nitride is used for a layer under the conductor 205b, oxidation of the conductor 205b by the insulator 216 or the like can be inhibited. Furthermore, even when a metal that is likely to diffuse, such as copper, is used for the conductor 205b, the metal can be prevented from diffusing to the outside through the conductor 205a.

Next, a conductive film to be the conductor 205b is deposited. Tantalum, tungsten, titanium, molybdenum, aluminum, copper, a molybdenum-tungsten alloy, or the like can be used for the conductive film. The conductive film can be deposited by a plating method, a sputtering method, a CVD method, an MBE method, a PLD method, an ALD method, or the like. In this embodiment, tungsten is deposited for the conductive film.

Next, by performing CMP treatment, the conductive film to be the conductor 205a and the conductive film to be the conductor 205b are partly removed to expose the insulator 216 (see FIG. 12A to FIG. 12D). As a result, the conductor 205a and the conductor 205b remain only in the opening portion. Note that the insulator 216 is partly removed by the CMP treatment in some cases.

Next, the insulator 222 is deposited over the insulator 216 and the conductor 205 (see FIG. 12A to FIG. 12D). An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. Alternatively, hafnium zirconium oxide is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like. In this embodiment, for the insulator 222, hafnium oxide is deposited by an ALD method.

Subsequently, heat treatment is preferably performed. The heat treatment is performed at higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure.

Alternatively, the heat treatment may be performed in the following manner: heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment performed using a highly purified gas can prevent entry of moisture or the like into the insulator 222 and the like as much as possible.

Next, an insulating film 224A is deposited over the insulator 222 (see FIG. 12A to FIG. 12D). The insulating film 224A can be deposited by a sputtering method, a CVD method, an MBE method, a PLD method, an ALD method, or the like. In this embodiment, for the insulating film 224A, silicon oxide is deposited by a sputtering method. By using a sputtering method, which does not need to use a molecule containing hydrogen as a deposition gas, the hydrogen concentration in the insulating film 224A can be reduced. The hydrogen concentration in the insulating film 224A is preferably reduced because the insulating film 224A is in contact with the oxide 230a in a later step.

Next, an oxide film 230A and an oxide film 230B are deposited in this order over the insulating film 224A (see FIG. 12A to FIG. 12D). Note that it is preferable to deposit the oxide film 230A and the oxide film 230B successively without exposure to the air. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like. In this embodiment, the oxide film 230A and the oxide film 230B are deposited by a sputtering method.

For example, in the case where the oxide film 230A and the oxide film 230B are deposited by a sputtering method, oxygen or a mixed gas of oxygen and a noble gas is used as a sputtering gas. Increasing the proportion of oxygen contained in the sputtering gas can increase the amount of excess oxygen in the oxide films to be deposited. In the case where the oxide films are deposited by a sputtering method, the above In-M-Zn oxide target or the like can be used.

In particular, when the oxide film 230A is deposited, part of oxygen contained in the sputtering gas is supplied to the insulating film 224A in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor including an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor including an oxygen-deficient oxide semiconductor for its channel formation region, a relatively high field-effect mobility can be obtained. Furthermore, when the deposition is performed while the substrate is being heated, the crystallinity of the oxide film can be improved.

In this embodiment, the oxide film 230A is deposited by a sputtering method using an oxide target with In:Ga:Zn=1:3:4 [atomic ratio]. In addition, the oxide film 230B is deposited by a sputtering method using an oxide target with In:Ga:Zn=4:2:4.1 [atomic ratio], an oxide target with In:Ga:Zn=1:1:1 [atomic ratio], or an oxide target with In:Ga:Zn=1:1:2 [atomic ratio]. Note that the oxide films are preferably formed so as to have characteristics required for the oxide 230a and the oxide 230b by selecting the deposition conditions and the atomic ratios as appropriate.

It is preferable that the insulating film 224A, the oxide film 230A, and the oxide film 230B be successively deposited by a sputtering method without exposure to the air. For example, a multi-chamber deposition apparatus is used. As a result, entry of hydrogen into the insulating film 224A, the oxide film 230A, and the oxide film 230B in intervals between deposition steps can be inhibited.

The oxide film 230A and the oxide film 230B may be formed by an ALD method. A deposition method of the oxide film 230A and the oxide film 230B with an ALD method is described here. Note that the above embodiment also describes the deposition method using an ALD method; thus, different parts are mainly described, and for the common parts, the description in the above embodiment can be referred to.

An In-M-Zn oxide that can be used for the oxide film 230A and the oxide film 230B tends to have a layered crystal structure in which a layer containing indium (In) and oxygen (hereinafter, In layer) and a layer containing the element M, zinc (Zn), and oxygen (hereinafter, (M,Zn) layer) are stacked. The number of (M,Zn) layers provided between two In layers correlates with the composition of the In-M-Zn oxide. For example, when the composition is In:M:Zn=1:1:m, the number of (M,Zn) layers provided between two In layers tends to be (m+1).

Figure 6C:
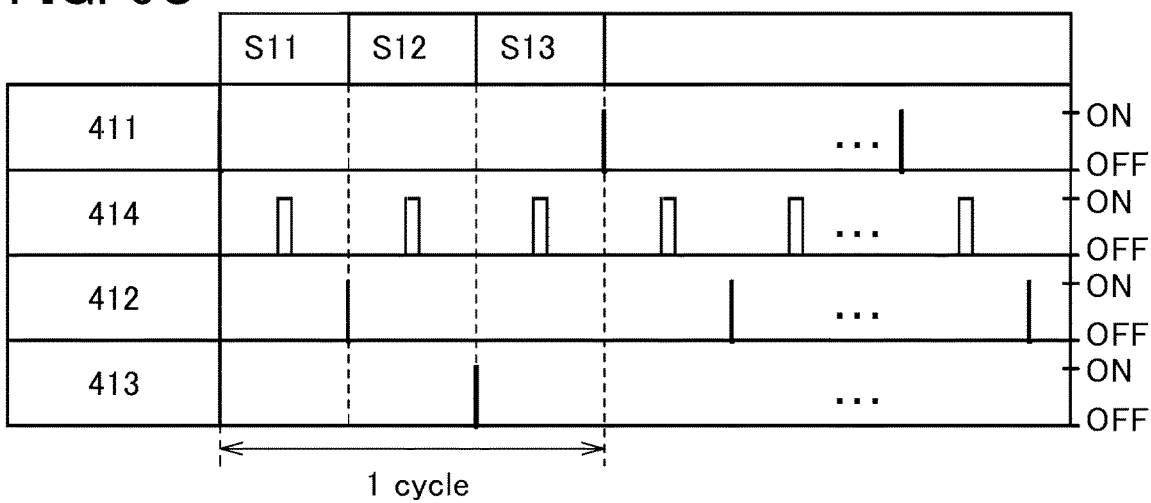
FIG. 6C is a diagram showing a deposition sequence of an oxide.

As another example of the deposition method of the oxide film 230A and the oxide film 230B by an ALD method, a deposition method of an In-M-Zn oxide is described with reference to FIG. 6C. FIG. 6C shows an example of a deposition sequence using a precursor 411 to a precursor 413 and an oxidizing gas 414. Note that the deposition sequence includes Step S11 to Step S13.

A precursor containing indium can be used as the precursor 411. A precursor containing the element M can be used as the precursor 412. A precursor containing zinc can be used as the precursor 413. Note that each of the precursor 411 to the precursor 413 may be an inorganic precursor or an organic precursor. As the oxidizing gas 414, a gas that can be used for the oxidizing gas described in the above embodiment can be used.

First, Step S11 is performed. In Step S11, a step of introducing the precursor 411 so that the precursor containing indium is adsorbed on a formation surface, a step of stopping the introduction of the precursor 411 and purging the excess precursor 411 in the chamber, a step of introducing the oxidizing gas 414 to oxidize the precursor 411 so that an In layer is formed, and a step of stopping the introduction of the oxidizing gas 414 and purging the excess oxidizing gas 414 in the chamber are performed in this order.

Next, Step S12 is performed. In Step S12, a step of introducing the precursor 412 so that the precursor containing the element M is adsorbed on a surface of the In layer, a step of stopping the introduction of the precursor 413 and purging the excess precursor 412 in the chamber, a step of introducing the oxidizing gas 414 to oxidize the precursor 412 so that a layer containing the element M and oxygen (hereinafter referred to as an M layer) is formed, and a step of stopping the oxidizing gas 414 and purging the excess oxidizing gas 414 in the chamber are performed in this order.

Next, Step S13 is performed. In Step S13, a step of introducing the precursor 413 so that the precursor containing zinc is adsorbed on a surface of the M layer, a step of stopping the introduction of the precursor 413 and purging the excess precursor 413 in the chamber, a step of introducing the oxidizing gas 414 to oxidize the precursor 413 so that a layer containing zinc (Zn) and oxygen (hereinafter referred to as a Zn layer) is formed, and a step of stopping the introduction of the oxidizing gas 414 and purging the excess oxidizing gas 414 in the chamber are performed in this order.

Step S11 to Step S13 are defined as one cycle and the cycle is repeated, so that an In-M-Zn oxide with a desired thickness can be formed. Note that the element M or Zn enters the In layer in some cases by heat treatment during deposition or after deposition. In or Zn enters the M layer in some cases. In or Ga enters the Zn layer in some cases.

The number of times each of Step S11 to Step S13 is performed in one cycle is not limited to one. The number of times each of Step S11 to Step S13 is performed in one cycle is preferably determined so that an In-M-Zn oxide with a desired composition can be obtained. For example, in the case where an In-M-Zn oxide with In:M:Zn=1:1:2 [atomic ratio] is deposited, it is preferable that Step S11, Step S13, Step S12, and Step S13 be defined as one cycle and the cycle be repeated. For another example, In—Zn oxide can be deposited by repeating a cycle composed of Step S11 and Step S12. The precursor 413 may be introduced at the same time in the step of introducing the precursor 412 in Step S12, in which case an (M,Zn) layer is formed in Step S12. The precursor 412 or the precursor 413 may be introduced at the same time in the step of introducing the precursor 411 in Step S11, in which case an In layer containing the element M or Zn is formed in Step S11. By combining the above as appropriate, the desired oxide film 230A and the desired oxide film 230B can be deposited.

For a manufacturing apparatus used for deposition by an ALD method, the description in the above embodiment can be referred to. When the oxide film 230A, the oxide film 230B, and the ferroelectric layer are deposited by an ALD method, the manufacturing apparatus can be shared. Furthermore, in the case where the element illustrated in FIG. 7B2 is fabricated, the insulator 130 can be deposited successively over the oxide film 230B by switching the precursor and the oxidizing gas after the deposition of the oxide film 230A and the oxide film 230B. Thus, the oxide film 230B and the insulator 130 can be deposited without exposure to the air, and the vicinity of the interface between the oxide film 230B and the insulator 130 can be kept clean.

Two or more manufacturing apparatuses used for deposition by the ALD method may be incorporated in a multichamber deposition apparatus. In that case, for example, the deposition apparatus is set so that the ferroelectric layer is deposited in a manufacturing apparatus different from that for depositing the oxide film 230A and the oxide film 230B. This makes it possible to deposit the ferroelectric layer and the oxide film 230A and the oxide film 230B successively without a switch of the precursor and the oxidizing gas.

Next, heat treatment is preferably performed. The heat treatment can be performed in a temperature range where the oxide film 230A and the oxide film 230B do not become polycrystals, i.e., at higher than or equal to 250° C. and lower than or equal to 650° C., preferably higher than or equal to 400° C. and lower than or equal to 600° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in the following manner: heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment performed using a highly purified gas can prevent entry of moisture or the like into the oxide film 230A, the oxide film 230B, and the like as much as possible.

By performing heat treatment, hydrogen in the insulator 216, the insulating film 224A, the oxide film 230A, and the oxide film 230B moves into the insulator 222 and is absorbed by the insulator 222. In other words, hydrogen in the insulator 216, the insulating film 224A, the oxide film 230A, and the oxide film 230B diffuses into the insulator 222. Accordingly, the hydrogen concentration in the insulator 222 increases, and the hydrogen concentrations in the insulator 216, the insulating film 224A, the oxide film 230A, and the oxide film 230B decrease.

In particular, the insulating film 224A functions as a gate insulator of the transistor 200, and the oxide film 230A and the oxide film 230B function as a channel formation region of the transistor 200. Thus, the transistor 200 preferably includes the insulating film 224A, the oxide film 230A, and the oxide film 230B with reduced hydrogen concentrations to have favorable reliability.

Next, a conductive film 242A is deposited over the oxide film 230B (see FIG. 12A to FIG. 12D). The conductive film 242A can be deposited by a sputtering method, a CVD method, an MBE method, a PLD method, an ALD method, or the like. For example, for the conductive film 242A, tantalum nitride is deposited by a sputtering method. Note that heat treatment may be performed before the deposition of the conductive film 242A. This heat treatment may be performed under reduced pressure, and the conductive film 242A may be successively deposited without exposure to the air. The treatment can remove moisture and hydrogen adsorbed onto a surface of the oxide film 230B, and further can reduce the moisture concentrations and the hydrogen concentrations in the oxide film 230A and the oxide film 230B. The temperature of the heat treatment is preferably higher than or equal to 100° C. and lower than or equal to 400° C. In this embodiment, the temperature of the heat treatment is 200° C.

Next, an insulating film 271A is deposited over the conductive film 242A (see FIG. 12A to FIG. 12D). The insulating film 271A can be deposited by a sputtering method, a CVD method, an MBE method, a PLD method, an ALD method, or the like. As the insulating film 271A, an insulating film having a function of inhibiting passage of oxygen is preferably used. For example, for the insulating film 271A, aluminum oxide or silicon nitride may be deposited by a sputtering method.

It is preferable that the conductive film 242A and the insulating film 271A be successively deposited by a sputtering method without exposure to the air. For example, a multi-chamber deposition apparatus is used. As a result, the amounts of hydrogen in the conductive film 242A and the insulating film 271A can be reduced, and furthermore, entry of hydrogen into the films in intervals between deposition steps can be inhibited. In the case where a hard mask is provided over the insulating film 271A, a film to be the hard mask is successively deposited without exposure to the air.

Next, the insulating film 224A, the oxide film 230A, the oxide film 230B, the conductive film 242A, and the insulating film 271A are processed into island shapes by a lithography method to form the insulator 224, the oxide 230a, the oxide 230b, a conductive layer 242B, and an insulating layer 271B (see FIG. 13A to FIG. 13D). Here, the insulator 224, the oxide 230a, the oxide 230b, the conductive layer 242B, and the insulating layer 271B are formed to at least partly overlap with the conductor 205. A dry etching method or a wet etching method can be used for the processing. Processing by a dry etching method is suitable for microfabrication. The insulating film 224A, the oxide film 230A, the oxide film 230B, the conductive film 242A, and the insulating film 271A may be processed under different conditions.

Note that in the lithography method, first, a resist is exposed to light through a mask. Next, a region exposed to light is removed or left using a developing solution, so that a resist mask is formed. Then, etching process through the resist mask is conducted, whereby a conductor, a semiconductor, an insulator, or the like can be processed into a desired shape. The resist mask may be formed through, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with a liquid (e.g., water) in light exposure. Alternatively, an electron beam or an ion beam may be used instead of the light. Note that a mask is unnecessary in the case of using an electron beam or an ion beam. Note that the resist mask can be removed by a dry etching process such as ashing, a wet etching process, a wet etching process after a dry etching process, or a dry etching process after a wet etching process.

In addition, a hard mask formed of an insulator or a conductor may be used under the resist mask. In the case of using a hard mask, a hard mask with a desired shape can be formed in the following manner: an insulating film or a conductive film that is the material of the hard mask is formed over the conductive film 242A, a resist mask is formed thereover, and then the hard mask material is etched. The etching of the conductive film 242A and the like may be performed after removing the resist mask or with the resist mask remaining. In the latter case, the resist mask sometimes disappears during the etching. The hard mask may be removed by etching after the etching of the conductive film 242A and the like. Meanwhile, the hard mask is not necessarily removed when the hard mask material does not affect later steps or can be utilized in later steps. In this embodiment, the insulating layer 271B is used as a hard mask.

Figure 13A:
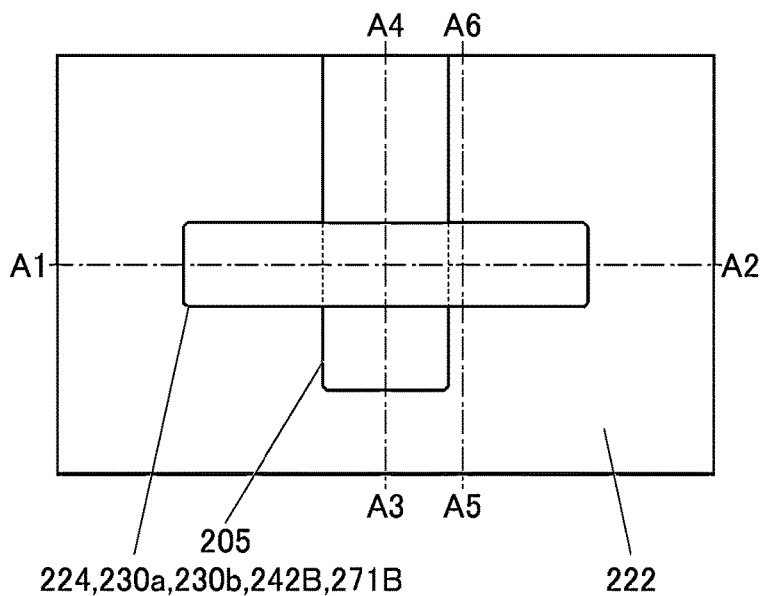
FIG. 13A is a top view showing a method for fabricating a semiconductor device of one embodiment of the present invention.
Figure 13C:
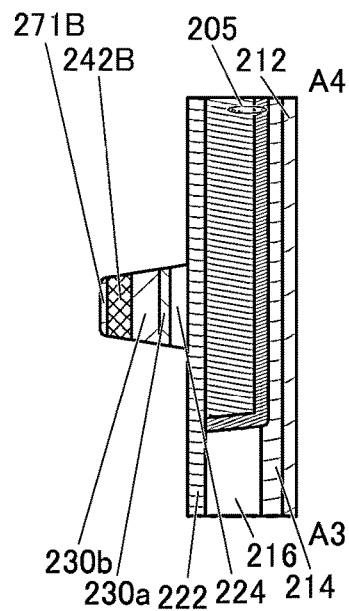
FIG. 13B to FIG. 13D are cross-sectional views showing the method for fabricating the semiconductor device of one embodiment of the present invention.
Figure 13B:
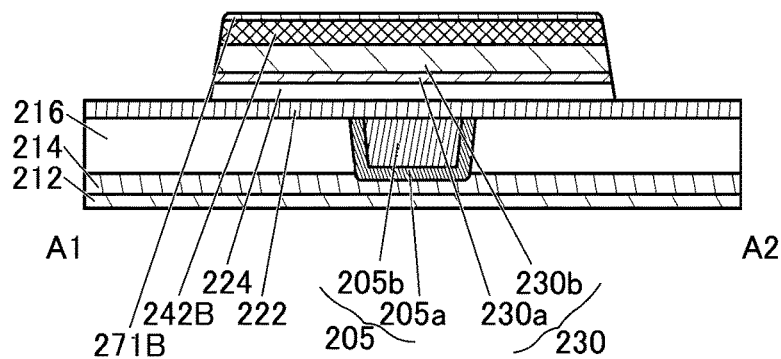
Figure 13D:
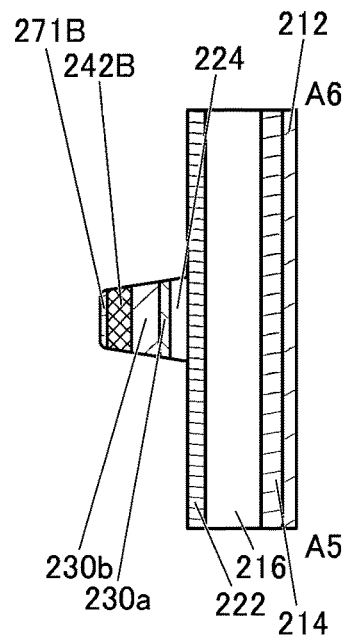

Here, the insulating layer 271B functions as a mask for the conductive layer 242B; thus, as illustrated in FIG. 13B to FIG. 13D, the conductive layer 242B does not have a curved surface between the side surface and the top surface. Thus, end portions at the intersections of the side surfaces and the top surfaces of the conductor 242a and the conductor 242b illustrated in FIG. 8B and FIG. 8D are angular. The cross-sectional area of the conductor 242 in the case where the end portion at the intersection of the side surface and the top surface of the conductor 242 is angular is larger than that in the case where the end portion has a curved surface. Accordingly, the resistance of the conductor 242 is reduced, so that the on-state current of the transistor 200 can be increased.

Furthermore, as illustrated in FIG. 13B to FIG. 13D, the side surfaces of the insulator 224, the oxide 230a, the oxide 230b, the conductive layer 242B, and the insulating layer 271B may have tapered shapes. In this specification and the like, a tapered shape indicates a shape in which at least part of a side surface of a structure is inclined to a substrate surface. For example, the angle formed between the inclined side surface and the substrate surface (hereinafter, sometimes referred to as a taper angle) is preferably less than 90°. Each of the insulator 224, the oxide 230a, the oxide 230b, the conductive layer 242B, and the insulating layer 271B may have a taper angle greater than or equal to 60° and less than 90°. With such tapered shapes of the side surfaces, the coverage with the insulator 275 and the like can be improved in a later step, so that defects such as a void can be reduced.

Not being limited to the above, the insulator 224, the oxide 230a, the oxide 230b, the conductive layer 242B, and the insulating layer 271B may be processed to have side surfaces that are substantially perpendicular to the top surface of the insulator 222. With such a structure, the plurality of transistors 200 can be provided with a high density in a small area.

A by-product generated in the above etching step is sometimes formed in a layered manner on the side surfaces of the insulator 224, the oxide 230a, the oxide 230b, the conductive layer 242B, and the insulating layer 271B. In this case, the layered by-product is formed between the insulator 275, and the insulator 224, the oxide 230a, the oxide 230b, the conductive layer 242B, and the insulating layer 271B. Hence, the layered by-product formed in contact with the top surface of the insulator 222 is preferably removed.

Next, the insulator 275 is deposited to cover the insulator 224, the oxide 230a, the oxide 230b, the conductive layer 242B, and the insulating layer 271B. Here, it is preferable that the insulator 275 be in close contact with the top surface of the insulator 222 and the side surface of the insulator 224. The insulator 275 can be deposited by a sputtering method, a CVD method, an MBE method, a PLD method, an ALD method, or the like. The insulator 275 is preferably formed using an insulating film having a function of inhibiting passage of oxygen. For example, as the insulator 275, aluminum oxide may be deposited by a sputtering method, and silicon nitride may be deposited thereover by a PEALD method. When the insulator 275 has such a stacked-layer structure, the function of inhibiting diffusion of oxygen and impurities such as water and hydrogen is improved in some cases.

In this manner, the oxide 230a, the oxide 230b, and the conductive layer 242B can be covered with the insulator 275 and the insulating layer 271B, which have a function of inhibiting diffusion of oxygen. This structure can suppress direct diffusion of oxygen from the insulator 280 or the like into the insulator 224, the oxide 230a, the oxide 230b, and the conductive layer 242B in a later step.

Next, an insulating film to be the insulator 280 is deposited over the insulator 275. The insulating film can be deposited by a sputtering method, a CVD method, an MBE method, a PLD method, an ALD method, or the like. A silicon oxide film may be deposited by a sputtering method as the insulating film, for example. When the insulating film is deposited by a sputtering method in an oxygen-containing atmosphere, the insulator 280 containing excess oxygen can be formed. By using a sputtering method, which does not need to use a molecule containing hydrogen as a deposition gas, the hydrogen concentration in the insulator 280 can be reduced. Note that heat treatment may be performed before the insulating film is deposited. The heat treatment may be performed under reduced pressure, and the insulating film may be successively deposited without exposure to the air. The treatment can remove moisture and hydrogen adsorbed onto a surface of the insulator 275 and the like, and further can reduce the moisture concentrations and the hydrogen concentrations in the oxide 230a, the oxide 230b, and the insulator 224. For the heat treatment, the above heat treatment conditions can be used.

For example, the insulator 280 may have a stacked-layer structure of silicon oxide deposited by a sputtering method and silicon oxynitride deposited thereover by a CVD method. Furthermore, silicon nitride may be stacked thereover.

Next, the insulating film to be the insulator 280 is subjected to CMP treatment, so that the insulator 280 with a flat top surface is formed. Note that, for example, silicon nitride may be deposited over the insulator 280 by a sputtering method and CMP treatment may be performed on the silicon nitride until the insulator 280 is reached.

Then, part of the insulator 280, part of the insulator 275, part of the insulating layer 271B, and part of the conductive layer 242B are processed to form an opening reaching the oxide 230b. The opening is preferably formed to overlap with the conductor 205. The insulator 271a, the insulator 271b, the conductor 242a, and the conductor 242b are formed through the formation of the opening (see FIG. 14A to FIG. 14D).

Figure 14A:
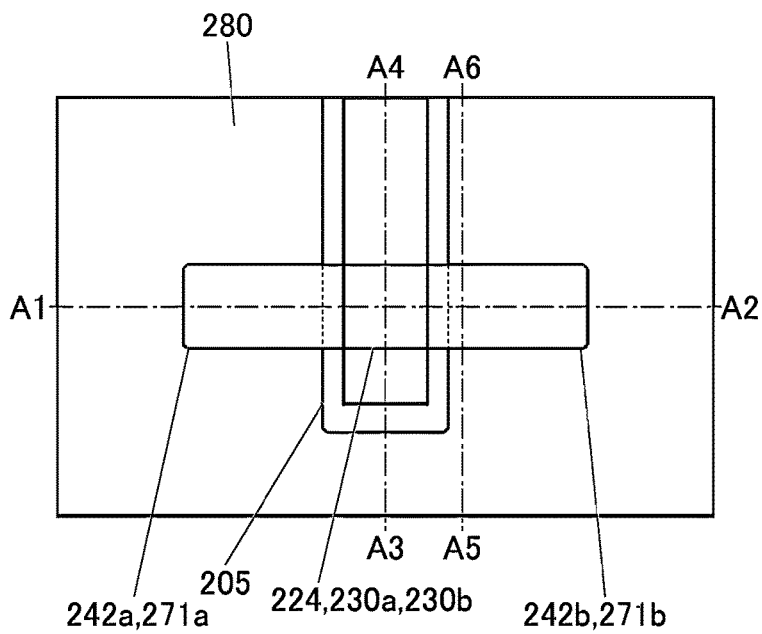
FIG. 14A is a top view showing a method for fabricating a semiconductor device of one embodiment of the present invention.
Figure 14C:
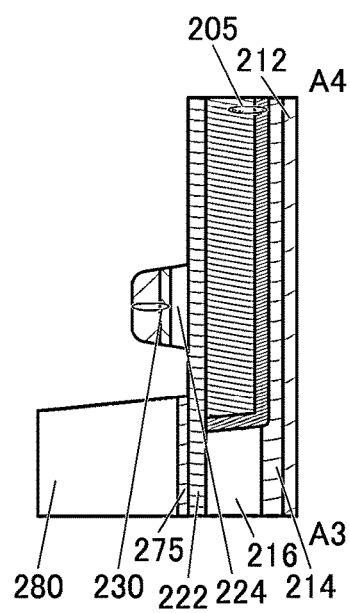
FIG. 14B to FIG. 14D are cross-sectional views showing the method for fabricating the semiconductor device of one embodiment of the present invention.
Figure 14B:
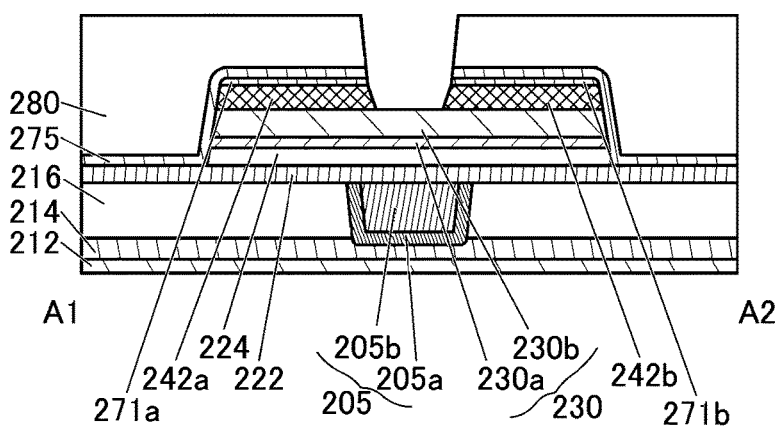
Figure 14D:
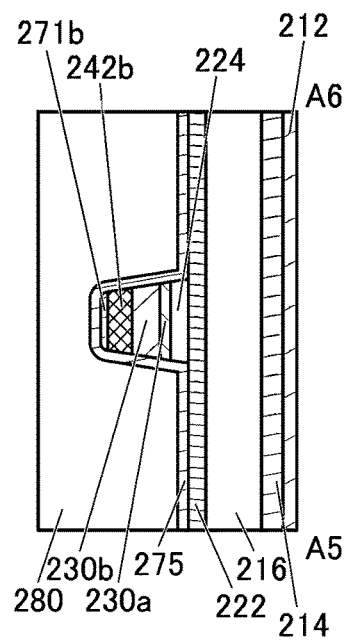

As illustrated in FIG. 14B and FIG. 14C, the side surfaces of the insulator 280, the insulator 275, the insulator 271, and the conductor 242 may be tapered. The taper angle of the insulator 280 is larger than that of the conductor 242 in some cases. Although not illustrated in FIG. 14A to FIG. 14C, the upper portion of the oxide 230b is sometimes removed when the opening is formed.

The part of the insulator 280, the part of the insulator 275, the part of the insulating layer 271B, and the part of the conductive layer 242B can be processed by a dry etching method or a wet etching method. Processing by a dry etching method is suitable for microfabrication. The processing may be performed under different conditions. For example, the part of the insulator 280 may be processed by a dry etching method, the part of the insulator 275 and the part of the insulating layer 271B may be processed by a wet etching method, and the part of the conductive layer 242B may be processed by a dry etching method.

Here, impurities might be attached onto the side surface of the oxide 230a, the top surface and the side surface of the oxide 230b, the side surface of the conductor 242, the side surface of the insulator 280, and the like or the impurities might be diffused thereinto. A step of removing the impurities may be performed. In addition, a damaged region might be formed on the surface of the oxide 230b by the above dry etching. The damaged region may be removed. The impurities come from components contained in the insulator 280, the insulator 275, part of the insulating layer 271B, and the conductive layer 242B; components contained in a member of an apparatus used to form the opening; and components contained in a gas or a liquid used for etching, for instance. Examples of the impurities include hafnium, aluminum, silicon, tantalum, fluorine, and chlorine.

In particular, an impurity such as aluminum or silicon hinders the oxide 230b from becoming a CAAC-OS. It is thus preferable to reduce or remove an impurity element such as aluminum or silicon, which hinders the oxide from becoming a CAAC-OS. For example, the concentration of aluminum atoms in the oxide 230b and in the vicinity thereof is lower than or equal to 5.0 atomic %, preferably lower than or equal to 2.0 atomic %, further preferably lower than or equal to 1.5 atomic %, still further preferably lower than or equal to 1.0 atomic %, and yet further preferably lower than 0.3 atomic %.

Note that in a metal oxide, a region that is hindered from becoming a CAAC-OS by an impurity such as aluminum or silicon and becomes an amorphous-like oxide semiconductor (a-like OS) is referred to as a non-CAAC region in some cases. In the non-CAAC region, the density of the crystal structure is reduced to increase VOH; thus, the transistor is likely to be normally on. Hence, the non-CAAC region in the oxide 230b is preferably reduced or removed.

In contrast, the oxide 230b preferably has a layered CAAC structure. In particular, the CAAC structure preferably reaches a lower edge portion of a drain in the oxide 230b. Here, in the transistor 200, the conductor 242a or the conductor 242b, and its vicinity function as a drain. In other words, the oxide 230b in the vicinity of the lower edge portion of the conductor 242a (conductor 242b) preferably has a CAAC structure. In this manner, the damaged region of the oxide 230b is removed and the CAAC structure is formed also in the edge portion of the drain, which significantly affects the drain breakdown voltage, so that a variation in the electrical characteristics of the transistor 200 can be further suppressed. In addition, the reliability of the transistor 200 can be improved.

In order to remove impurities and the like attached to the surface of the oxide 230b in the above etching step, cleaning treatment is performed. Examples of the cleaning method include wet cleaning using a cleaning solution or the like (also can be referred to as wet etching process), plasma treatment using plasma, and cleaning by heat treatment, and any of these cleanings may be performed in combination as appropriate. Note that the cleaning treatment sometimes makes the groove portion deeper.

The wet cleaning may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Alternatively, such cleaning methods may be performed in combination as appropriate.

Note that in this specification and the like, in some cases, an aqueous solution in which hydrofluoric acid is diluted with pure water is referred to as diluted hydrofluoric acid, and an aqueous solution in which ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid is higher than or equal to 0.01 ppm and lower than or equal to 100 ppm, preferably higher than or equal to 0.1 ppm and lower than or equal to 10 ppm.

For the ultrasonic cleaning, a frequency higher than or equal to 200 kHz is preferable, and a frequency higher than or equal to 900 kHz is further preferable. Damage to the oxide 230*b* and the like can be reduced when such a frequency is used.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water.

As the cleaning treatment in this embodiment, wet cleaning is performed using diluted ammonia water. The cleaning treatment can remove impurities that are attached onto the surfaces of the oxide 230*a*, the oxide 230*b*, and the like or diffused into the oxide 230*a*, the oxide 230*b*, and the like. Furthermore, the crystallinity of the oxide 230*b* can be increased.

After the etching or the cleaning treatment, heat treatment may be performed. The heat treatment is performed at higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230*a* and the oxide 230*b* to reduce oxygen vacancies. In addition, the crystallinity of the oxide 230*b* can be improved by the heat treatment. The heat treatment may be performed under reduced pressure. Alternatively, the heat treatment may be performed in the following manner: heat treatment is performed in an oxygen atmosphere, and then another heat treatment is successively performed in a nitrogen atmosphere without exposure to the air.

Figure 15A:
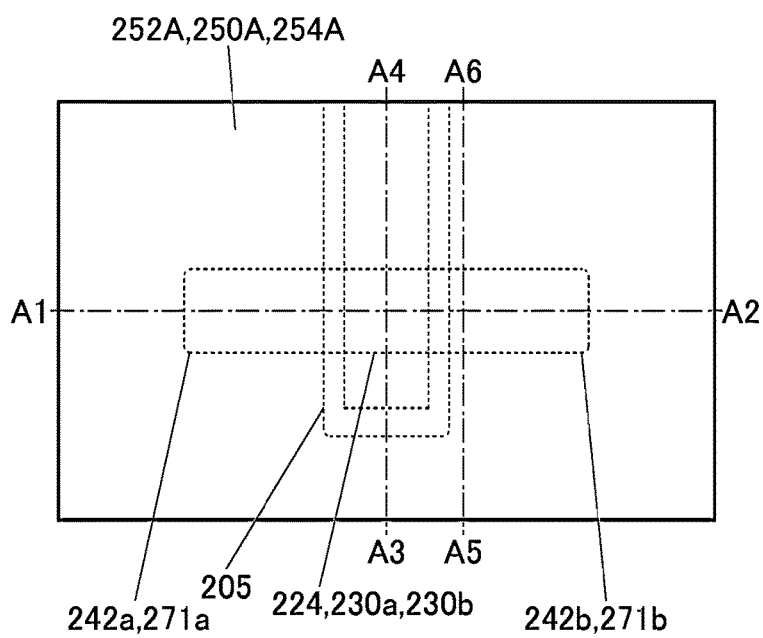
FIG. 15A is a top view showing a method for fabricating a semiconductor device of one embodiment of the present invention.
Figure 15C:
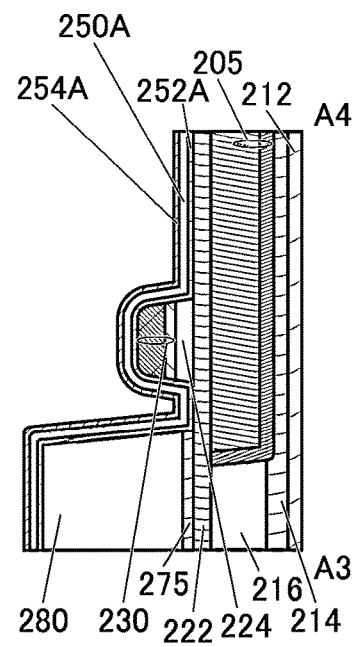
FIG. 15B to FIG. 15D are cross-sectional views showing the method for fabricating the semiconductor device of one embodiment of the present invention.
Figure 15B:
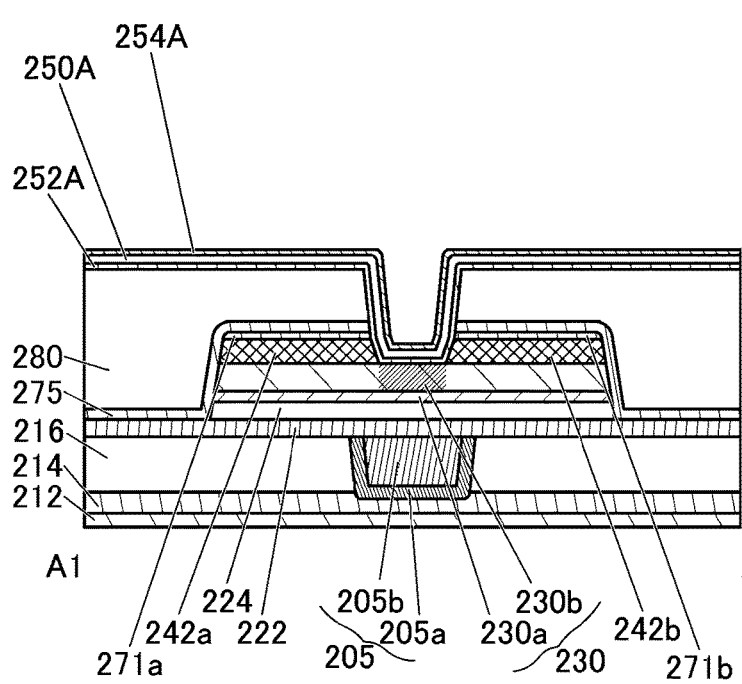
Figure 15D:
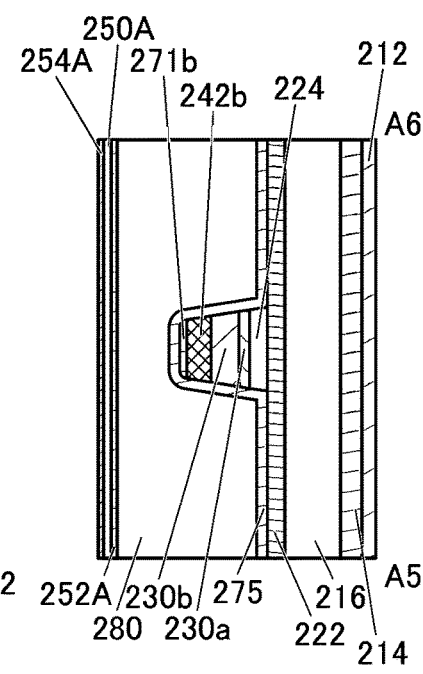
Figure 16A:
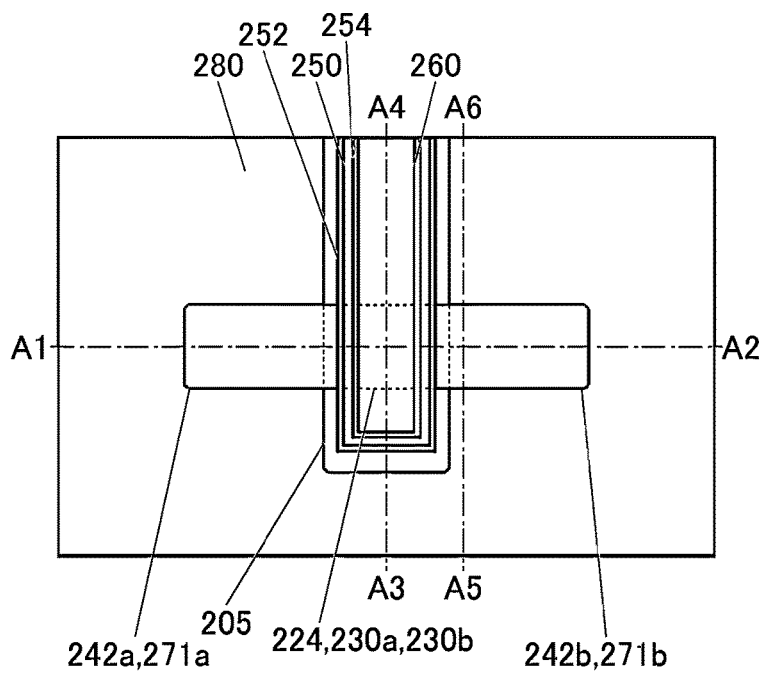
FIG. 16A is a top view showing a method for fabricating a semiconductor device of one embodiment of the present invention.
Figure 16C:
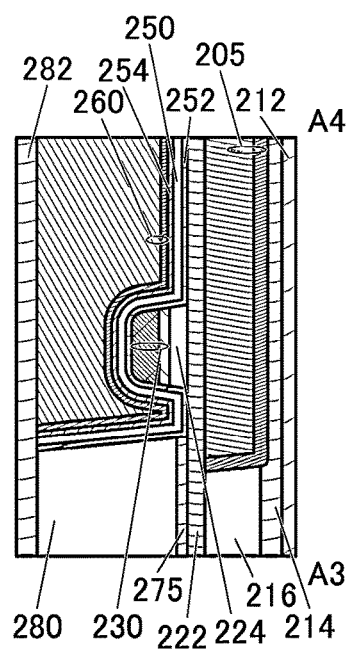
FIG. 16B to FIG. 16D are cross-sectional views showing the method for fabricating the semiconductor device of one embodiment of the present invention.
Figure 16B:
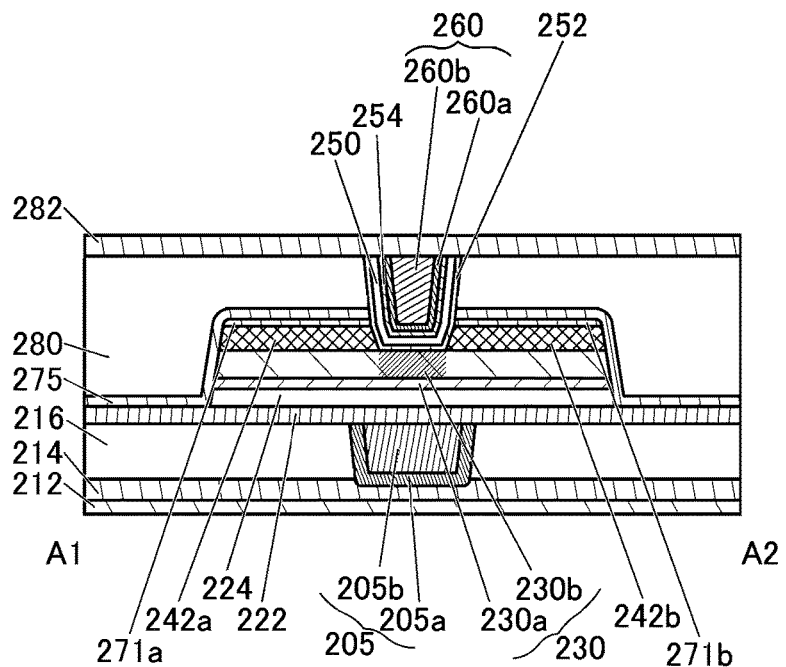
Figure 16D:
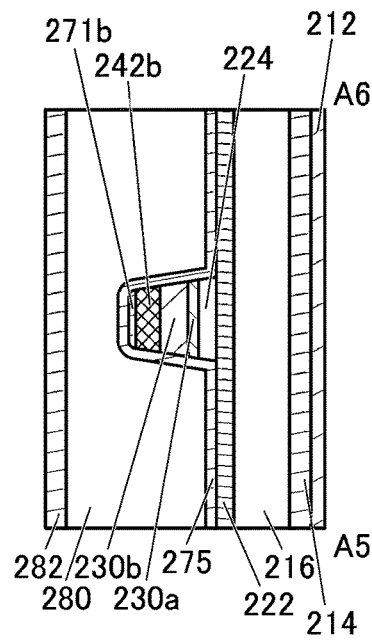
Figure 17A:
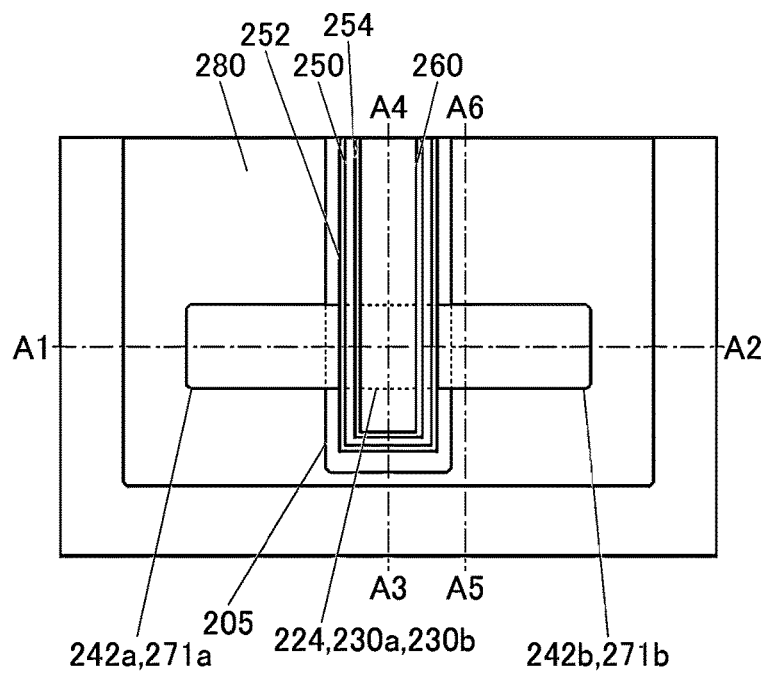
FIG. 17A is a top view showing a method for fabricating a semiconductor device of one embodiment of the present invention.
Figure 17C:
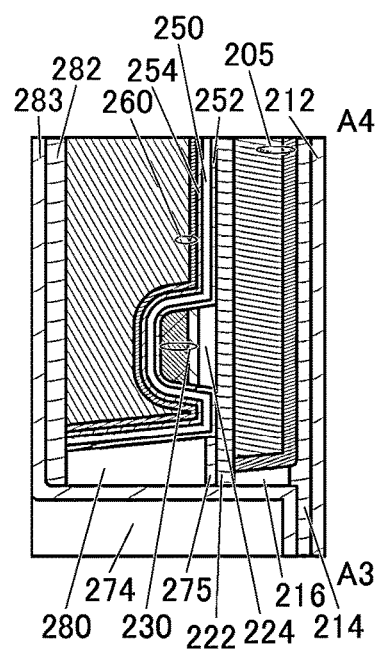
FIG. 17B to FIG. 17D are cross-sectional views showing the method for fabricating the semiconductor device of one embodiment of the present invention.
Figure 17B:
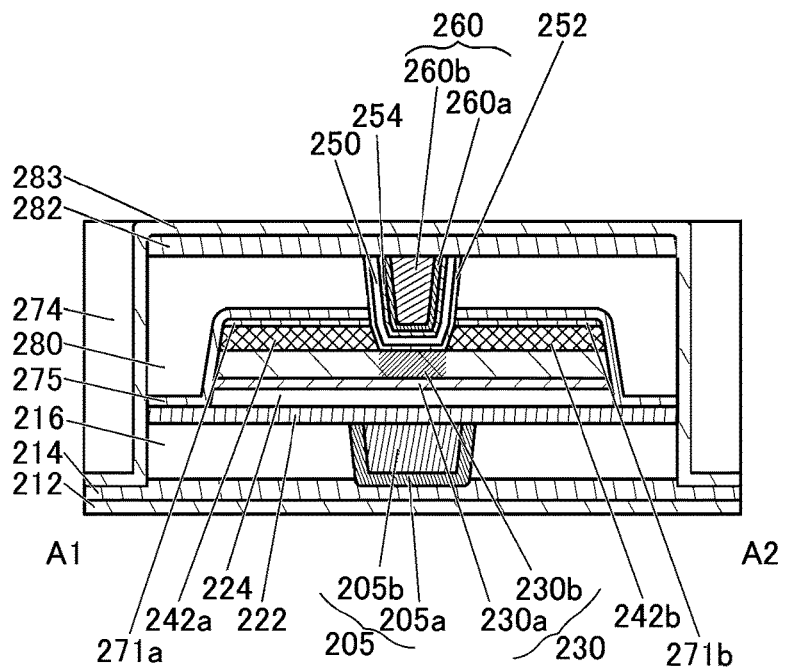
Figure 17D:
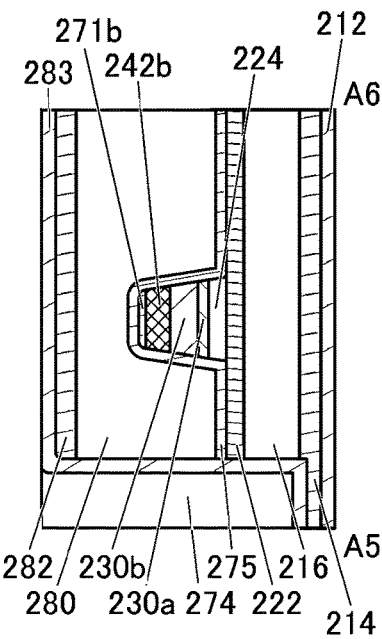

Next, an insulating film 252A is deposited (see FIG. 15A to FIG. 15D). The insulating film 252A can be deposited by a sputtering method, a CVD method, an MBE method, a PLD method, an ALD method, or the like. The insulating film 252A is preferably deposited by an ALD method. As described above, the insulating film 252A is preferably deposited to have a small thickness, and unevenness of the thickness needs to be reduced. In contrast, an ALD method is a deposition method in which a precursor and a reactant (e.g., an oxidizer) are alternately introduced, and the film thickness can be adjusted with the number of repetition times of the cycle; thus, accurate control of the film thickness is possible. Furthermore, as illustrated in FIG. 15B and FIG. 15C, the insulating film 252A needs to be deposited on the bottom surface and the side surface of the opening formed in the insulator 280 and the like so as to have good coverage. In particular, it is preferable that the insulating film 252A be deposited on the top surface and the side surface of the oxide 230 and the side surface of the conductor 242 so as to have good coverage. An atomic layer can be deposited one by one on the bottom surface and the side surface of the opening, whereby the insulating film 252A can be deposited in the opening with good coverage.

When the insulating film 252A is deposited by an ALD method, ozone ($O_3$), oxygen ($O_2$), water ($H_2O$), or the like can be used as the oxidizer. When ozone ($O_3$), oxygen ($O_2$), or the like, which does not contain hydrogen, is used as the oxidizer, the amount of hydrogen diffusing into the oxide 230*b* can be reduced.

In this embodiment, aluminum oxide is deposited for the insulating film 252A by a thermal ALD method.

Next, it is preferable to perform microwave treatment in an atmosphere containing oxygen. The microwave treatment is preferably performed with a microwave treatment apparatus including a power source for generating high-density plasma using microwaves, for example. Here, the frequency of the microwave treatment apparatus is set to higher than or equal to 300 MHz and lower than or equal to 300 GHz, preferably higher than or equal to 2.4 GHz and lower than or equal to 2.5 GHz, for example, 2.45 GHz. Oxygen radicals at a high density can be generated with high-density plasma. The electric power of the power source that applies microwaves of the microwave treatment apparatus is set to higher than or equal to 1000 W and lower than or equal to 10000 W, preferably higher than or equal to 2000 W and lower than or equal to 5000 W. A power source may be provided to the microwave treatment apparatus to apply RF to the substrate side. Furthermore, application of RF to the substrate side allows oxygen ions generated by the high-density plasma to be introduced into the oxide 230*b* efficiently.

The microwave treatment is preferably performed under reduced pressure, and the pressure may be higher than or equal to 10 Pa and lower than or equal to 1000 Pa, preferably higher than or equal to 300 Pa and lower than or equal to 700 Pa. The treatment temperature may be lower than or equal to 750° C., preferably lower than or equal to 500° C., and is approximately 400° C., for example. The oxygen plasma treatment can be followed successively by heat treatment without exposure to air. For example, the heat treatment may be performed at higher than or equal to 100° C. and lower than or equal to 750° C., preferably higher than or equal to 300° C. and lower than or equal to 500° C.

Furthermore, the microwave treatment is performed using an oxygen gas and an argon gas, for example. Here, the oxygen flow rate ratio ($O_2/(O_2+Ar)$) is higher than 0% and lower than or equal to 100%. The oxygen flow rate ratio ($O_2/(O_2+Ar)$) is preferably higher than 0% and lower than or equal to 50%. The oxygen flow rate ratio ($O_2/(O_2+Ar)$) is further preferably higher than or equal to 10% and lower than or equal to 40%. The oxygen flow rate ratio ($O_2/(O_2+Ar)$) is still further preferably higher than or equal to 10% and lower than or equal to 30%. The carrier concentration in the region 230*bc* can be reduced by thus performing the microwave treatment in an atmosphere containing oxygen. In addition, the carrier concentrations in the region 230*ba* and the region 230*bb* can be prevented from being excessively reduced by preventing an excess amount of oxygen from being introduced into the chamber in the microwave treatment.

The microwave treatment in an oxygen-containing atmosphere can convert an oxygen gas into plasma using a high-frequency wave such as a microwave or RF, and apply the oxygen plasma to a region of the oxide 230*b* which is between the conductor 242*a* and the conductor 242*b*. At this time, the region 230*bc* can also be irradiated with the high-frequency wave such as the microwave or RF. In other words, the high-frequency wave such as a microwave or RF, the oxygen plasma, or the like can be applied to the region 230*bc*. The effect of the plasma, the microwave, or the like enables $V_OH$ in the region 230*bc* to be cut, and hydrogen to be removed from the region 230*bc*. That is, the reaction "$V_OH \rightarrow H+V_O$" occurs in the region 230*bc*, so that $V_OH$ contained in the region 230*bc* can be reduced. As a result, oxygen vacancies and $V_OH$ in the region 230*bc* can be reduced to lower the carrier concentration. In addition, oxygen radicals generated by the oxygen plasma or oxygen contained in the insulator 250 can be supplied to oxygen vacancies formed in the region 230*bc*, thereby further reducing oxygen vacancies and lowering the carrier concentration in the region 230*bc*.

Meanwhile, the conductor 242*a* and the conductor 242*b* are provided respectively over the region 230*ba* and the region 230*bb* illustrated in FIG. 9A. The conductor 242 preferably functions as a blocking film preventing the effect caused by the high-frequency waves such as the microwave or RF, the oxygen plasma, or the like in the microwave treatment in an atmosphere containing oxygen. Therefore, the conductor 242 preferably has a function of blocking an electromagnetic wave at higher than or equal to 300 MHz and lower than or equal to 300 GHz, for example, higher than or equal to 2.4 GHz and lower than or equal to 2.5 GHz. With use of such a conductor 242, a reduction in $V_OH$ and supply of an excess amount of oxygen due to the microwave treatment do not occur in the region 230*ba* or the region 230*bb*, preventing a decrease in carrier concentration in the region 230*ba* and the region 230*bb*.

Furthermore, the insulator 252 having a barrier property against oxygen is provided in contact with the side surfaces of the conductor 242*a* and the conductor 242*b*. Thus, formation of oxide films on the side surfaces of the conductor 242*a* and the conductor 242*b* by the microwave treatment can be inhibited.

In the above manner, oxygen vacancies and $V_OH$ can be selectively removed from the region 230*bc* in the oxide semiconductor, whereby the region 230*bc* can be an i-type or substantially i-type region. Furthermore, supply of an excess amount of oxygen to the region 230*ba* and the region 230*bb* functioning as the source region and the drain region can be inhibited and the state of the n-type regions before the microwave treatment is performed can be maintained. As a result, a change in the electrical characteristics of the transistor 200 can be inhibited, and thus a variation in the electrical characteristics of the transistors 200 in the substrate plane can be inhibited.

Next, an insulating film 250A is deposited (see FIG. 15A to FIG. 15D). Heat treatment may be performed before the deposition of the insulating film 250A; the heat treatment may be performed under reduced pressure, and the insulating film 250A may be successively deposited without exposure to the air. The heat treatment is preferably performed in an oxygen-containing atmosphere. Such treatment can remove moisture and hydrogen adsorbed onto a surface of the insulating film 252A and the like, and further can reduce the moisture concentrations and the hydrogen concentrations in the oxide 230*a* and the oxide 230*b*. The temperature of the heat treatment is preferably higher than or equal to 100° C. and lower than or equal to 400° C.

The insulating film 250A can be deposited by a sputtering method, a CVD method, a PECVD method, an MBE method, a PLD method, an ALD method, or the like. The insulating film 250A is preferably deposited by a deposition method using a gas in which hydrogen atoms are reduced or removed. This can reduce the hydrogen concentration in the insulating film 250A.

The hydrogen concentration in the insulating film 250A is preferably reduced because the insulating film 250A becomes the insulator 250 that faces the oxide 230*b* with the insulator 252 with a small thickness therebetween, in a later step.

In this embodiment, silicon oxynitride is deposited for the insulating film 250A by a PECVD method.

In the case where the insulator 250 has a two-layer structure as illustrated in FIG. 9B, an insulating film to be the insulator 250*b* may be deposited after the deposition of the above insulating film 250A. The insulating film to be the insulator 250*b* can be deposited by a sputtering method, a CVD method, an MBE method, a PLD method, an ALD method, or the like. The insulating film to be the insulator 250*b* is preferably formed using an insulator having a function of inhibiting diffusion of oxygen. With such a structure, oxygen contained in the insulator 250*a* can be inhibited from diffusing into the conductor 260. That is, a reduction in the amount of oxygen supplied to the oxide 230 can be inhibited. In addition, oxidation of the conductor 260 due to oxygen contained in the insulator 250*a* can be inhibited. The insulating film to be the insulator 250*b* can be provided using a material similar to that for the insulator 222. For example, hafnium oxide may be deposited by a thermal ALD method for the insulating film to be the insulator 250*b*.

After the insulating film 250A is deposited, microwave treatment may be performed. For the microwave treatment, the conditions for the microwave treatment performed after the deposition of the insulating film 252A may be used. Alternatively, microwave treatment may be performed after the deposition of the insulating film 250A, without the microwave treatment performed after the deposition of the insulating film 252A. In the case where the insulating film to be the insulator 250*b* is provided as described above, microwave treatment may be performed after the deposition of the insulating film 250A. For the microwave treatment, the conditions for the microwave treatment performed after the deposition of the insulating film 252A may be used. Alternatively, microwave treatment may be performed after the deposition of the insulating film to be the insulator 250*b*, without the microwave treatment performed after the deposition of the insulating film 252A or the insulating film 250A.

After each of the microwave treatment after the deposition of the insulating film 252A and the insulating film 250A and the microwave treatment after the deposition of the insulating film to be the insulator 250*b*, heat treatment may be performed with the reduced pressure being maintained. Such treatment enables hydrogen in the insulating film 252A, the insulating film 250A, the insulating film to be the insulator 250*b*, the oxide 230*b*, and the oxide 230*a* to be removed efficiently. Part of hydrogen is gettered by the conductor 242 (the conductor 242*a* and the conductor 242*b*) in some cases. Alternatively, the step of performing microwave treatment and then performing heat treatment with the reduced pressure being maintained may be repeated a plurality of cycles. The repetition of the heat treatment enables hydrogen in the insulating film 252A, the insulating film 250A, the insulating film to be the insulator 250*b*, the oxide 230*b*, and the oxide 230*a* to be removed more efficiently. Note that the temperature of the heat treatment is preferably higher than or equal to 300° C. and lower than or equal to 500° C. The microwave treatment, i.e., the microwave annealing, may also serve as the heat treatment. The heat treatment is not necessarily performed in the case where the oxide 230*b* and the like are adequately heated by the microwave annealing.

Furthermore, the microwave treatment improves the film quality of the insulating film 252A, the insulating film 250A, and the insulating film to be the insulator 250*b*, thereby inhibiting diffusion of hydrogen, water, impurities, and the like. Accordingly, hydrogen, water, impurities, and the like can be inhibited from diffusing into the oxide 230*b*, the oxide 230*a*, and the like through the insulator 252 in a later step such as deposition of a conductive film to be the conductor 260 or later treatment such as heat treatment.

Next, an insulating film 254A is deposited (see FIG. 15A to FIG. 15D). The insulating film 254A can be deposited by a sputtering method, a CVD method, an MBE method, a PLD method, an ALD method, or the like. Like the insulating film 252A, the insulating film 254A is preferably deposited by an ALD method. By an ALD method, the insulating film 254A can be deposited to have a small thickness and good coverage. In this embodiment, for the insulating film 254A, silicon nitride is deposited by a PEALD method.

Next, a conductive film to be the conductor 260*a* and a conductive film to be the conductor 260*b* are deposited in this order. The conductive film to be the conductor 260*a* and the conductive film to be the conductor 260*b* can be deposited by a sputtering method, a CVD method, an MBE method, a PLD method, an ALD method, or the like. In this embodiment, titanium nitride is deposited for the conductive film to be the conductor 260*a* by an ALD method, and tungsten is deposited for the conductive film to be the conductor 260*b* by a CVD method.

Then, the insulating film 252A, the insulating film 250A, the insulating film 254A, the conductive film to be the conductor 260*a*, and the conductive film to be the conductor 260*b* are polished by CMP treatment until the insulator 280 is exposed, whereby the insulator 252, the insulator 250, the insulator 254, and the conductor 260 (the conductor 260*a* and the conductor 260*b*) are formed (see FIG. 16A to FIG. 16D). Accordingly, the insulator 252 is placed to cover the opening reaching the oxide 230*b*. The conductor 260 is placed to fill the opening with the insulator 252, the insulator 250, and the insulator 254 therebetween.

Then, heat treatment may be performed under conditions similar to those for the above heat treatment. In this embodiment, treatment is performed at 400° C. in a nitrogen atmosphere for one hour. The heat treatment can reduce the moisture concentrations and the hydrogen concentrations in the insulator 250 and the insulator 280. After the heat treatment, the insulator 282 may be deposited successively without exposure to the air.

Next, the insulator 282 is formed over the insulator 252, the insulator 250, the insulator 254, the conductor 260, and the insulator 280 (see FIG. 16A to FIG. 16D). The insulator 282 can be deposited by a sputtering method, a CVD method, an MBE method, a PLD method, an ALD method, or the like. The insulator 282 is preferably deposited by a sputtering method. By using a sputtering method, which does not need to use a molecule containing hydrogen as a deposition gas, the hydrogen concentration in the insulator 282 can be reduced.

In this embodiment, for the insulator 282, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality.

The insulator 282 is deposited by a sputtering method in an oxygen-containing atmosphere, whereby oxygen can be added to the insulator 280 during the deposition. Thus, excess oxygen can be contained in the insulator 280. At this time, the insulator 282 is preferably deposited while the substrate is being heated.

Next, an etching mask is formed over the insulator 282 by a lithography method and part of the insulator 282, part of the insulator 280, part of the insulator 275, part of the insulator 222, and part of the insulator 216 are processed until the top surface of the insulator 214 is exposed. Wet etching can be used for the processing; however, use of dry etching is preferable for microfabrication.

Next, heat treatment may be performed. The heat treatment is performed at higher than or equal to 250° C. and lower than or equal to 650° C., preferably higher than or equal to 350° C. and lower than or equal to 600° C. The heat treatment is preferably performed at a temperature lower than that of the heat treatment performed after the deposition of the oxide film 230B. Note that the heat treatment is performed in a nitrogen gas or inert gas atmosphere. By the heat treatment, part of oxygen added to the insulator 280 is diffused into the oxide 230 through the insulator 250 and the like.

By the heat treatment, oxygen contained in the insulator 280 and hydrogen bonded to the oxygen can be released to the outside from the side surface of the insulator 280 formed by the processing of the insulator 282, the insulator 280, the insulator 275, the insulator 222, and the insulator 216. Note that the hydrogen bonded to oxygen is released as water. Thus, unnecessary oxygen and hydrogen contained in the insulator 280 can be reduced.

In a region of the oxide 230 that overlaps with the conductor 260, the insulator 252 is provided to be in contact with the top surface and the side surface of the oxide 230. Since the insulator 252 has a barrier property against oxygen, diffusion of an excess amount of oxygen into the oxide 230 can be suppressed. This allows oxygen to be supplied to the region 230*bc* and the vicinity thereof such that an excess amount of oxygen is not supplied thereto. Accordingly, oxygen vacancies and $V_OH$ formed in the region 230*bc* can be reduced while oxidation of the side surface of the conductor 242 due to excess oxygen can be inhibited. Thus, the transistor 200 can have good electrical characteristics and higher reliability.

On the other hand, in the case where the transistors 200 are integrated at a high density, the volume of the insulator 280 becomes excessively small with respect to one transistor 200 in some cases. In this case, the amount of oxygen diffusing into the oxide 230 in the heat treatment becomes significantly small. When the oxide 230 is heated while being in contact with the oxide insulator (e.g., the insulator 250) which does not contain sufficient oxygen, oxygen contained in the oxide 230 might be released. However, in the transistor 200 described in this embodiment, the insulator 252 is provided in contact with the top surface and the side surface of the oxide 230 in the region of the oxide 230 that overlaps with the conductor 260. Since the insulator 252 has a barrier property against oxygen, release of oxygen from the oxide 230 can be reduced also in the heat treatment. Thus, the amount of oxygen vacancies and $V_OH$ formed in the region 230bc can be reduced. As a result, the transistor 200 can have good electrical characteristics and higher reliability.

As described above, in either case of a large or small amount of oxygen supplied from the insulator 280 in the semiconductor device of this embodiment, a transistor having good electrical characteristics and high reliability can be formed. Thus, a semiconductor device with a reduced variation in the electrical characteristics of the transistors 200 in the substrate plane can be provided.

Next, the insulator 283 is formed over the insulator 282 (see FIG. 17A to FIG. 17D). The insulator 283 can be deposited by a sputtering method, a CVD method, an MBE method, a PLD method, an ALD method, or the like. The insulator 283 is preferably deposited by a sputtering method. By using a sputtering method, which does not need to use a molecule containing hydrogen as a deposition gas, the hydrogen concentration in the insulator 283 can be reduced. The insulator 283 may have a multilayer structure. For example, silicon nitride may be deposited by a sputtering method and silicon nitride may be deposited over the silicon nitride by an ALD method. Surrounding the transistor 200 by the insulator 283 and the insulator 214 that have a high barrier property can prevent entry of moisture and hydrogen from the outside.

Next, an insulating film to be the insulator 274 is formed over the insulator 283. The insulating film to be the insulator 274 can be deposited by a sputtering method, a CVD method, an MBE method, a PLD method, an ALD method, or the like. In this embodiment, for the insulating film to be the insulator 274, silicon oxide is deposited by a CVD method.

Next, the insulating film to be the insulator 274 is polished by CMP treatment until the insulator 283 is exposed, whereby the top surface of the insulating film to be the insulator 274 is planarized; thus, the insulator 274 is formed (see FIG. 17A to FIG. 17D). The top surface of the insulator 283 is partly removed by the CMP treatment in some cases.

Next, the insulator 285 is formed over the insulator 274 and the insulator 283 (see FIG. 8A to FIG. 8D). The insulator 285 can be deposited by a sputtering method, a CVD method, an MBE method, a PLD method, an ALD method, or the like. The insulator 285 is preferably deposited by a sputtering method. By using a sputtering method, which does not need to use a molecule containing hydrogen as a deposition gas, the hydrogen concentration in the insulator 285 can be reduced.

In this embodiment, for the insulator 285, silicon oxide is deposited by a sputtering method.

Through the above process, the semiconductor device including the transistor 200 illustrated in FIG. 8A to FIG. 8D can be fabricated. When impurities in the film of the insulator 130, which are at least one or more of hydrogen, a hydrocarbon, and carbon here, are thoroughly removed in the above-described manner, a highly purified intrinsic film having ferroelectricity can be formed. The highly purified intrinsic film having ferroelectricity and a highly purified intrinsic oxide semiconductor are highly compatible with each other in the manufacturing process. Thus, a method for fabricating a semiconductor device with high productivity can be provided.

Structure Example of Semiconductor Device Including Transistor 200 and Capacitor 100

Figure 18A:
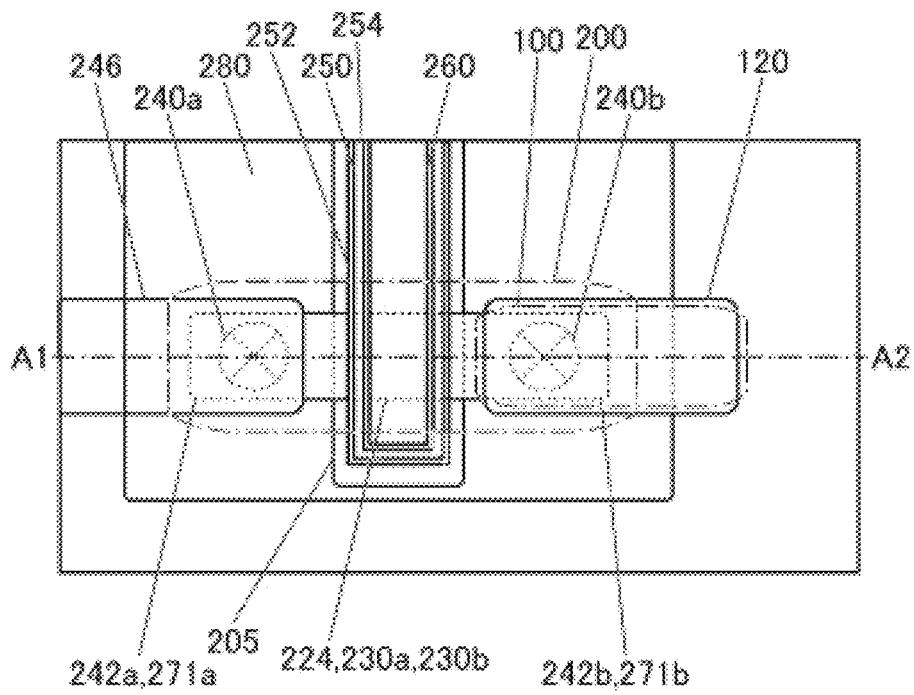
FIG. 18A is a top view of a semiconductor device of one embodiment of the present invention.
Figure 18B:
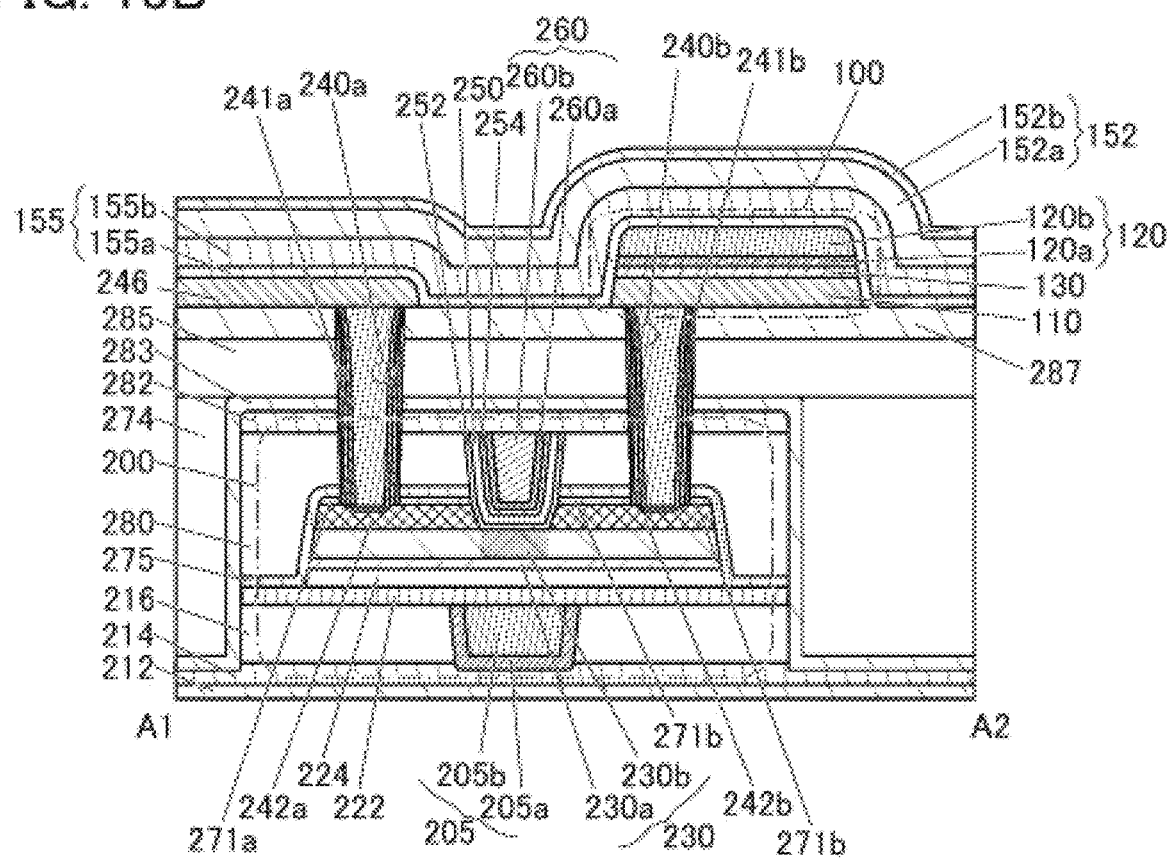
FIG. 18B is a cross-sectional view of the semiconductor device of one embodiment of the present invention.

FIG. 18A and FIG. 18B illustrate a semiconductor device including the above transistor 200 and the capacitor 100 relating to the above embodiment. FIG. 18A is a top view of the semiconductor device. FIG. 18B is a cross-sectional view of a portion indicated by the dashed-dotted line A1-A2 in FIG. 18A, i.e., a cross-sectional view of the transistor 200 in the channel length direction. Note that for clarity of the drawing, some components are not illustrated in the top view of FIG. 18A.

In the semiconductor device illustrated in FIG. 18A and FIG. 18B, the capacitor 100 and a conductor 246 that functions as a wiring are placed over the transistor 200. Here, the area where the capacitor 100 and the transistor 200 overlap with each other is preferably large in the top view. Such a structure can reduce the area occupied by the semiconductor device including the capacitor 100 and the transistor 200. In that case, miniaturization and high integration of the semiconductor device can be achieved.

The semiconductor device also includes a conductor 240 (a conductor 240a and a conductor 240b) that is electrically connected to the source and the drain of the transistor 200 and functions as a plug. As illustrated in FIG. 18B, the conductor 240a is in contact with the top surface of the conductor 242a, and the conductor 240b is in contact with the top surface of the conductor 242b. In addition, the conductor 240a is in contact with the bottom surface of the conductor 246, the conductor 240b is in contact with the bottom surface of the conductor 110. An insulator 241a is provided in contact with the side surface of the conductor 240a, and an insulator 241b is provided in contact with the side surface of the conductor 240b.

The capacitor 100 illustrated in FIG. 18B has a structure similar to that of the capacitor 100 illustrated in FIG. 1A. Note that the conductor 120 has a stacked-layer structure including a conductor 120a and a conductor 120b provided over and in contact with the conductor 120a. The insulator 155 has a stacked-layer structure including an insulator 155a and an insulator 155b provided over and in contact with the insulator 155a. The insulator 152 has a stacked-layer structure including an insulator 152a and an insulator 152b provided over and in contact with the insulator 152a. Instead of the insulator 105 illustrated in FIG. 1A, an insulator 287 that can be formed using the same material as the insulator 152 is provided. Without being limited to the above, each of the conductor 120, the insulator 155, and the insulator 152 may have a single-layer structure, a structure with three or more layers, or a structure in which the insulator 105 is provided below the conductor 110. Alternatively, a structure may be employed in which the insulator 287 is omitted and the top surface of the insulator 285 is in contact with the bottom surface of the conductor 246, the bottom surface of the insulator 155a, and the bottom surface of the conductor 110.

As the conductor 120a, a conductor that can be used for the conductor 120 described in the above embodiment may be deposited by an ALD method, a CVD method, or the like.

For example, titanium nitride may be deposited by a thermal ALD method. Here, the conductor 120a is preferably deposited by a method in which deposition is performed while the substrate is heated, such as a thermal ALD method. For example, the substrate temperature during the deposition is set to be higher than or equal to room temperature, preferably higher than or equal to 300° C., further preferably higher than or equal to 325° C., still further preferably higher than or equal to 350° C. Furthermore, for example, the substrate temperature during the deposition is set to be lower than or equal to 500° C., preferably lower than or equal to 450° C. For example, the substrate temperature is set to approximately 400° C.

As the conductor 120b, a conductor that can be used for the conductor 120 described in the above embodiment may be deposited by a sputtering method, an ALD method, a CVD method, or the like. For example, tungsten may be deposited by a metal CVD method.

As the insulator 155a, an insulator that can be used for the insulator 155 described in the above embodiment is preferably deposited by an ALD method, particularly a thermal ALD method. For example, aluminum oxide deposited by an ALD method can be used for the insulator 155a. Thus, even when a pinhole, disconnection, or the like is generated in the insulator 155b deposited by a sputtering method, a portion overlapping with such a defect can be filled with ALD-deposited aluminum oxide with excellent coverage.

As the insulator 155b, an insulator that can be used for the insulator 155 described in the above embodiment may be deposited by a sputtering method. For example, aluminum oxide deposited by a sputtering method can be used for the insulator 155b. Since a sputtering method does not need to use a molecule containing hydrogen as a deposition gas, the hydrogen concentrations of the insulator 155 and the conductor 120 therebelow can be reduced. Accordingly, a larger amount of impurities such as hydrogen included in the insulator 130 can be captured or fixed.

As the insulator 152a, an insulator that can be used for the insulator 152 described in the above embodiment may be deposited by a sputtering method. For example, silicon nitride deposited by a sputtering method can be used as the insulator 152a. Since a sputtering method does not need to use a molecule containing hydrogen as a deposition gas, the hydrogen concentrations in the insulator 152a and the insulator 155 serving as a base during the deposition can be reduced.

As the insulator 152b, an insulator that can be used for the insulator 152 described in the above embodiment is preferably deposited by an ALD method, particularly a PEALD method. For example, silicon nitride deposited by a PEALD method can be used as the insulator 152b. Thus, the insulator 152b can be deposited with good coverage; therefore, even when a pinhole, disconnection, or the like is generated in the insulator 152a owing to unevenness of the base, the insulator 152b covers such a defect, whereby hydrogen can be inhibited from diffusing to the insulator 130 or the like.

In such a structure, the capacitor 100 is sealed with the insulator 155a, the insulator 155b, the insulator 152a, the insulator 152b, and the insulator 287. Here, the insulator 155a, the insulator 155b, the insulator 152a, the insulator 152b, and the insulator 287 each serve as a sealing film. Thus, an impurity such as hydrogen can be inhibited from diffusing into the capacitor 100 from outside the insulator 152b and the insulator 287, and furthermore, an impurity such as hydrogen on the inner side of the insulator 152b and the insulator 287 can be captured or fixed by the insulator 155, so that the hydrogen concentration of the insulator 130 of the capacitor 100 can be reduced. Therefore, the ferroelectricity of the insulator 130 can be enhanced.

Like the capacitor 100 illustrated in FIG. 1B, the transistor 200 is sealed with the insulator 283, the insulator 282, the insulator 214, and the insulator 212. Accordingly, impurities such as hydrogen in the transistor 200 can be captured or fixed by the insulator 282 and the insulator 214, at the same time as when heat treatment by which impurities such as hydrogen in the capacitor 100 are captured or fixed by the insulator 155 is performed.

Furthermore, as illustrated in FIG. 18B, the insulator 155a, the insulator 155b, the insulator 152a, and the insulator 152b are provided to surround not only the capacitor 100 but also the conductor 246. Accordingly, in the heat treatment, impurities such as hydrogen can be inhibited from diffusing into the oxide 230 through the capacitor 100, the conductor 246, and the conductor 240. The highly purified intrinsic capacitor with ferroelectricity in which the amount of impurities such as hydrogen is reduced and a highly purified intrinsic oxide semiconductor in which the amount of impurities such as hydrogen is reduced are highly compatible with each other in the manufacturing process. Thus, a method for fabricating a semiconductor device with high productivity can be provided.

The conductor 240 is provided so as to be embedded in an opening formed in the insulator 271, the insulator 275, the insulator 280, the insulator 282, the insulator 283, the insulator 285, and the insulator 287. The bottom surface of the conductor 240 is in contact with the top surface of the conductor 242. For the conductor 240, a conductive material containing tungsten, copper, or aluminum as its main component is preferably used, for example. The conductor 240 may have a stacked-layer structure of a thin first conductor provided along the side surface and the bottom surface of the opening and a second conductor over the first conductor.

In the case where the conductor 240 has a stacked-layer structure, a conductive material having a function of inhibiting passage of impurities such as water and hydrogen is preferably used as the first conductor positioned in the vicinity of the insulator 285 and the insulator 280. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 283 can be inhibited from entering the oxide 230 through the conductor 240. As the second conductor, the above-described conductive material containing tungsten, copper, or aluminum as its main component may be used, for example.

Although the conductor 240 illustrated in FIG. 18B is a stack of the first conductor and the second conductor, the present invention is not limited thereto. For example, the conductor 240 may be provided to have a single-layer structure or a stacked-layer structure of three or more layers.

The conductor 246 may be placed in contact with the top surface of the conductor 240. The conductor 246 is preferably formed using a conductive material containing tungsten, copper, or aluminum as its main component. The conductor 246 may have a stacked-layer structure; for example, stacked layers of titanium or titanium nitride and the above-described conductive material may be employed. The conductor 246 is preferably formed using the same material in the same layer as that for/in the conductor 110.

The insulator 241a is provided in contact with an inner wall of an opening formed in the insulator 271, the insulator 275, the insulator 280, the insulator 282, the insulator 283, the insulator 285, and the insulator 287, and the conductor 240a is provided in contact with the side surface of the insulator 241a. The insulator 241b is provided in contact with an inner wall of an opening formed in the insulator 271, the insulator 275, the insulator 280, the insulator 282, the insulator 283, the insulator 285, and the insulator 287, and the conductor 240b is provided in contact with the side surface of the insulator 241b. Each of the insulator 241a and the insulator 241b has a structure in which a first insulator is provided in contact with the inner wall of the opening and a second insulator is provided inward from the first insulator.

For the insulator 241a and the insulator 241b, a barrier insulating film that can be used for the insulator 275 or the like may be used. For the insulator 241a and the insulator 241b, for example, an insulator such as silicon nitride, aluminum oxide, or silicon nitride oxide may be used. Since the insulator 241a and the insulator 241b are provided in contact with the insulator 283, the insulator 282, the insulator 275, and the insulator 271, impurities such as water and hydrogen contained in the insulator 280 or the like can be inhibited from entering the oxide 230 through the conductor 240a and the conductor 240b. In particular, silicon nitride is suitable because of having a high barrier property against hydrogen. Furthermore, oxygen contained in the insulator 280 can be prevented from being absorbed by the conductor 240a and the conductor 240b.

When the insulator 241a and the insulator 241b each have a stacked-layer structure as illustrated in FIG. 18B, the first insulator in contact with the inner wall of the opening in the insulator 280 and the like and the second insulator located inward from the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 240 can be inhibited, and hydrogen can be inhibited from entering the conductor 240.

Variation Example of Capacitor 100

Like the capacitor 100 illustrated in FIG. 1A, the capacitor 100 illustrated in FIG. 18A and FIG. 18B has a structure where the side surface of the conductor 110, the side surface of the insulator 130, and the side surface of the conductor 120 are substantially aligned with each other; however, the present invention is not limited to this structure. Variation examples of the capacitor 100 illustrated in FIG. 18A and FIG. 18B are described below with reference to FIG. 19A to FIG. 19D.

Figure 19A:
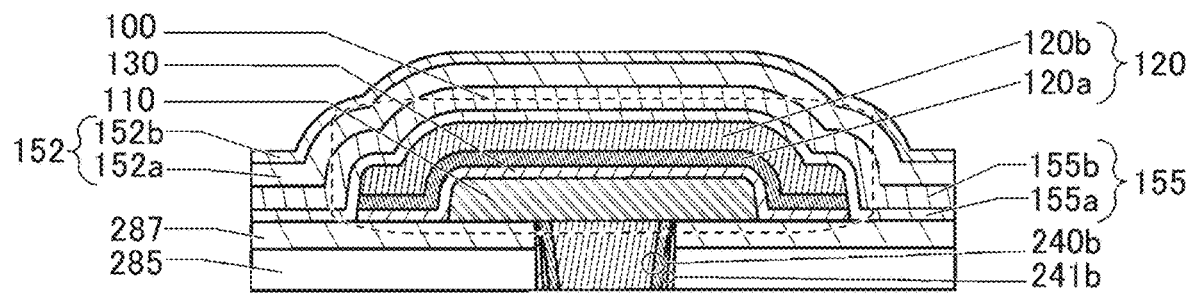
FIG. 19A to FIG. 19D are cross-sectional views of a capacitor of one embodiment of the present invention.

As in the capacitor 100 illustrated in FIG. 1B, a structure illustrated in FIG. 19A may be employed, where the side surface of the conductor 110 is located inward from the side surfaces of the insulator 130 and the conductor 120. The insulator 130 is formed to cover the top surface and the side surface of the conductor 110, and a region of the insulator 130 not overlapping with the conductor 110 is in contact with the insulator 287. In this case, the periphery of the conductor 110 is located inward from the peripheries of the insulator 130 and the conductor 120, seen in the top view. With such a structure, the conductor 110 and the conductor 120 can be sufficiently apart from each other with the insulator 130.

Figure 19B:
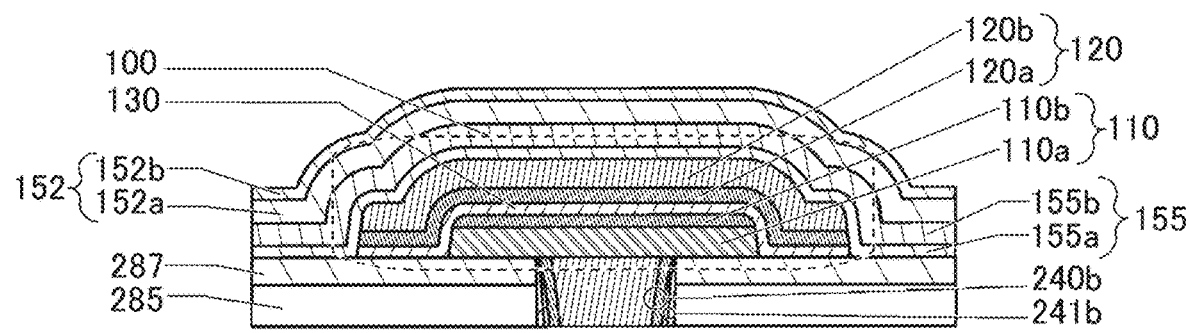

Although the conductor 110 in FIG. 19A or the like has a single-layer structure, the present invention is not limited to this structure. The conductor 110 may have a stacked-layer structure of two or more layers. For example, as illustrated in FIG. 19B, a stacked-layer structure of a conductor 110a and a conductor 110b over the conductor 110a may be employed.

As the conductor 110a, a conductor that can be used for the conductor 110 described in the above embodiment may be deposited by a sputtering method, an ALD method, a CVD method, or the like. For example, tungsten may be deposited by a sputtering method.

As the conductor 110b in contact with the bottom surface of the insulator 130, a conductor that can be used for the conductor 110 described in the above embodiment may be deposited by an ALD method, a CVD method, or the like. For example, titanium nitride may be deposited by a thermal ALD method. Like the conductor 110 described in the above embodiment, the conductor 110b preferably have planarity improved with CMP treatment or the like.

Figure 19C:
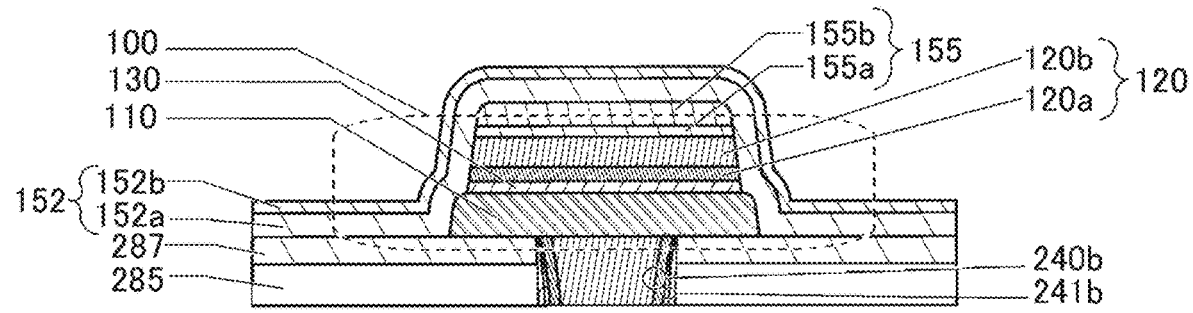

Like the capacitor 100 illustrated in FIG. 1C, a structure illustrated in FIG. 19C may be employed, where the side surfaces of the insulator 130 and the conductor 120 are located inward from the side surface of the conductor 110. In this case, the peripheries of the insulator 130 and the conductor 120 are located inward from the periphery of the conductor 110, seen in the top view. In this structure, the insulator 130 is not formed in the vicinity of a step of the formation surface formed by the conductor 110; accordingly, a region with low crystallinity, which has been formed in the vicinity of the step at the time of depositing the insulator 130, can be eliminated in the formed capacitor 100. Thus, the whole of the insulator 130 illustrated in FIG. 19C is in contact with the top surface of the conductor 110 with high planarity and can include many regions with high crystallinity.

In the structure of the capacitor 100 shown in FIG. 19C, the insulator 130 and the insulator 155a are not in contact with each other. This structure can inhibit oxidation of the insulator 130 in the case where a metal nitride is used for the insulator 130 and a metal oxide is used for the insulator 155a.

Figure 19D:
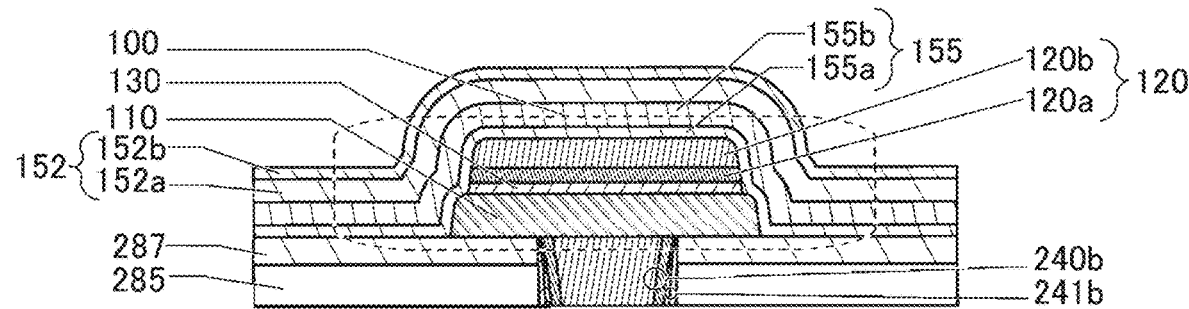

The structure in FIG. 19C or the like has a structure where the side surface of the insulator 155 is located inward from the side surface of the conductor 110; however, the present invention is not limited to the structure. For example, the insulator 155a and the insulator 155b may be provided to surround the conductor 110, the insulator 130, and the conductor 120 in a structure where the side surfaces of the insulator 130 and the conductor 120 are located inward from the side surface of the conductor 110, as illustrated in FIG. 19D.

Variation Example of Transistor 200

Figure 20A:
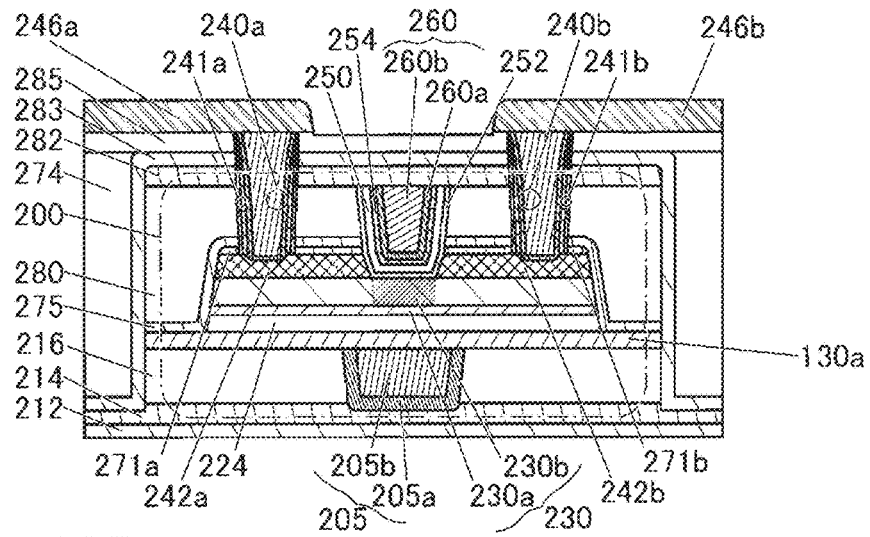
FIG. 20A to FIG. 20C are cross-sectional views of a semiconductor device of one embodiment of the present invention.
Figure 20B:
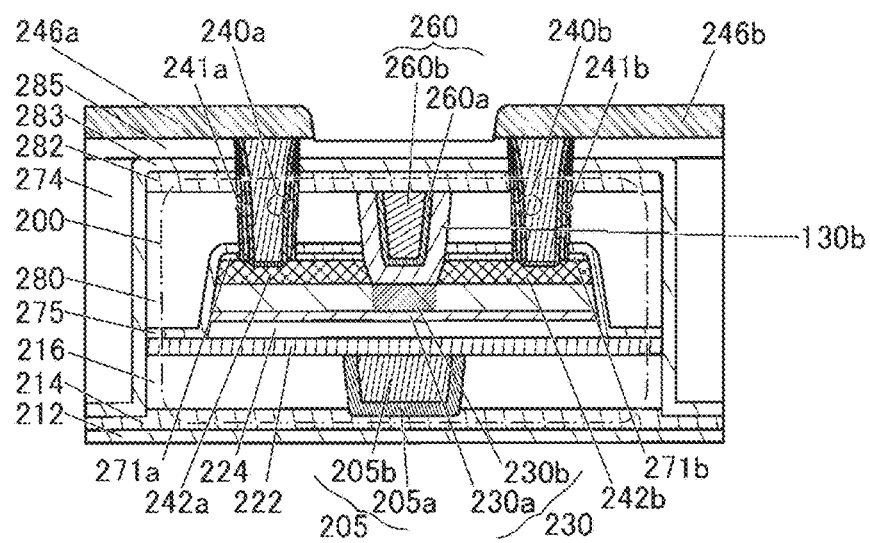
Figure 20C:
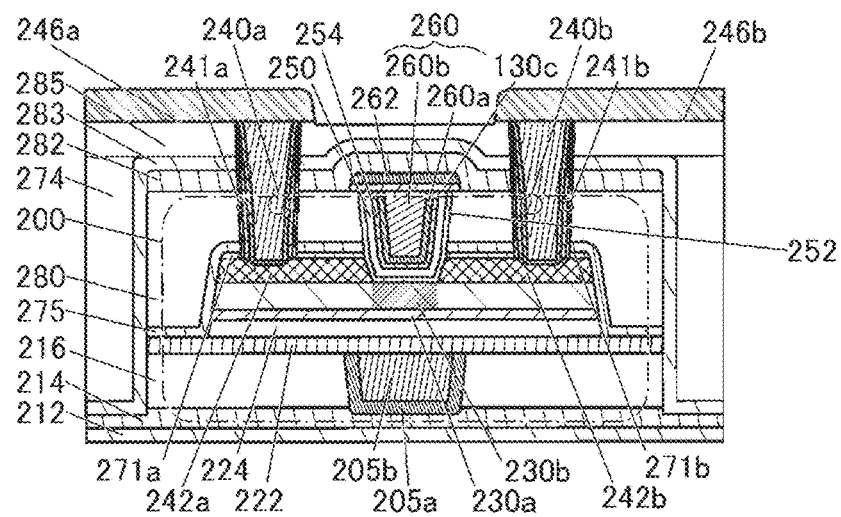

Although the transistor 200 is connected to the capacitor 100 including the material that can have ferroelectricity in the structure illustrated FIG. 18, the present invention is not limited thereto. For example, a material that can have ferroelectricity may be used for the transistor 200 and an insulator provided around the transistor 200. The transistor with such a structure is described with reference to FIG. 20A to FIG. 20C. Note that each of the transistors 200 illustrated in FIG. 20A to FIG. 20C is the one in which the conductor 240a, the conductor 240b, a conductor 246a, a conductor 246b, the insulator 241a, and the insulator 241b are additionally provided in the transistor 200 illustrated in FIG. 8. The conductor 246a and the conductor 246b are conductors similar to the above-described conductor 246. The conductor 246*a* is provided in contact with the top surface of the conductor 240*a*, and the conductor 246*b* is provided in contact with the top surface of the conductor 240*b*.

In the transistor 200 illustrated in FIG. 20A, an insulator 130*a* is used instead of the insulator 222. A material similar to that of the insulator 130, which can have ferroelectricity, can be used for the insulator 130*a*. That is, a material that can have ferroelectricity is used for the second gate insulator in the transistor 200 illustrated in FIG. 20A.

In the transistor 200 illustrated in FIG. 20B, an insulator 130*b* is used instead of the insulator 252, the insulator 250, and the insulator 254. A material similar to that of the insulator 130, which can have ferroelectricity, can be used for the insulator 130*b*. That is, a material that can have ferroelectricity is used for the first gate insulator in the transistor 200 illustrated in FIG. 20B. With such a structure, the transistor 200 illustrated in FIG. 20B can function as the FeFET illustrated in FIG. 7B1.

Note that although the whole first gate insulator is formed with a ferroelectric material in FIG. 20B, the present invention is not limited thereto. For example, a material that can have ferroelectricity may be used for one or more of the insulator 252, the insulator 250*a*, the insulator 250*b*, and the insulator 254, which are illustrated in FIG. 9B. For example, an insulating film with a stacked-layer structure of the insulator 252 and the insulator 130*b* over the insulator 252 may be provided between the oxide 230*b* and the conductor 260. Alternatively, for example, an insulating film with a stacked-layer structure of the insulator 130*b* and the insulator 254 over the insulator 130*b* may be provided between the oxide 230*b* and the conductor 260.

In the transistor 200 illustrated in FIG. 20C, an insulator 130*c* is provided over the conductor 260, and a conductor 262 is provided over the insulator 130*c*. A material similar to that of the insulator 130, which can have ferroelectricity, can be used for the insulator 130*c*. The conductive material that can be used for the conductor 260 can be used for the conductor 262. The insulator 282 is provided to cover the insulator 130*c* and the conductor 262. The semiconductor device illustrated in FIG. 20C can also be regarded as the semiconductor device in which the gate electrode of the transistor 200 is provided with one terminal of the ferroelectric capacitor.

The insulator 130*a*, the insulator 130*b*, or the insulator 130*c* included the transistor 200 in any of FIG. 20A to FIG. 20C is sealed with the insulator 212, the insulator 214, the insulator 282, and the insulator 283, together with the transistor 200. Thus, diffusion of hydrogen from outside the insulator 212 and the insulator 283 into the insulator 130*a*, the insulator 130*b*, or the insulator 130*c* can be inhibited, and moreover, hydrogen on the inner side of the insulator 212 and the insulator 283 can be captured or fixed by the insulator 282, so that the hydrogen concentration of the insulator 130*a*, the insulator 130*b*, or the insulator 130*c* can be reduced. Therefore, the ferroelectricity of the insulator 130*a* to the insulator 130*c* can be enhanced.

Variation Example of Capacitor

The capacitor 100 illustrated in FIG. 19A has the structure where the insulator 130 is in contact with the top surface of the insulator 287 and the top surface and the side surface of the conductor 110; however, the present invention is not limited to the structure. A structure illustrated in FIG. 21A may be employed, where the insulator 115*a* is provided between the insulator 130 and the insulator 287 and between the insulator 130 and the conductor 110. In other words, the insulator 130 is in contact with the top surface of the insulator 115*a*, and the insulator 287 and the conductor 110 are in contact with the bottom surface of the insulator 115*a*. As the insulator 115*a* mentioned here, the insulator 115*a* illustrated in FIG. 7C2 or the like in the above embodiment can be used. The thickness of the insulator 115*a* may be greater than or equal to 0.2 nm and less than or equal to 2 nm, preferably greater than or equal to 0.5 nm and less than or equal to 1 nm. With such a structure, the capacitor 100 illustrated in FIG. 21A can function as an FTJ element as illustrated in FIG. 7C1 and FIG. 7C2 where the capacitor and the diode are connected.

The capacitor 100 illustrated in FIG. 19A has the structure where the insulator 130 is in contact with the bottom surface of the conductor 120; however, the present invention is not limited to the structure. A structure illustrated in FIG. 21B may be employed, where the insulator 115*b* is provided between the insulator 130 and the conductor 120. In other words, the insulator 130 is in contact with the bottom surface of the insulator 115*b*, and the conductor 120 is in contact with the top surface of the insulator 115*b*. As the insulator 115*b* mentioned here, the insulator 115*b* illustrated in FIG. 7C3 or the like in the above embodiment can be used. The thickness of the insulator 115*b* may be greater than or equal to 0.2 nm and less than or equal to 2 nm, preferably greater than or equal to 0.5 nm and less than or equal to 1 nm. With such a structure, the capacitor 100 illustrated in FIG. 21B can function as an FTJ element as illustrated in FIG. 7C1 and FIG. 7C3 where the capacitor and the diode are connected.

Figure 21A:
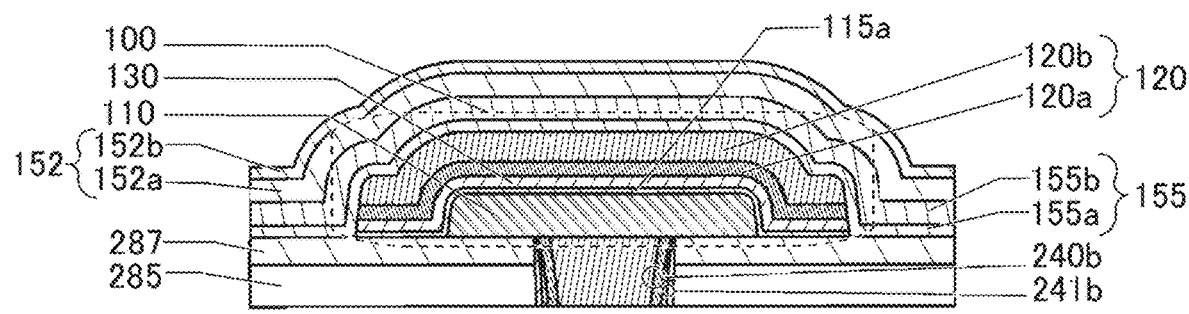
FIG. 21A to FIG. 21C are cross-sectional views each showing a structure of an element of one embodiment of the present invention.
Figure 21B:
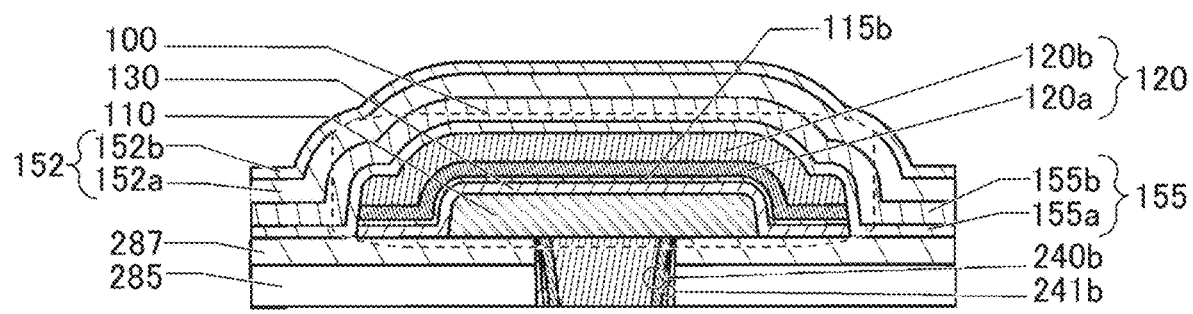
Figure 21C:
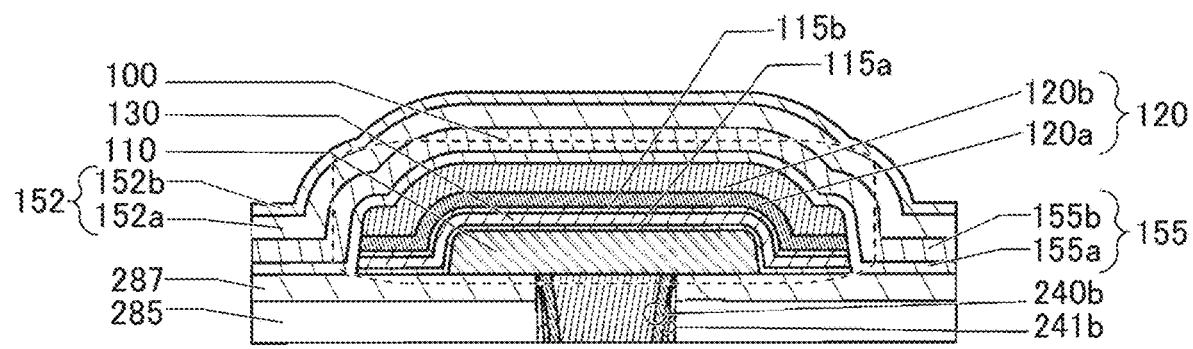

Alternatively, a structure illustrated in FIG. 21C may be employed, where the insulator 115*a* is provided between the insulator 130 and the insulator 287 and between the insulator 130 and the conductor 110, and the insulator 115*b* is provided between the insulator 130 and the conductor 120. With such a structure, the capacitor 100 illustrated in FIG. 21C can function as an FTJ element as illustrated in FIG. 7C1 and FIG. 7C4 where the capacitor and the diode are connected.

In each of the FTJ elements illustrated in FIG. 21A to FIG. 21C, the insulator 155 is in contact with the insulator 287 in a region not overlapping with the conductor 120. That is, the FTJ element is sealed with the insulator 155*a*, the insulator 155*b*, the insulator 152*a*, the insulator 152*b*, and the insulator 287. Thus, diffusion of hydrogen from outside the insulator 152*b* and the insulator 287 into the insulator 130 can be inhibited, and moreover, hydrogen on the inner side of the insulator 152*b* and the insulator 287 can be captured or fixed by the insulator 155, so that the hydrogen concentration of the insulator 130 can be reduced. Therefore, the ferroelectricity of the insulator 130 in the FTJ element can be enhanced.

Although each of the FTJ elements illustrated in FIG. 21A to FIG. 21C has the structure where the conductor 240 is provided in contact with the bottom surface of the conductor 110, the conductor 110 is not necessarily electrically connected to the transistor 200.

According to one embodiment of the present invention, a novel transistor can be provided. According to another embodiment of the present invention, a semiconductor device with a small variation in transistor characteristics can be provided. According to another embodiment of the present invention, a semiconductor device with favorable electrical characteristics can be provided. According to another embodiment of the present invention, a highly reliable semiconductor device can be provided. According to another embodiment of the present invention, a semiconductor device with a high on-state current can be provided. According to another embodiment of the present invention, a semiconductor device with a high field-effect mobility can be provided. According to another embodiment of the present invention, a semiconductor device with high frequency characteristics can be provided. According to another embodiment of the present invention, a semiconductor device that can be miniaturized or highly integrated can be provided. According to another embodiment of the present invention, a semiconductor device with low power consumption can be provided.

According to one embodiment of the present invention, a capacitor including a material that can have ferroelectricity can be provided. According to another embodiment of the present invention, the above-described capacitor can be provided with favorable productivity. According to another embodiment of the present invention, a semiconductor device including the above-described capacitor and a transistor can be provided. According to another embodiment of the present invention, the above-described semiconductor device that can be miniaturized or highly integrated can be provided.

At least part of the structure, method, and the like described in this embodiment can be implemented in appropriate combination with any of the other embodiments described in this specification.

Embodiment 3

In this embodiment, one mode of a semiconductor device will be described with reference to FIG. 22.

Structure Example of Storage Device

Figure 22:
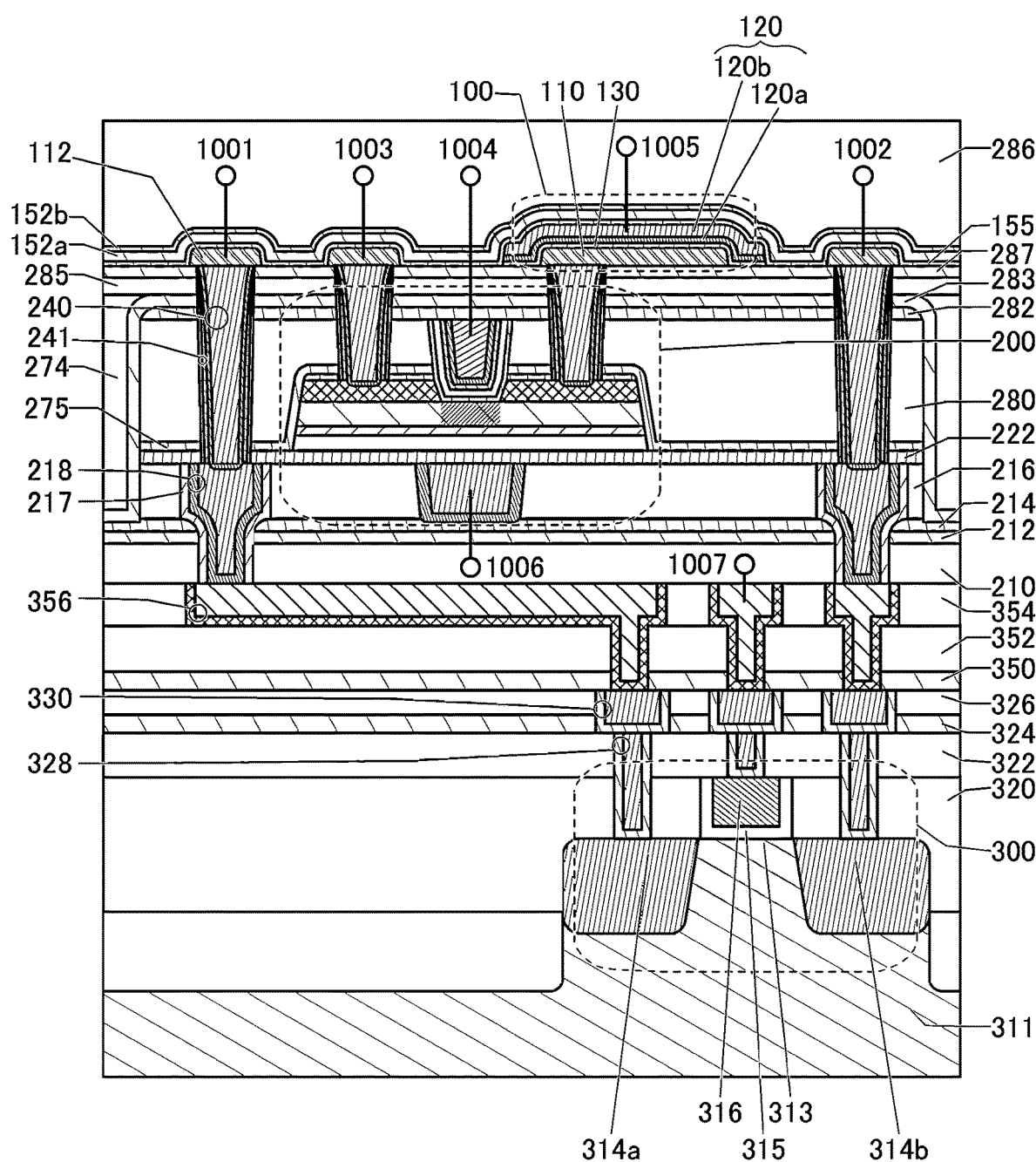
FIG. 22 is a cross-sectional view showing a structure of a storage device of one embodiment of the present invention.

FIG. 22 illustrates an example of a semiconductor device (storage device) of one embodiment of the present invention. In the storage device of one embodiment of the present invention, the transistor 200 is provided above a transistor 300, and the capacitor 100 is provided above the transistor 300 and the transistor 200. Note that the transistor 200 described in the above embodiment can be used as the transistor 200. The capacitor 100 described in the above embodiment can be used as the capacitor 100. Although FIG. 22 illustrates an example where the capacitor 100 shown in FIG. 19A and the transistor 200 shown in FIG. 18B are used, the present invention is not limited thereto; the capacitor 100 and the transistor 200 can be selected as appropriate.

A material that can have ferroelectricity, in which polarization internally occurs due to an electric field supplied from the outside and the polarization remains even when the electric field is reduced to zero, is used in the capacitor 100. Thus, a nonvolatile storage element can be formed using the capacitor 100. In other words, a one-transistor one-capacitor ferroelectric memory can be formed using the capacitor functioning as a ferroelectric capacitor and the transistor 200.

The transistor 200 is a transistor in which a channel is formed in a semiconductor layer including an oxide semiconductor. The transistor 200 has a feature of a high breakdown voltage. Accordingly, a high voltage can be applied to the transistor 200 formed using an oxide semiconductor even when the transistor 200 is miniaturized. The miniaturization of the transistor 200 can reduce the area occupied by the semiconductor device.

In the storage device illustrated in FIG. 22, a wiring 1001 is electrically connected to a source of the transistor 300, and a wiring 1002 is electrically connected to a drain of the transistor 300. A wiring 1003 is electrically connected to one of the source and the drain of the transistor 200, a wiring 1004 is electrically connected to the first gate of the transistor 200, a wiring 1005 is electrically connected to one electrode of the capacitor 100, a wiring 1006 is electrically connected to the second gate of the transistor 200, and a wiring 1007 is electrically connected to a gate of the transistor 300.

The storage device illustrated in FIG. 22 can form a memory cell array when arranged in a matrix.

<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as a source region and a drain region. The transistor 300 may be a p-channel transistor or an n-channel transistor.

In the substrate 311, a region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. A structure using silicon whose effective mass is controlled by applying stress to the crystal lattice and changing the lattice spacing may be employed. Alternatively, the transistor 300 may be an HEMT (High Electron Mobility Transistor) by using GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Here, in the transistor 300 illustrated in FIG. 22, the semiconductor region 313 (part of the substrate 311) in which a channel is formed has a protruding shape. In addition, the conductor 316 is provided to cover the side surface and the top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion.

Furthermore, although the case where the protruding portion is formed by processing part of the semiconductor substrate is described here, a semiconductor film having a protruding shape may be formed by processing an SOI substrate.

Also in the transistor 300 illustrated in FIG. 22 and the like, a material that can have ferroelectricity can be used as in the transistor 200 illustrated in FIG. 20A to FIG. 20C. For example, a silicon substrate is used as the substrate 311 of the transistor 300 and a material that can have ferroelectricity is used for the insulator 315, which enables a Si transistor to function as an FeFET.

Note that the transistor 300 illustrated in FIG. 22 is an example and is not limited to the structure shown therein; an appropriate transistor is used in accordance with a circuit structure or a driving method.

<Wiring Layer>

Wiring layers provided with an interlayer film, a wiring, a plug, and the like may be provided between the components. A plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases, and part of the conductor functions as a plug in other cases.

For example, an insulator 320, an insulator 322, an insulator 324, and an insulator 326 are sequentially stacked over the transistor 300 as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring.

The insulators functioning as the interlayer films may also function as planarization films that cover uneven shapes therebelow. For example, the top surface of the insulator 322 may be planarized by planarization treatment using a chemical mechanical polishing (CMP) method or the like to improve planarity.

A wiring layer may be provided over the insulator 326 and the conductor 330. For example, an insulator 350, an insulator 352, and an insulator 354 are sequentially stacked in FIG. 22. Furthermore, a conductor 356 is formed in the insulator 350, the insulator 352, and the insulator 354. The conductor 356 functions as a plug or a wiring.

Similarly, a conductor 218, a conductor included in the transistor 200 (the conductor 205), and the like are embedded in an insulator 210, the insulator 212, the insulator 214, and the insulator 216. Note that the conductor 218 has a function of a plug or a wiring that is electrically connected to the capacitor 100 or the transistor 300.

Here, like the insulator 241 described in the above embodiment, an insulator 217 is provided in contact with the side surface of the conductor 218 functioning as a plug. The insulator 217 is provided in contact with an inner wall of an opening formed in the insulator 210, the insulator 212, the insulator 214, and the insulator 216. That is, the insulator 217 is provided between the conductor 218 and each of the insulator 210, the insulator 212, the insulator 214, and the insulator 216. Note that the conductor 205 and the conductor 218 can be formed in parallel; thus, the insulator 217 is sometimes formed in contact with the side surface of the conductor 205.

As the insulator 217, an insulator such as silicon nitride, aluminum oxide, or silicon nitride oxide may be used, for example. Since the insulator 217 is provided in contact with the insulator 210, the insulator 212, the insulator 214, and the insulator 222, entry of an impurity such as water or hydrogen into the oxide 230 through the conductor 218 from the insulator 210, the insulator 216, or the like can be inhibited. In particular, silicon nitride is suitable because of its high blocking property against hydrogen. Moreover, oxygen contained in the insulator 210 or the insulator 216 can be prevented from being absorbed by the conductor 218.

The insulator 217 can be formed in a manner similar to that of the insulator 241. For example, silicon nitride can be deposited by a PEALD method and an opening reaching the conductor 356 can be formed by anisotropic etching.

As described in the above embodiment, the insulator 287 functioning as a barrier insulating film against hydrogen is preferably provided over the insulator 285, over the transistor 200. Note that a structure not including the insulator 287 can also be employed. For the details of the insulator 285 and the insulator 287, the description in the above embodiment can be referred to.

The capacitor 100 and a conductor 112 are provided over the insulator 287 and the conductor 240. Note that the conductor 112 has a function of a plug or a wiring that is electrically connected to the transistor 200 or the transistor 300. The capacitor 100 includes the conductor 110, the insulator 130, and the conductor 120 (the conductor 120a and the conductor 120b) as described in the above embodiment. The conductor 110 is formed in the same layer as the conductor 112 and is in contact with the top surface of the conductor 240. The conductor 110 is electrically connected to the other of the source and the drain of the transistor 200 through the conductor 240. For the details of the conductor 110, the insulator 130, and the conductor 120, the description in the above embodiment can be referred to. Note that in the case where the insulator 287 is not provided, the conductor 110 and the conductor 112 are provided over the insulator 285 and the conductor 240.

The insulator 155 is provided to cover the conductor 120, the insulator 130, and the conductor 112. Furthermore, the insulator 152 (the insulator 152a and the insulator 152b) which functions as a barrier insulating film against hydrogen is provided over the insulator 155. An insulator 286 is provided to cover the insulator 152. For the details of the insulator 155 and the insulator 152, the description in the above embodiment can be referred to. Although the insulator 155 is illustrated as a single layer in FIG. 22 or the like, the structure of the insulator 155 is not limited thereto, and the insulator 155 may have a stacked-layer structure as in the above embodiment.

Providing the insulator 155 covering the capacitor 100 makes it possible to capture or fix hydrogen contained in the insulator 130 of the capacitor 100 to reduce the hydrogen concentration in the insulator 130. This can improve the crystallinity of the insulator 130 and enhance the ferroelectricity of the insulator 130. Moreover, a leakage current between the conductor 110 and the conductor 120 can be reduced.

In addition, providing the insulator 152a and the insulator 152b can inhibit impurities such as hydrogen contained in the insulator 286 over the insulator 152b from diffusing into the transistor 200 through the capacitor 100, the conductor 112, and the conductor 240.

With the above structure, the insulator 155 and the insulator 287 are in contact with each other in a region not overlapping with the capacitor 100. That is, the capacitor 100 is sealed with the insulator 155, the insulator 152a, the insulator 152b, and the insulator 287. The insulator 155, the insulator 152a, the insulator 152b, and the insulator 287 function as sealing films. Thus, hydrogen can be inhibited from diffusing into the capacitor 100 from outside the insulator 152b and the insulator 287, and furthermore, hydrogen on the inner side of the insulator 152b and the insulator 287 can be captured or fixed by the insulator 155, so that the hydrogen concentration of the insulator 130 of the capacitor 100 can be reduced. Therefore, the ferroelectricity of the insulator 130 can be enhanced.

Note that also in the case where the insulator 287 is not used, the capacitor 100 can be sealed in a region sandwiched between the insulator 283, and the insulator 152 and the insulator 155.

Furthermore, as illustrated in FIG. 22, the transistor 200 is also sealed with the insulator 283, the insulator 214, and the insulator 212 that function as barrier insulating films against hydrogen. Accordingly, diffusion of hydrogen into the transistor 200 from outside the insulator 283 and the insulator 212 can be inhibited to reduce the hydrogen concentration in the oxide semiconductor film included in the transistor 200. Therefore, the electrical characteristics and reliability of the transistor 200 can be improved.

Examples of an insulator that can be used as the interlayer film include an insulating oxide, an insulating nitride, an insulating oxynitride, an insulating nitride oxide, an insulating metal oxide, an insulating metal oxynitride, and an insulating metal nitride oxide.

For example, when a material having a low dielectric constant is used for the insulator functioning as an interlayer film, parasitic capacitance generated between wirings can be reduced. Thus, a material is preferably selected depending on the function of an insulator.

For example, as the insulator 210, the insulator 286, the insulator 352, the insulator 354, and the like, an insulator having a low dielectric constant is preferably included. For example, the insulator preferably includes silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (e.g., nylon and aramid), polyimide, polycarbonate, and acrylic.

When a transistor that includes an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used as the insulator 214, the insulator 212, the insulator 350, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having high electrical conductivity, typified by polycrystalline silicon containing an impurity element such as phosphorus, or a silicide such as nickel silicide may be used.

For example, for the conductor 328, the conductor 330, the conductor 356, the conductor 218, the conductor 112, and the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance. Furthermore, as described in the above embodiment, when the conductor 120a in the capacitor 100 is deposited by a method with substrate heating, such as a thermal ALD method, the ferroelectricity of the insulator 130 can be enhanced even without performing high-temperature baking after the formation. Therefore, since the semiconductor device can be fabricated without performing high-temperature baking, it is possible to use a low-resistance conductive material with a low melting point, such as copper.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, in FIG. 22, the insulator 241 is preferably provided between the insulator 280 containing excess oxygen and the conductor 240. When the insulator 241 is provided in contact with the insulator 222, the insulator 282, and the insulator 283, the transistor 200 can be sealed with the insulators having a barrier property.

That is, providing the insulator 241 can inhibit excess oxygen contained in the insulator 280 from being absorbed by the conductor 240. In addition, providing the insulator 241 can inhibit diffusion of hydrogen, which is an impurity, into the transistor 200 through the conductor 240.

For the insulator 241, an insulating material having a function of inhibiting diffusion of oxygen and impurities such as water and hydrogen is preferably used. For example, silicon nitride, silicon nitride oxide, aluminum oxide, hafnium oxide, or the like is preferably used. In particular, silicon nitride is preferable because of its high blocking property against hydrogen. Alternatively, a metal oxide such as magnesium oxide, gallium oxide, germanium oxide, yttrium oxide, zirconium oxide, lanthanum oxide, neodymium oxide, or tantalum oxide can be used, for example.

As described in the above embodiment, the transistor 200 may be sealed with the insulator 212, the insulator 214, the insulator 282, and the insulator 283. Such a structure can inhibit entry of hydrogen contained in the insulator 274, the insulator 285, the insulator 210, and the like into the insulator 280 and the like. In this case, the insulator 212, the insulator 214, the insulator 282, and the insulator 283 function as sealing films.

Here, the conductor 240 penetrates the insulator 283 and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inner side of the insulator 212, the insulator 214, the insulator 282, and the insulator 283 through the conductor 240 and the conductor 218. In this manner, the transistor 200 is sealed with the insulator 212, the insulator 214, the insulator 282, the insulator 283, the insulator 241, and the insulator 217, so that impurities such as hydrogen contained in the insulator 274 or the like can be inhibited from entering from the outside. Note that although one transistor 200 is illustrated in the region sealed with the insulator 212, the insulator 283, and the like in FIG. 22, one embodiment of the present invention is not limited to this structure; the plurality of transistors 200 can be provided in the sealed region.

<Dicing Line>

A dicing line (sometimes referred to as a scribe line, a dividing line, or a cutting line) which is provided when a large-sized substrate is divided into semiconductor elements so that a plurality of semiconductor devices are each taken as a chip is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 22, a region in which the insulator 283 and the insulator 214 are in contact with each other is preferably designed to overlap with the dicing line. That is, an opening is provided in the insulator 282, the insulator 280, the insulator 275, the insulator 222, and the insulator 216 in the vicinity of a region to be the dicing line that is provided on an outer edge of a memory cell including the plurality of transistors 200.

That is, in the opening provided in the insulator 282, the insulator 280, the insulator 275, the insulator 222, and the insulator 216, the insulator 214 is in contact with the insulator 283.

For example, an opening may be provided in the insulator 282, the insulator 280, the insulator 275, the insulator 222, the insulator 216, and the insulator 214. With such a structure, in the opening provided in the insulator 282, the insulator 280, the insulator 275, the insulator 222, the insulator 216, and the insulator 214, the insulator 212 is in contact with the insulator 283. Here, the insulator 212 and the insulator 283 may be formed using the same material and the same method. When the insulator 212 and the insulator 283 are formed using the same material and the same method, the adhesion therebetween can be increased. For example, silicon nitride is preferably used.

With the structure, the transistors 200 can be surrounded by the insulator 212, the insulator 214, the insulator 282, and the insulator 283. At least one of the insulator 212, the insulator 214, the insulator 282, and the insulator 283 has a function of inhibiting diffusion of oxygen, hydrogen, and water; thus, even when the substrate is divided into circuit regions each of which is provided with the semiconductor elements described in this embodiment to be processed into a plurality of chips, entry and diffusion of an impurity such as hydrogen or water from the direction of the side surface of the divided substrate into the transistor 200 can be prevented.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Variation Example 1 of Storage Device

Figure 23:
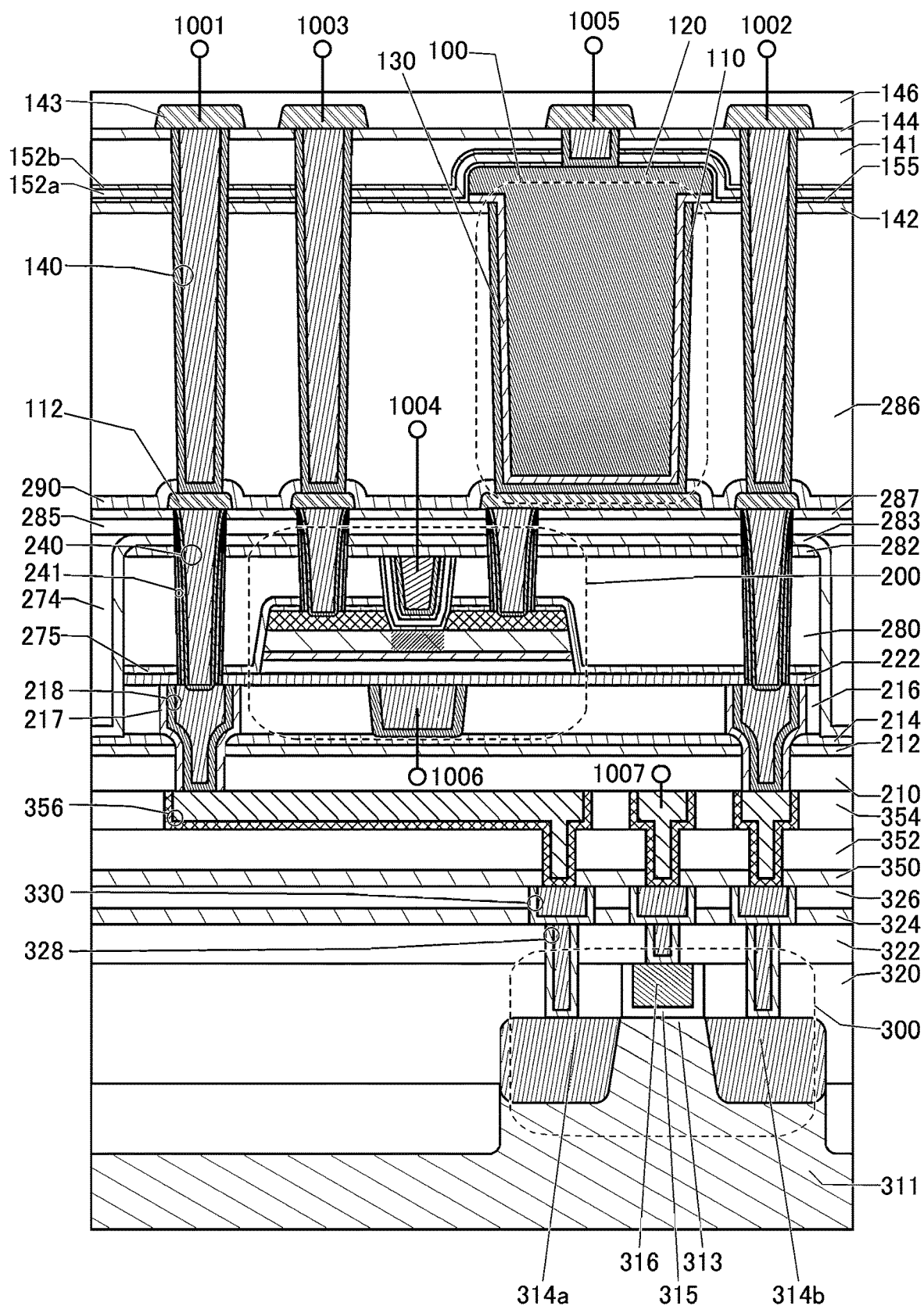
FIG. 23 is a cross-sectional view showing a structure of a storage device of one embodiment of the present invention.

Although the capacitor 100 of the storage device shown in FIG. 22 has a planar shape, the storage device described in this embodiment is not limited thereto. For example, the capacitor 100 may have a cylindrical shape as shown in FIG. 23. Note that the structure below and including the insulator 287 of the storage device shown in FIG. 23 is similar to that of the storage device shown in FIG. 22.

The capacitor 100 illustrated in FIG. 23 includes the insulator 286 over an insulator 290, an insulator 142 over the insulator 286, the conductor 110 positioned in an opening formed in the insulator 290, the insulator 286, and the insulator 142, the insulator 130 over the conductor 110 and the insulator 142, and the conductor 120 over the insulator 130. Here, at least parts of the conductor 110, the insulator 130, and the conductor 120 are positioned in the opening formed in the insulator 286 and the insulator 142. The insulator 290 is provided to cover the conductor 112 and is formed using any of the insulators that can be used as the insulator 152 or the insulator 155.

The conductor 110 functions as the lower electrode of the capacitor 100, the conductor 120 functions as the upper electrode of the capacitor 100, and the insulator 130 functions as the dielectric of the capacitor 100. The capacitor 100 has a structure in which the upper electrode and the lower electrode face each other with the dielectric interposed therebetween on the side surface as well as the bottom surface of the opening in the insulator 286 and the insulator 142; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

The insulator 142 preferably functions as an etching stopper at the time of forming the opening in the insulator 286 and is formed using an insulator that can be used as the insulator 214.

The shape of the opening formed in the insulator 286 and the insulator 142 in the top view may be a quadrangular shape, a polygonal shape other than a quadrangular shape, a polygonal shape with rounded corners, or a circular shape such as an elliptical shape. Here, the area where the opening and the transistor 200 overlap with each other is preferably large in the top view. Such a structure can reduce the area occupied by the semiconductor device including the capacitor 100 and the transistor 200.

The conductor 110 is placed in contact with the opening formed in the insulator 142 and the insulator 286. The uppermost portion of the conductor 110 is preferably substantially level with the top surface of the insulator 142. Furthermore, the bottom surface of the conductor 110 is in contact with the conductor 112 through an opening in the insulator 290. The conductor 110 is preferably deposited by an ALD method, a CVD method, or the like.

The insulator 130 is positioned to cover the conductor 110 and the insulator 142. The insulator 130 is preferably deposited by an ALD method or a CVD method, for example.

The conductor 120 is placed to fill the opening formed in the insulator 142 and the insulator 286. The conductor 120 is electrically connected to the wiring 1005 through a conductor 140 and a conductor 143. The conductor 120 is preferably deposited by an ALD method, a CVD method, or the like.

The insulator 155 is provided to cover the conductor 120 and the insulator 142. Furthermore, the insulator 152 (the insulator 152a and the insulator 152b) which functions as a barrier insulating film against hydrogen is provided over the insulator 155. An insulator 141 is provided over the insulator 152. An insulator 144 is provided over the insulator 141. An insulator that can be used as the insulator 280 can be used as the insulator 141. As the insulator 144, an insulator that can be used as the insulator 287 can be used.

The insulator 155 and the insulator 152 are provided in such a manner, whereby the capacitor 100 is held between the insulator 155 and insulator 152, and the insulator 290 and insulator 287. Thus, hydrogen can be inhibited from diffusing into the capacitor 100 from outside the insulator 152b and the insulator 287, and furthermore, hydrogen on the inner side of the insulator 152b and the insulator 287 can be captured or fixed by the insulator 155, so that the hydrogen concentration of the insulator 130 of the capacitor 100 can be reduced. Therefore, the ferroelectricity of the insulator 130 can be enhanced.

The conductor 143 is provided over the insulator 144 and is covered with an insulator 146. The conductor 143 can be formed using a conductor that can be used as the conductor 112, and the insulator 146 can be formed using an insulator that can be used as the insulator 141. Here, the conductor 143 is in contact with the top surface of the conductor 140 and functions as a terminal of the capacitor 100, the transistor 200, or the transistor 300.

Variation Example 2 of Storage Device

Figure 24A:
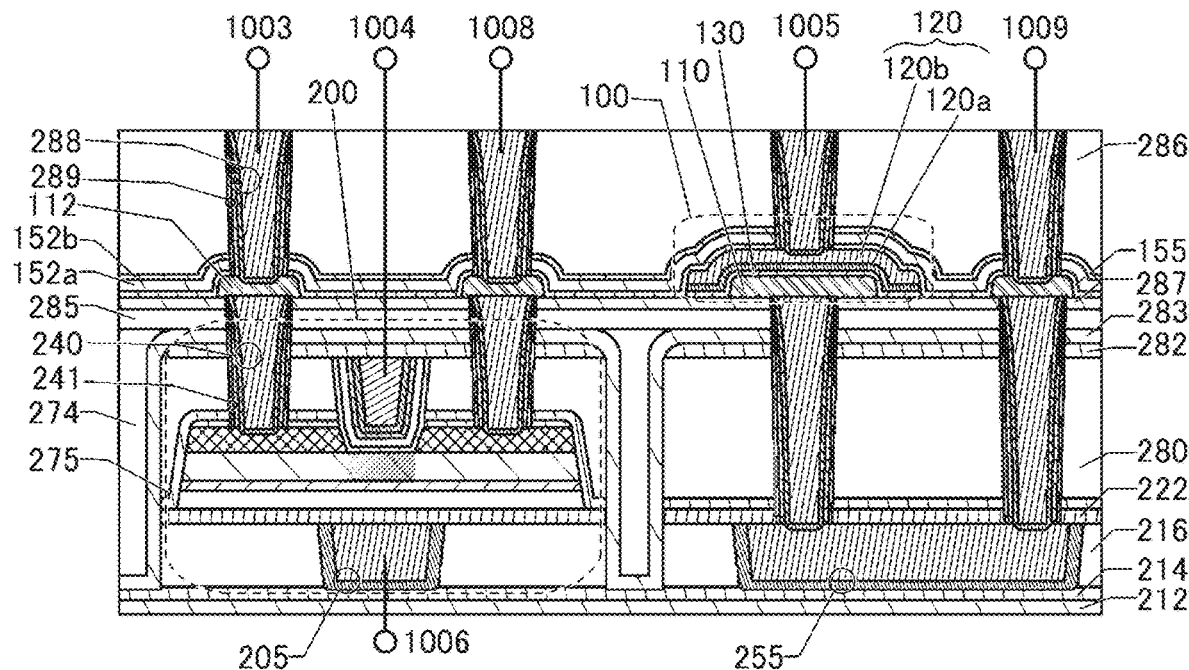
FIG. 24A and FIG. 24B are cross-sectional views each showing a structure of a storage device of one embodiment of the present invention.

Although the storage device illustrated in FIG. 22 has a structure where the transistor 200 and the capacitor 100 are electrically connected to each other, the present invention is not limited thereto. As illustrated in FIG. 24A, a structure may be employed in which the transistor 200 and the capacitor 100 are not electrically connected to each other. Here, in the storage device illustrated in FIG. 24A, the transistor 200 and the capacitor 100 that are above the insulator 212 have structures similar to those in the storage device illustrated in FIG. 22. The structure below the insulator 212 may be similar to that in the storage device illustrated in FIG. 22, or may be a structure where the substrate 311 is provided below and in contact with the insulator 212.

Furthermore, as illustrated in FIG. 24A, an opening may be formed in the insulator 286, the insulator 152b, the insulator 152a, and the insulator 155, and a conductor 288 and an insulator 289 may be provided to fill the opening. The conductor 288 has a structure similar to that of the conductor 240, and the insulator 289 has a structure similar to that of the insulator 241. Here, one of the source and the drain of the transistor 200 is electrically connected to the wiring 1003 through the conductor 288, and the other of the source and the drain of the transistor 200 is electrically connected to a wiring 1008 through the conductor 288. One electrode (the conductor 120) of the capacitor 100 is electrically connected to the wiring 1005 through the conductor 288. The other electrode (the conductor 110) of the capacitor 100 is electrically connected to a wiring 1009 through the conductor 240, the conductor 255 in the same layer as the conductor 205, the conductor 112, and the conductor 288.

As illustrated in FIG. 24A, the transistor 200 and the capacitor 100 may be individually sealed with a sealing film. In the storage device illustrated in FIG. 24A, the transistor 200 is sealed with the insulator 283, the insulator 214, and the insulator 212. As illustrated in FIG. 24A, the conductor 240 and the conductor 255 functioning as wirings or plugs connected to the capacitor 100 may be sealed separately from the transistor 200. In this case, a region in which the insulator 283 and the insulator 214 are in contact with each other is formed between the transistor 200 and each of the conductor 240 and the conductor 255.

Figure 24B:
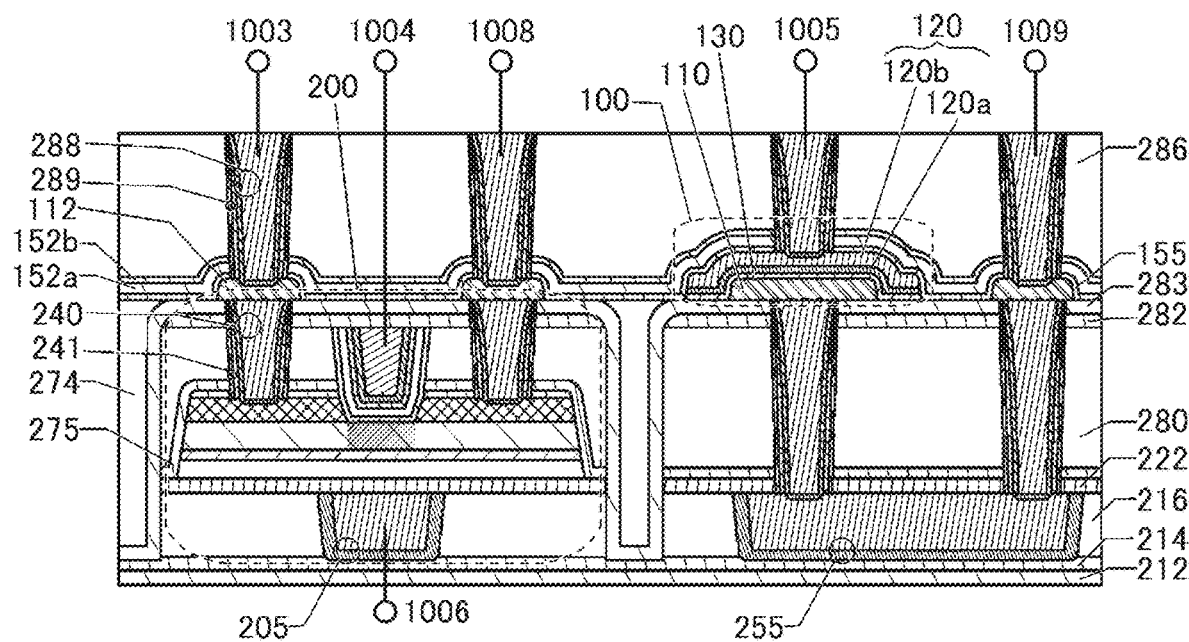

Although FIG. 24A illustrates a structure where the insulator 285 and the insulator 287 are provided between the transistor 200 and the capacitor 100, the present invention is not limited thereto. For example, as illustrated in FIG. 24B, a structure may be employed in which the insulator 285 and the insulator 287 are not provided and the bottom surfaces of the conductor 112, the conductor 110, and the insulator 155 are in contact with the insulator 283. In this case, the capacitor 100 is sealed with the insulator 152a, the insulator 152b, the insulator 155, and the insulator 283. Thus, the insulator 285 and the insulator 287 do not need to be provided, so that the productivity of the storage device can be improved.

Variation Example 3 of Storage Device

Figure 25:
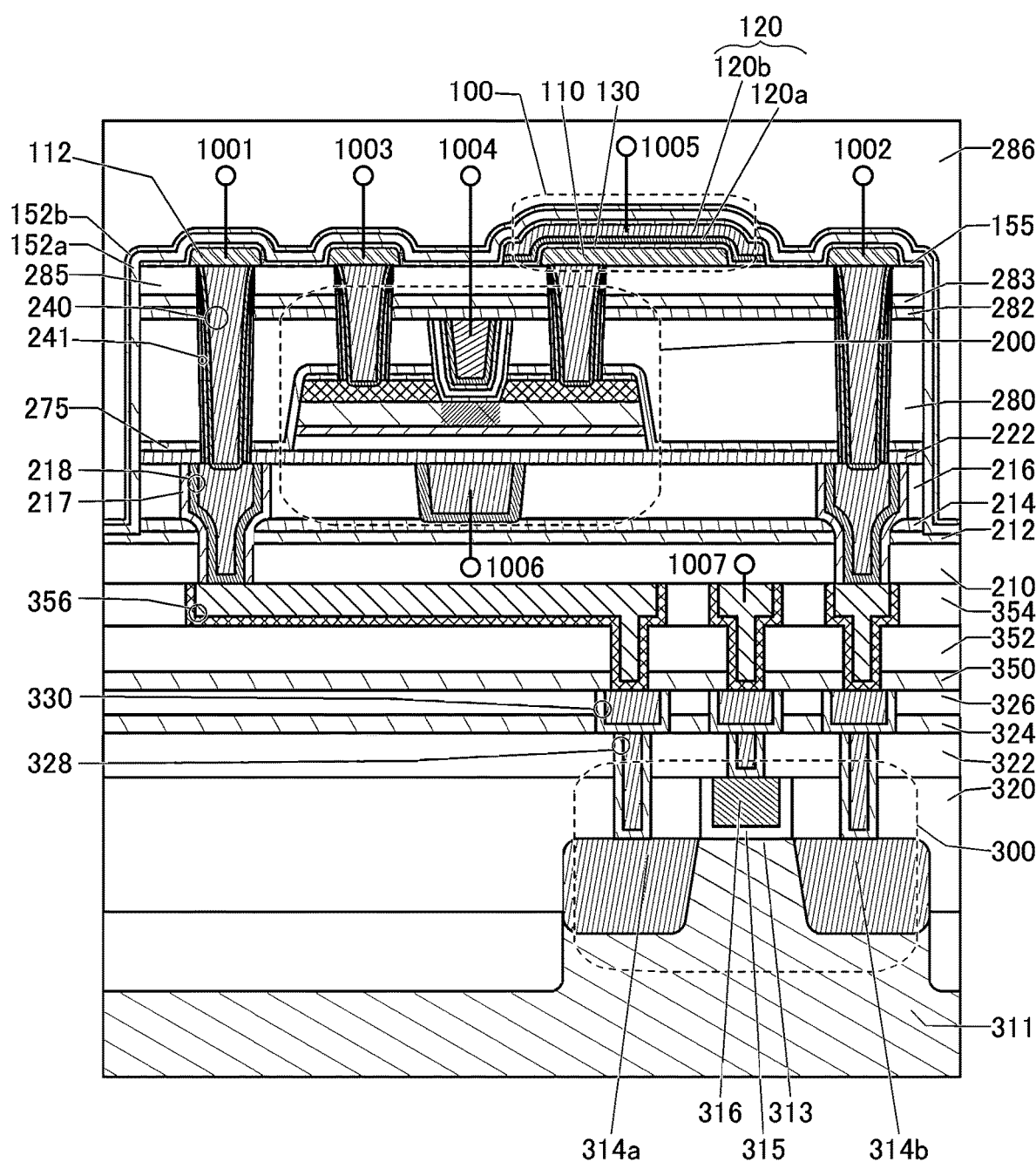
FIG. 25 is a cross-sectional view showing a structure of a storage device of one embodiment of the present invention.

Although the transistor 200 and the capacitor 100 are individually sealed with the barrier insulating films against hydrogen in the storage device illustrated in FIG. 22, the present invention is not limited thereto. As illustrated in FIG. 25, the transistor 200 and the capacitor 100 may be collectively sealed with the barrier insulating films against hydrogen (the insulator 212, the insulator 152a, and the insulator 152b).

In the storage device illustrated in FIG. 25, an opening reaching the insulator 212 is formed in the insulator 214, the insulator 216, the insulator 222, the insulator 275, the insulator 280, the insulator 282, the insulator 283, the insulator 285, and the insulator 155. The insulator 152a and the insulator 152b over the insulator 155 are formed along the side surface and the bottom surface of the opening. The insulator 152a is in contact with the top surface of the insulator 212 at the bottom surface of the opening.

With such a structure, the transistor 200 and the capacitor 100 can be collectively sealed with the insulator 212, the insulator 152a, and the insulator 152b. Thus, diffusion of hydrogen into the capacitor 100 and the transistor 200 from outside the insulator 212 and the insulator 152b can be inhibited to reduce the hydrogen concentrations in the insulator 130 of the capacitor 100 and the oxide semiconductor film of the transistor 200. Therefore, the ferroelectricity of the insulator 130 can be enhanced and the electrical characteristics and reliability of the transistor 200 can be improved.

Variation Example 4 of Storage Device

Figure 26:
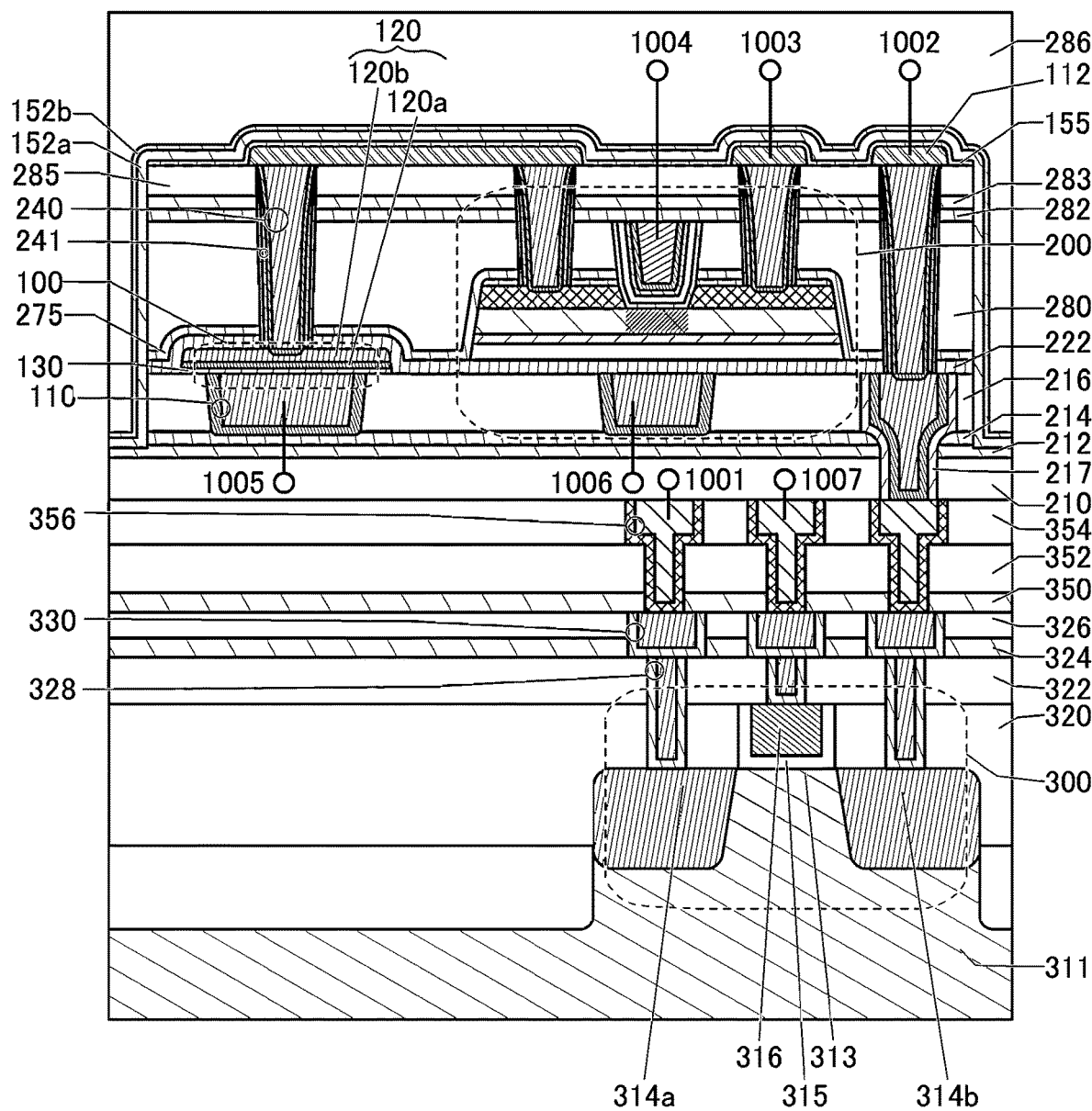
FIG. 26 is a cross-sectional view showing a structure of a storage device of one embodiment of the present invention.

Although the capacitor 100 is provided over the transistor 200 in the storage device illustrated in FIG. 25, the present invention is not limited thereto. As illustrated in FIG. 26, the capacitor 100 may be provided in the same layer as the transistor 200.

As illustrated in FIG. 26, the conductor 110 functioning as the lower electrode of the capacitor 100 is preferably formed using the same conductor as the conductor 205 functioning as the back gate of the transistor 200. The insulator 130 is placed over the conductor 110, and the conductor 120 (the conductor 120a and the conductor 120b) is placed over the insulator 130. Here, the insulator 130 preferably covers the top surface of the conductor 110 and separates the conductor 110 and the conductor 120. Note that the structures of the insulator 130 and the conductor 120 can be made similar to those illustrated in FIG. 22 and the like, and the description of [Structure example of storage device], the above embodiments, and the like can be referred to for the details. The insulator 222 is placed to cover the insulator 130 and the conductor 120.

The conductor 240 is provided in contact with the top surface of the conductor 120b, and the conductor 112 is provided in contact with the top surface of the conductor 240. The conductor 112 is in contact with the conductor 240 electrically connected to one of the source and the drain of the transistor 200. In other words, the conductor 120 functioning as the upper electrode of the capacitor 100 illustrated in FIG. 26 is electrically connected to the one of the source and the drain of the transistor 200. Furthermore, the conductor 110 functioning as the lower electrode of the capacitor 100 is electrically connected to the wiring 1005.

As in the storage device illustrated in FIG. 25, the transistor 200 and the capacitor 100 can be collectively sealed with the insulator 212, the insulator 152a, and the insulator 152b. Thus, diffusion of hydrogen into the capacitor 100 and the transistor 200 from outside the insulator 212 and the insulator 152b can be inhibited to reduce the hydrogen concentrations in the insulator 130 of the capacitor 100 and the oxide semiconductor film of the transistor 200. Therefore, the ferroelectricity of the insulator 130 can be enhanced and the electrical characteristics and reliability of the transistor 200 can be improved.

Variation Example 5 of Storage Device

Figure 27A:
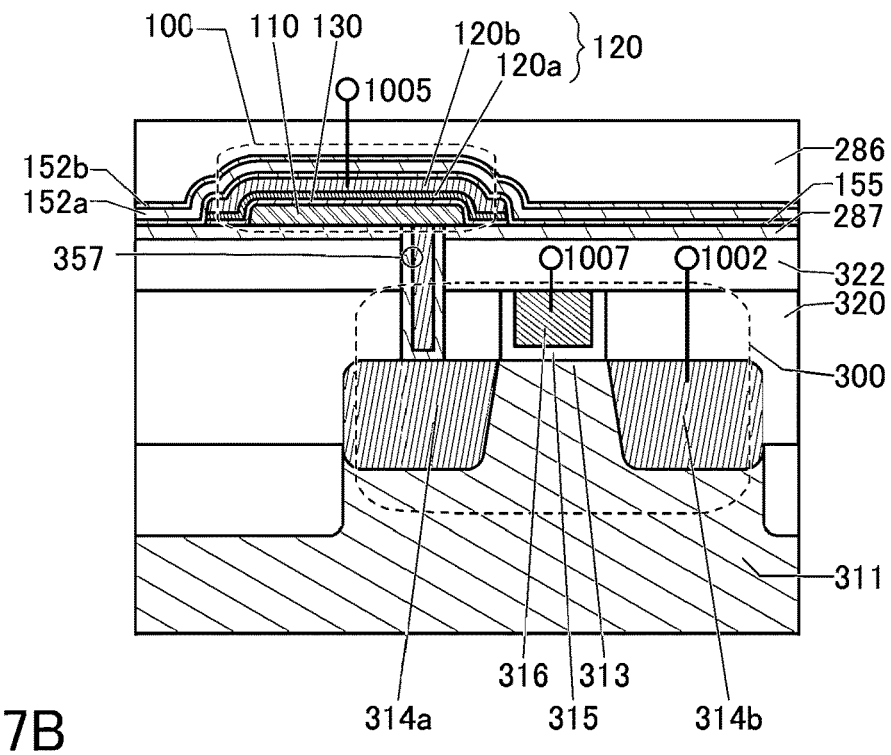
FIG. 27A and FIG. 27B are cross-sectional views each showing a structure of a storage device of one embodiment of the present invention.

Although the transistor 200 is provided over the transistor 300 and the capacitor 100 is connected to the transistor 200 in the storage device illustrated in FIG. 22 or the like, the present invention is not limited thereto. As illustrated in FIG. 27A, the capacitor 100 may be connected to the transistor 300 without provision of the transistor 200.

As illustrated in FIG. 27A, an opening reaching the low-resistance region 314a of the transistor 300 is formed in the insulator 320, the insulator 322, and the insulator 287, and a conductor 357 is formed to be embedded in the opening. As the conductor 357, a conductor similar to the conductor 328 and the like can be used. The top surface of the conductor 357 is in contact with the bottom surface of the conductor 110 of the capacitor 100. In this manner, the conductor 110 functioning as the lower electrode of the capacitor 100 and the low-resistance region 314a functioning as one of the source and the drain of the transistor 300 are connected to each other through the conductor 357. Note that the structures of the transistor 300, the capacitor 100, and the layers including them are similar to those in the structure illustrated in FIG. 22, and therefore the description of the structure illustrated in FIG. 22 can be referred to.

Furthermore, in the storage device illustrated in FIG. 27A, the capacitor 100 can be sealed with the insulator 287, the insulator 152a, and the insulator 152b as in the storage device illustrated in FIG. 22. Accordingly, diffusion of hydrogen into the capacitor 100 from outside the insulator 287 and the insulator 152b can be inhibited to reduce the hydrogen concentration in the insulator 130 of the capacitor 100. Therefore, the ferroelectricity of the insulator 130 can be enhanced.

Figure 27B:
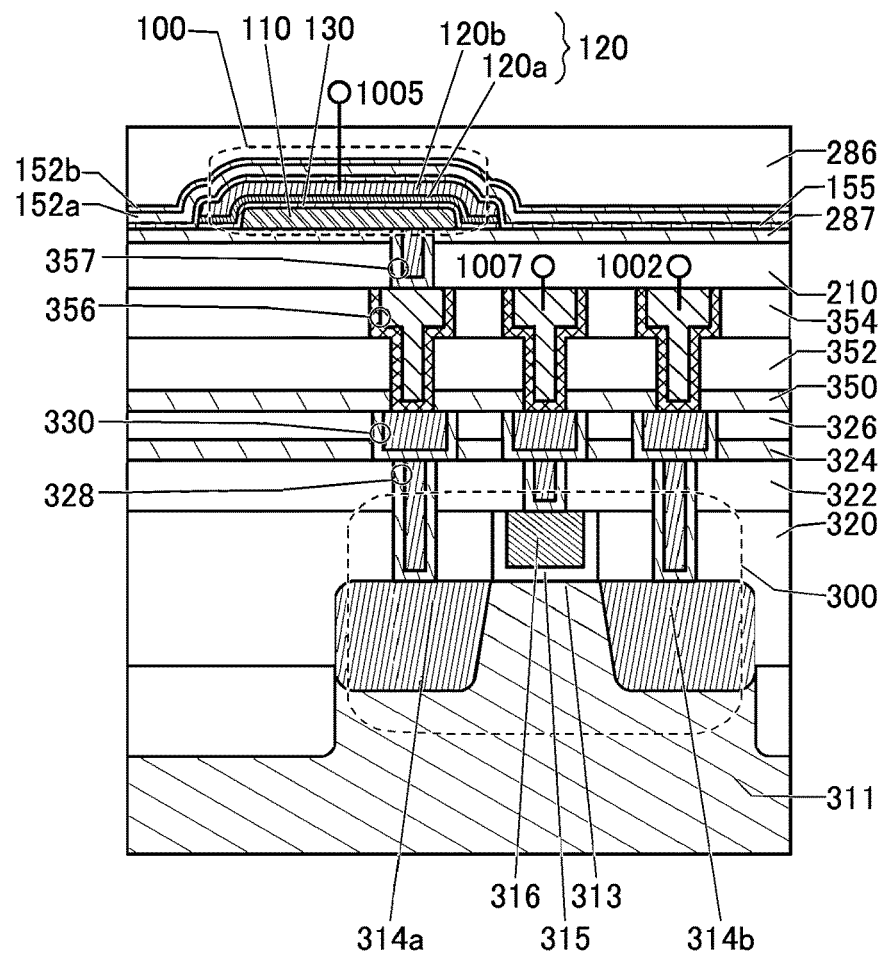

Although the low-resistance region 314a of the transistor 300 and the conductor 110 of the capacitor 100 are directly connected to each other with the conductor 357 in the structure illustrated in FIG. 27A, the present invention is not limited thereto. The plurality of wiring layers illustrated in FIG. 22 and the like may be provided between the capacitor 100 and the transistor 300. For example, as illustrated in FIG. 27B, the conductor 328 may be formed over the transistor 300, the conductor 330 may be formed over the conductor 328, the conductor 356 may be formed over the conductor 330, and the conductor 357 may be formed over the conductor 356. The low-resistance region 314a of the transistor 300 and the conductor 110 of the capacitor 100 are electrically connected to each other with the conductor 328, the conductor 330, the conductor 356, and the conductor 357. Note that the description of [Structure example of storage device] can be referred to for the conductor 328, the conductor 330, the conductor 356, and the wiring layers including them.

At least part of the structure, method, and the like described in this embodiment can be implemented in appropriate combination with any of the other embodiments described in this specification.

Embodiment 4

In this embodiment, a storage device of one embodiment of the present invention, which includes a transistor in which an oxide is used for a semiconductor (hereinafter referred to as an OS transistor in some cases) and a ferroelectric capacitor, will be described with reference to FIG. 28A and FIG. 28B. The device of this embodiment is a storage device that includes at least a capacitor and an OS transistor controlling charging and discharging of the capacitor. The device of this embodiment functions as a one-transistor one-capacitor ferroelectric memory that includes a ferroelectric capacitor.

Structure Example of Storage Device

Figure 28A:
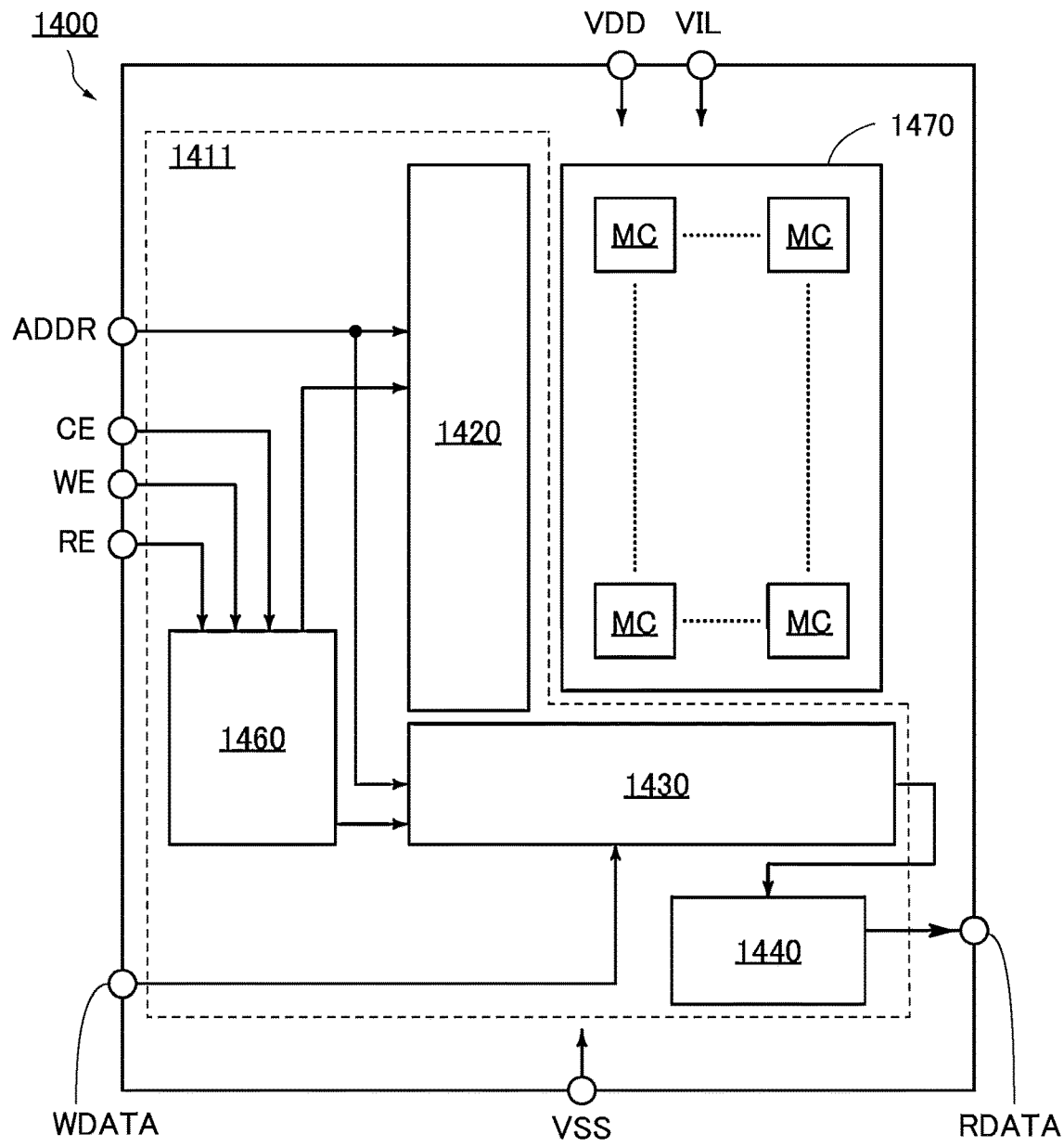
FIG. 28A is a block diagram showing a structure example of a storage device of one embodiment of the present invention.
Figure 28B:
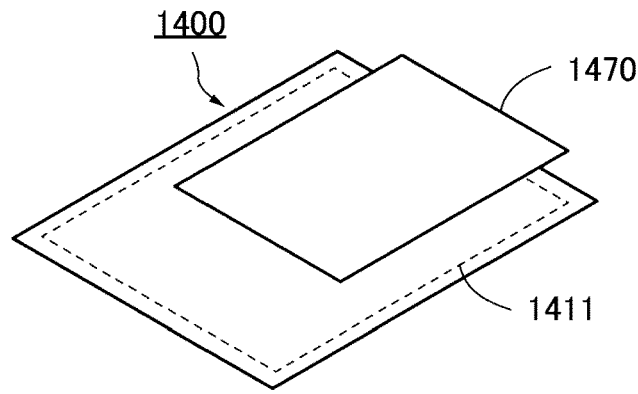
FIG. 28B is a perspective view showing a structure example of the storage device of one embodiment of the present invention.

FIG. 28A illustrates a structure example of a storage device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a bit line driver circuit, a precharge circuit, a sense amplifier, a write circuit, and the like. The precharge circuit has a function of precharging wirings. The sense amplifier has a function of amplifying a data signal read from a memory cell. Note that the wirings are connected to memory cells included in the memory cell array 1470, and are described later in detail. The data signal amplified is output as a data signal RDATA to the outside of the storage device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 and the row circuit 1420 depends on the structure of the memory cell MC, the number of memory cells MC in a column, and the like. The number of wirings that connect the memory cell array 1470 and the column circuit 1430 depends on the structure of the memory cell MC, the number of memory cells MC in a row, and the like.

Note that FIG. 28A illustrates an example where the peripheral circuit 1411 and the memory cell array 1470 are formed on the same plane; however, this embodiment is not limited thereto. For example, as illustrated in FIG. 28B, the memory cell array 1470 may be provided to overlap with part of the peripheral circuit 1411. For example, the sense amplifier may be provided below the memory cell array 1470 so that they overlap with each other.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed. The storage device of one embodiment of the present invention operates fast and can retain data for a long time.

Structure Example of Memory Cell

The circuit diagram in FIG. 29A shows a structure example of the memory cell MC described above. The memory cell MC includes a transistor Tr and a capacitor Fe. Here, as the memory cell MC, the semiconductor device including the transistor 200 and the capacitor 100, which is described in the above embodiment, can be used, for example. In this case, the transistor Tr and the capacitor Fe correspond to the transistor 200 and the capacitor 100, respectively. Note that the transistor Tr may have a back gate in addition to a gate or may have no back gate. The transistor Tr is illustrated as an n-channel transistor in FIG. 29A, but may be a p-channel transistor.

One of a source and a drain of the transistor Tr is electrically connected to a wiring BL. The other of the s and the drain of the transistor Tr is electrically connected to one electrode of the capacitor Fe. The gate of the transistor Tr is electrically connected to a wiring WL. The other electrode of the capacitor Fe is electrically connected to a wiring PL.

The wiring WL has a function of a word line and can control on/off of the transistor Tr by controlling the potential of the wiring WL. For example, setting the potential of the wiring WL to a high potential can bring the transistor Tr into an on state; setting the potential of the wiring WL to a low potential can bring the transistor Tr into an off state. The wiring WL is electrically connected to the word line driver circuit included in the row circuit 1420, and the potential of the wiring WL can be controlled by the word line driver circuit.

The wiring BL has a function of a bit line. When the transistor Tr is in an on state, the potential of the wiring BL is supplied to the one electrode of the capacitor Fe. The wiring BL is electrically connected to the bit line driver circuit of the column circuit 1430. The bit line driver circuit has a function of generating data to be written to the memory cell MC. Furthermore, the bit line driver circuit has a function of reading data output from the memory cell MC. Specifically, the sense amplifier is provided in the bit line driver circuit, and data output from the memory cell MC can be read using the sense amplifier.

The wiring PL has a function of a plate line, and the potential of the wiring PL can be set to the potential of the other electrode of the capacitor Fe.

An OS transistor is preferably used as the transistor Tr. An OS transistor has a feature of a high breakdown voltage. Accordingly, using an OS transistor as the transistor Tr makes it possible that a high voltage is applied to the transistor Tr even when the transistor Tr is miniaturized. The miniaturization of the transistor Tr can reduce the area occupied by the memory cell MC. For example, the area occupied by one memory cell MC illustrated in FIG. 29A can be ⅓ to ⅙ of the area occupied by one SRAM cell. Accordingly, the memory cells MC can be arranged at a high density. Therefore, the storage device of one embodiment of the present invention can have large storage capacity.

The capacitor Fe contains a material that can have ferroelectricity as a dielectric layer between the two electrodes. The dielectric layer included in the capacitor Fe is referred to as a ferroelectric layer in the following description.

As the material that can have ferroelectricity, the above-described material that can be used for the insulator 130 is used. A material containing aluminum nitride and/or scandium nitride is especially preferable as the material that can have ferroelectricity because of being able to have ferroelectricity even when processed into a several-nanometer-thick thin film. With the ferroelectric layer that can be thin, the storage device combined with a miniaturized transistor can be obtained.

The ferroelectric layer has hysteresis characteristics. FIG. 29B1 is a graph showing an example of the hysteresis characteristics. The horizontal axis in FIG. 29B1 represents a voltage applied to the ferroelectric layer. The voltage can be the difference between the potential of one electrode of the capacitor Fe and the potential of the other electrode of the capacitor Fe, for example.

The vertical axis in FIG. 29B1 represents the amount of polarization of the ferroelectric layer; a positive value indicates that negative electric charge is concentrated on the one electrode side of the capacitor Fe and positive electric charge is concentrated on the other electrode side of the capacitor Fe. In contrast, a negative value of the amount of polarization indicates that negative electric charge is concentrated on the other electrode side of the capacitor Fe and positive electric charge is concentrated on the one electrode side of the capacitor Fe.

Note that the voltage represented by the horizontal axis of the graph of FIG. 29B1 may be the difference between the potential of the other electrode of the capacitor Fe and the potential of the one electrode of the capacitor Fe. Moreover, the amount of polarization (also referred to as polarization) represented by the vertical axis of the graph of FIG. 29B1 may have a positive value when negative electric charge is concentrated on the other electrode side of the capacitor Fe and positive electric charge is concentrated on the one electrode side of the capacitor Fe, and may have a negative value when negative electric charge is concentrated on the one electrode side of the capacitor Fe and positive electric charge is concentrated on the other electrode side of the capacitor Fe.

As shown in FIG. 29B1, the hysteresis characteristics of the ferroelectric layer can be represented by a curve 51 and a curve 52. Voltages at intersection points of the curve 51 and the curve 52 are referred to as VSP and −VSP. The polarity at VSP can be regarded as being different from that at −VSP.

When a voltage lower than or equal to −VSP is applied to the ferroelectric layer and then the voltage applied to the ferroelectric layer increases, the amount of polarization of the ferroelectric layer increases along the curve 51. In contrast, when a voltage higher than or equal to VSP is applied to the ferroelectric layer and then the voltage applied to the ferroelectric layer decreases, the amount of polarization of the ferroelectric layer decreases along the curve 52. Therefore, VSP and −VSP can be referred to as saturated polarization voltages. For example, VSP and −VSP may be called a first saturated polarization voltage and a second saturated polarization voltage, respectively. Although the absolute value of the first saturated polarization voltage and the absolute value of the second saturated polarization voltage are equal to each other in FIG. 29B1, they may be different from each other.

Here, in the case where the amount of polarization of the ferroelectric layer is varied along the curve 51, the voltage applied to the ferroelectric layer at the time when the amount of polarization of the ferroelectric layer is 0 is referred to as Vc. When the amount of polarization of the ferroelectric layer is varied along the curve 52, the voltage applied to the ferroelectric layer at the time when the amount of polarization of the ferroelectric layer is 0 is referred to as −Vc. Vc and −Vc can be referred to as coercive voltages. The value of Vc and the value of −Vc can be values between −VSP and VSP. Note that Vc and −Vc may be called a first coercive voltage and a second coercive voltage, respectively. Although the absolute value of the first coercive voltage and the absolute value of the second coercive voltage are equal to each other in FIG. 29B1, they may be different from each other.

As described above, the voltage applied to the ferroelectric layer included in the capacitor Fe can be represented by the difference between the potential of the one electrode of the capacitor Fe and the potential of the other electrode of the capacitor Fe. In addition, as described above, the other electrode of the capacitor Fe is electrically connected to the wiring PL. Thus, it is possible to control the voltage applied to the ferroelectric layer included in the capacitor Fe by controlling the potential of the wiring PL. Note that FIG. 29B2 is a graph showing an example of hysteresis characteristics showing the amount of polarization of an ideal ferroelectric layer. A straight line 52*i* and a straight line 51*i* shown in FIG. 29B2 represent the amount of polarization of the ideal ferroelectric layer. In order to obtain the hysteresis characteristics shown in FIG. 29B2, crystallinity of the ferroelectric material is improved, leak component from the ferroelectric material and the vicinity of the material is eliminated, or the impurity concentration in the ferroelectric material is reduced, for example. The metal nitride film of one embodiment of the present invention has high purity, and thus can be expected to have the hysteresis characteristics close to the ones showing the amount of polarization of the ideal ferroelectric layer, which are shown in FIG. 29B2.

Example of Method for Driving Memory Cell

An example of a method for driving the memory cell MC illustrated in FIG. 29A will be described below. In the following description, the voltage applied to the ferroelectric layer of the capacitor Fe represents the difference between the potential of one electrode of the capacitor Fe and the potential of the other electrode of the capacitor Fe (the wiring PL). The transistor Tr is an n-channel transistor.

FIG. 29C is a timing chart showing an example of a method for driving the memory cell MC in FIG. 29A. In the example shown in FIG. 29C, binary digital data is written to and read from the memory cell MC. Specifically, in the example shown in FIG. 29C, data "1" is written to the memory cell MC in the period from Time T01 to Time T02, reading and rewriting are performed in the period from Time T03 to Time T05, reading and writing of data "0" to the memory cell MC are performed in the period from Time T11 to Time T13, reading and rewriting are performed in the period from Tim T14 to Time T16, and reading and writing of data "1" to the memory cell MC are performed in the period from Time T17 to Time T19.

The sense amplifier electrically connected to the wiring BL is supplied with Vref as a reference potential. In the reading operation shown in FIG. 29C and the like, when the potential of the wiring BL is higher than Vref, data "1" is read by the bit line driver circuit. On the other hand, when the potential of the wiring BL is lower than Vref, data "0" is read by the bit line driver circuit.

In the period from Time T01 to Time T02, the potential of the wiring WL is set to a high potential (H). Thus, the transistor Tr is brought into an on state. In addition, the potential of the wiring BL is set to Vw. Since the transistor Tr is in an on state, the potential of the one electrode of the capacitor Fe becomes Vw. Furthermore, the potential of the wiring PL is set to GND. Thus, the voltage applied to the ferroelectric layer of the capacitor Fe becomes "Vw−GND". Accordingly, data "1" can be written to the memory cell MC. Consequently, the period from Time T01 to Time T02 can be referred to as a write operation period.

Here, Vw is preferably VSP or higher, for example, preferably equal to VSP. GND can be set to a ground potential, for example; however, GND is not necessarily a ground potential as long as the memory cell MC can be driven in a manner to achieve an object of one embodiment of the present invention. For example, when the absolute value of the first saturated polarization voltage and the absolute value of the second saturated polarization voltage are different from each other and the absolute value of the first coercive voltage and the absolute value of the second coercive voltage are different from each other, GND can be a potential other than a ground potential.

In the period from Time T02 to Time T03, the potential of the wiring BL and the potential of the wiring PL are each set to GND. Accordingly, the voltage applied to the ferroelectric layer of the capacitor Fe becomes 0 V. Since the voltage "Vw−GND" applied to the ferroelectric layer of the capacitor Fe can be higher than or equal to VSP in the period from Time T01 to Time T02, the amount of polarization of the ferroelectric layer of the capacitor Fe is varied along the curve 52 shown in FIG. 29B in the period from Time T02 to Time T03. Thus, no polarization inversion occurs in the ferroelectric layer of the capacitor Fe in the period from Time T02 to Time T03.

After the potential of the wiring BL and the potential of the wiring PL are set to GND, the potential of the wiring WL is set to a low potential (L). Accordingly, the transistor Tr is brought into an off state. Thus, the writing operation is completed and the data "1" is retained in the memory cell MC. Note that the potentials of the wiring BL and the wiring PL can each be any potential as long as no polarization inversion occurs in the ferroelectric layer of the capacitor Fe, i.e., the voltage applied to the ferroelectric layer of the capacitor Fe is higher than or equal to −Vc that is the second coercive voltage.

In the period from Time T03 to Time T04, the potential of the wiring WL is set to the high potential. Thus, the transistor Tr is brought into an on state. Furthermore, the potential of the wiring PL is set to Vw. With the potential of the wiring PL set to Vw, the voltage applied to the ferroelectric layer of the capacitor Fe becomes "GND−Vw". As described above, the voltage applied to the ferroelectric layer of the capacitor Fe is "Vw−GND" in the period from Time T01 to Time T02. Accordingly, polarization inversion occurs in the ferroelectric layer of the capacitor Fe. In the polarization inversion, a current flows through the wiring BL, whereby the potential of the wiring BL becomes higher than Vref. Thus, the bit line driver circuit can read the data "1" retained in the memory cell MC. Therefore, the period from Time T03 to Time T04 can be referred to as a read operation period. Note that although Vref is higher than GND and lower than Vw, Vref may be higher than Vw, for example.

Since the above-described reading is destructive reading, the data "1" retained in the memory cell MC is lost. Thus, the potential of the wiring BL is set to Vw and the potential of the wiring PL is set to GND in the period from Time T04 to Time T05. Thus, data "1" is rewritten to the memory cell MC. Consequently, the period from Time T04 to Time T05 can be referred to as a rewrite operation period.

The potential of the wiring BL and the potential of the wiring PL are set to GND in the period from Time T05 to Time T11. After the potential of the wiring BL and the potential of the wiring PL are set to GND, the potential of the wiring WL is set to the low potential. Thus, the rewrite operation is completed, and the data "1" is retained in the memory cell MC.

The potential of the wiring WL is set to the high potential and the potential of the wiring PL is set to Vw in the period from Time T11 to Time T12. Since the data "1" is retained in the memory cell MC, the potential of the wiring BL becomes higher than Vref, and the data "1" retained in the memory cell MC is read. Accordingly, the period from Time T11 to Time T12 can be referred to as a read operation period.

The potential of the wiring BL is set to GND in the period from Time T12 to Time T13. Since the transistor Tr is in an on state, the potential of the one electrode of the capacitor Fe is GND. In addition, the potential of the wiring PL is Vw. Accordingly, the voltage applied to the ferroelectric layer of the capacitor Fe becomes "GND−Vw". Thus, data "0" can be written to the memory cell MC. Consequently, the period from Time T12 to Time T13 can be referred to as a write operation period.

In the period from Time T13 to Time T14, the potential of the wiring BL and the potential of the wiring PL are each set to GND. Accordingly, the voltage applied to the ferroelectric layer of the capacitor Fe becomes 0 V. Since the voltage "GND−Vw" applied to the ferroelectric layer of the capacitor Fe can be lower than or equal to −VSP in the period from Time T12 to Time T13, the amount of polarization of the ferroelectric layer of the capacitor Fe is varied along the curve 51 shown in FIG. 29B1 in the period from Time T13 to Time T14. Thus, no polarization inversion occurs in the ferroelectric layer of the capacitor Fe in the period from Time T13 to Time T14.

After the potential of the wiring BL and the potential of the wiring PL are set to GND, the potential of the wiring WL is set to the low potential. Accordingly, the transistor Tr is brought into an off state. Thus, the writing operation is completed and the data "0" is retained in the memory cell MC. Note that the potentials of the wiring BL and the wiring PL can each be any potential as long as no polarization inversion occurs in the ferroelectric layer of the capacitor Fe, i.e., the voltage applied to the ferroelectric layer of the capacitor Fe is lower than or equal to Vc that is the first coercive voltage.

In the period from Time T14 to Time T15, the potential of the wiring WL is set to the high potential. Thus, the transistor Tr is brought into an on state. Furthermore, the potential of the wiring PL is set to Vw. With the potential of the wiring PL set to Vw, the voltage applied to the ferroelectric layer of the capacitor Fe becomes "GND−Vw". As described above, the voltage applied to the ferroelectric layer of the capacitor Fe is "GND−Vw" in the period from Time T12 to Time T13. Accordingly, no polarization inversion occurs in the ferroelectric layer of the capacitor Fe. Thus, the amount of current flowing through the wiring BL is smaller than that in the case where polarization inversion occurs in the ferroelectric layer of the capacitor Fe. Accordingly, an increase in the potential of the wiring BL is smaller than that in the case where polarization inversion occurs in the ferroelectric layer of the capacitor Fe; specifically, the potential of the wiring BL becomes lower than or equal to Vref. Consequently, the bit line driver circuit can read the data "0" retained in the memory cell MC. Therefore, the period from Time T14 to Time T15 can be referred to as a read operation period.

The potential of the wiring BL is set to GND and the potential of the wiring PL is Vw in the period from Time T15 to Time T16. Thus, data "0" is rewritten to the memory cell MC. Therefore, the period from Time T15 to Time T16 can be referred to as a rewrite operation period.

The potential of the wiring BL and the potential of the wiring PL are set to GND in the period from Time T16 to Time T17. After the potential of the wiring BL and the potential of the wiring PL are set to GND, the potential of the wiring WL is set to the low potential. Thus, the rewrite operation is completed, and the data "0" is retained in the memory cell MC.

The potential of the wiring WL is set to the high potential and the potential of the wiring PL is set to Vw in the period from Time T17 to Time T18. Since the data "0" is retained in the memory cell MC, the potential of the wiring BL becomes lower than Vref, and the data "0" retained in the memory cell MC is read. Therefore, the period from Time T17 to Time T18 can be referred to as a read operation period.

The potential of the wiring BL is set to Vw in the period from Time T18 to Time T19. Since the transistor Tr is in an on state, the potential of the one electrode of the capacitor Fe becomes Vw. In addition, the potential of the wiring PL is GND. Accordingly, the voltage applied to the ferroelectric layer of the capacitor Fe becomes "Vw−GND". Thus, data "1" can be written to the memory cell MC. Therefore, the period from Time T18 to Time T19 can be referred to as a write operation period.

From Time T19, the potential of the wiring BL and the potential of the wiring PL are set to GND. After the potential of the wiring BL and the potential of the wiring PL are set to GND, the potential of the wiring WL is set to the low potential. Thus, the write operation is completed, and the data "1" is retained in the memory cell MC.

The structure, method, and the like described in this embodiment can be used in an appropriate combination with any of other structures, methods, and the like described in this embodiment or the other embodiments.

Embodiment 5

In this embodiment, application examples of the storage device that includes the semiconductor device described in the above embodiment are described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives). FIG. 30A to FIG. 30E schematically illustrate some structure examples of removable storage devices. The semiconductor device described in the above embodiment is processed into a packaged memory chip and used in a variety of storage devices and removable memories, for example.

Figure 30A:
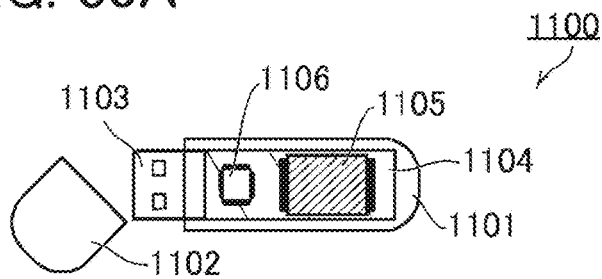
FIG. 30A to FIG. 30E are schematic views of storage devices of embodiments of the present invention.

FIG. 30A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like. Therefore, the storage capacity of the USB memory 1100 can be further increased.

Figure 30B:
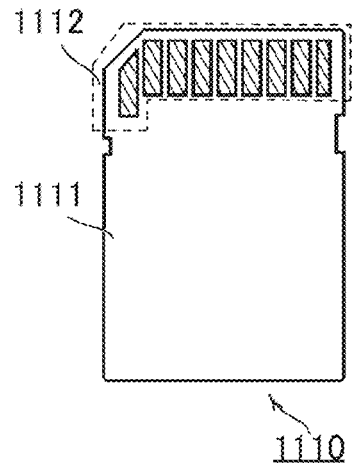
Figure 30C:
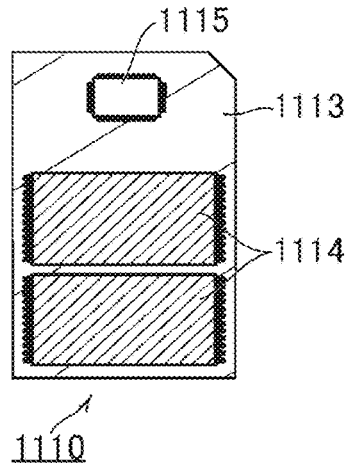

FIG. 30B is a schematic external view of an SD card, and FIG. 30C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like. Therefore, the storage capacity of the SD card 1110 can be further increased.

Figure 30D:
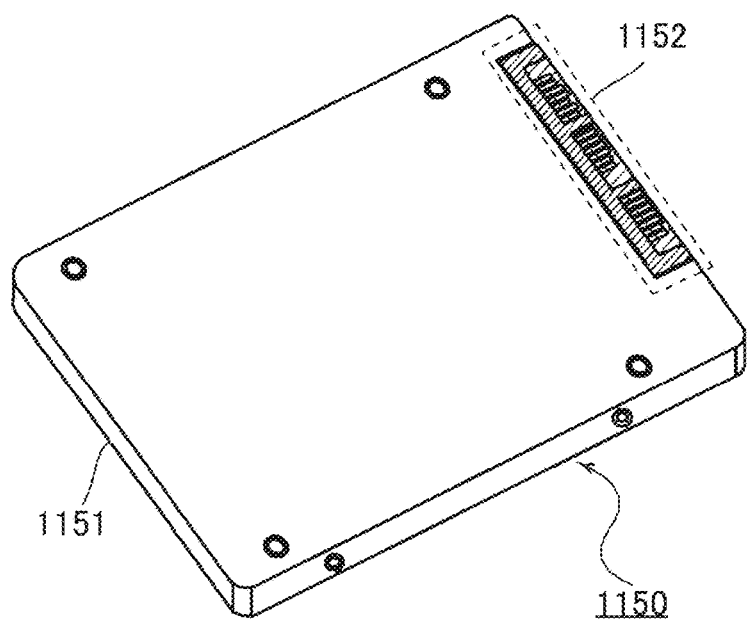
Figure 30E:
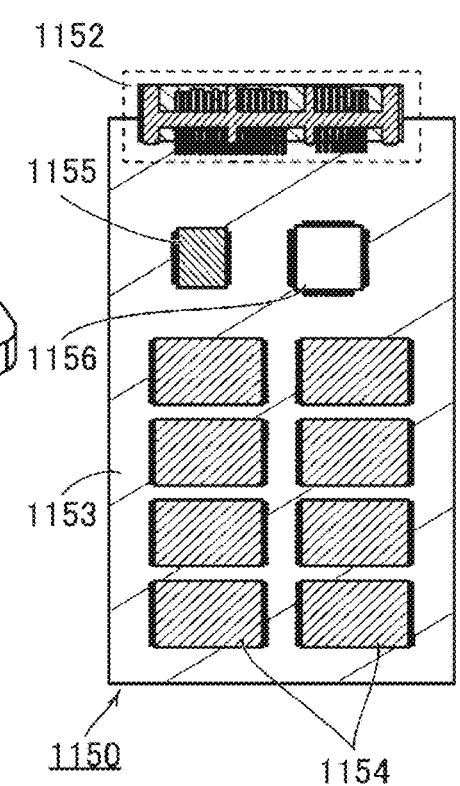

FIG. 30D is a schematic external view of an SSD, and FIG. 30E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like. Therefore, the storage capacity of the SSD 1150 can be further increased.

At least part of the structure, method, and the like described in this embodiment can be implemented in appropriate combination with any of the other embodiments described in this specification.

Embodiment 6

The semiconductor device of one embodiment of the present invention can be used for processors such as CPUs or GPUs, or chips. When the semiconductor device described in the above embodiment is used for processors such as CPUs or GPUs, or chips, their sizes can be reduced and their storage capacities can be increased. FIG. 31A to FIG. 31H illustrate specific examples of electronic devices each including a processor, such as a CPU or a GPU, or a chip of one embodiment of the present invention.

<Electronic Devices and Systems>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of one embodiment of the present invention can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 31A to FIG. 31H illustrate examples of electronic devices.

[Information Terminal]

Figure 31A:
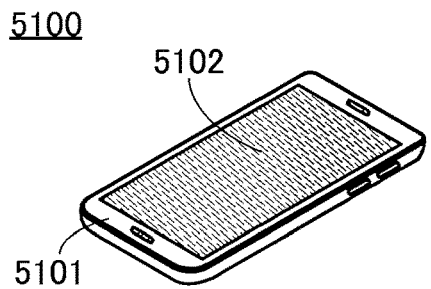
FIG. 31A to FIG. 31H are diagrams showing electronic devices of embodiments of the present invention.

FIG. 31A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 31B:
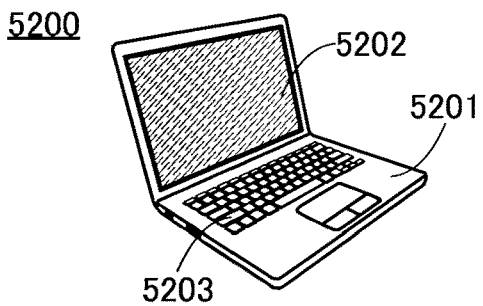

FIG. 31B illustrates a notebook information terminal 5200. The notebook information terminal 5200 includes a main body 5201 of the information terminal, a display portion 5202, and a keyboard 5203.

When the chip of one embodiment of the present invention is applied to the notebook information terminal 5200, the notebook information terminal 5200 can execute an application utilizing artificial intelligence like the information terminal 5100 described above. Examples of the application utilizing artificial intelligence include design-support software, text correction software, and software for automatic menu generation. Furthermore, with the use of the notebook information terminal 5200, novel artificial intelligence can be developed.

Note that although FIG. 31A and FIG. 31B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 31C:
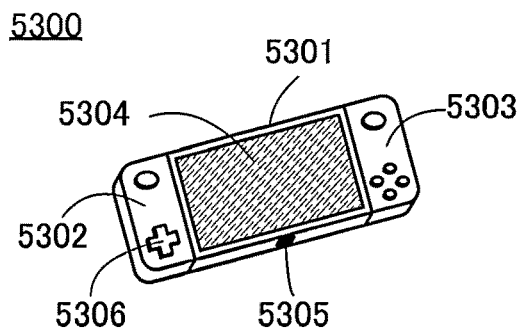

FIG. 31C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into the chip provided on a substrate in each of the housing 5301, the housing 5302, and the housing 5303, for example.

Figure 31D:
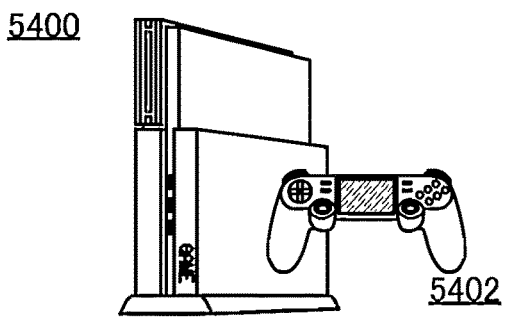

FIG. 31D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit itself, a peripheral circuit, and a module can be reduced.

Furthermore, when the GPU or the chip of one embodiment of the present invention is applied to the portable game machine 5300, the portable game machine 5300 including artificial intelligence can be obtained.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are illustrated as examples of game machines in FIG. 31C and FIG. 31D, the game machine that includes the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 31E:
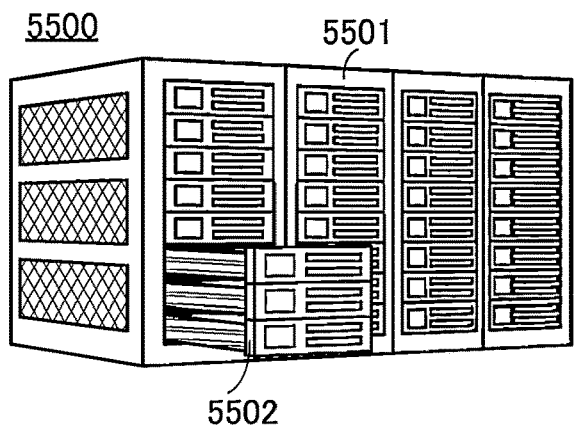
Figure 31F:
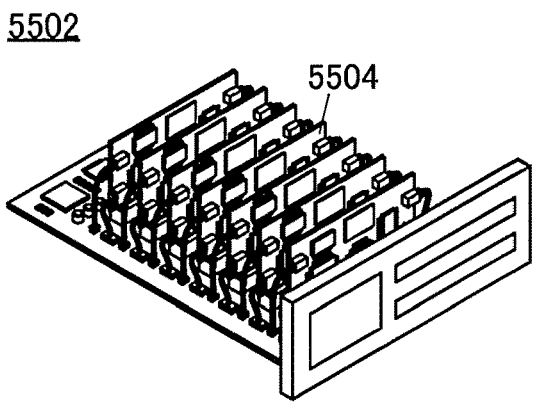

FIG. 31E illustrates a supercomputer 5500 as an example of a large computer. FIG. 31F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip described in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit itself, a peripheral circuit, and a module can be reduced.

Although a supercomputer is illustrated as an example of a large computer in FIG. 31E and FIG. 31F, a large computer that includes the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 31G:
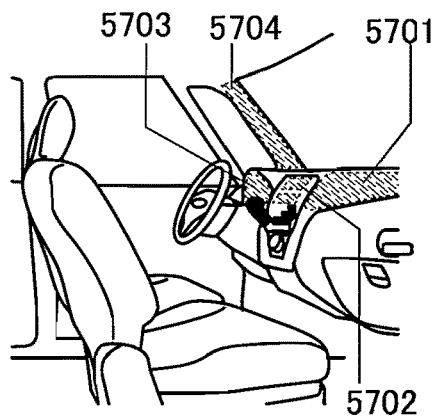

FIG. 31G illustrates an area around a windshield inside an automobile, which is an example of a moving vehicle. FIG. 31G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an image capturing device (not illustrated) provided for the automobile. That is, displaying an image taken by the image capturing device provided outside the automobile leads to compensation for the blind spot and an increase in safety. Display of an image that complements the area that cannot be seen makes it possible to confirm safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 31H:
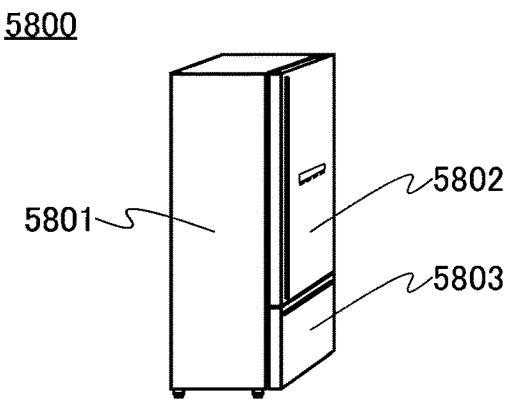

FIG. 31H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, consume-by dates of the foods, or the like, a function of automatically adjusting temperature to make it appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

At least part of the structure, method, and the like described in this embodiment can be implemented in appropriate combination with any of the other embodiments described in this specification.

REFERENCE NUMERALS

51: curve, 51i: straight line, 52: curve, 52i: straight line, 100: capacitor, 105: insulator, 110: conductor, 110a: conductor, 110b: conductor, 112: conductor, 115a: insulator, 115b: insulator, 120: conductor, 120a: conductor, 120b: conductor, 130: insulator, 130a: insulator, 130b: insulator, 130c: insulator, 132: arrow, 136: grain, 138a: layer, 138b: layer, 140: conductor, 141: insulator, 142: insulator, 143: conductor, 144: insulator, 146: insulator, 152: insulator, 152a: insulator, 152b: insulator, 155: insulator, 155a: insulator, 155b: insulator, 200: transistor, 205: conductor, 205a: conductor, 205b: conductor, 210: insulator, 212: insulator, 214: insulator, 216: insulator, 217: insulator, 218: conductor, 222: insulator, 224: insulator, 224A: insulating film, 230: oxide, 230a: oxide, 230A: oxide film, 230b: oxide, 230B: oxide film, 230ba: region, 230bb: region, 230bc: region, 240: conductor, 240a: conductor, 240b: conductor, 241: insulator, 241a: insulator, 241b: insulator, 242: conductor, 242a: conductor, 242A: conductive film, 242b: conductor, 242B: conductive layer, 246: conductor, 246a: conductor, 246b: conductor, 250: insulator, 250a: insulator, 250A: insulating film, 250b: insulator, 252: insulator, 252A: insulating film, 254: insulator, 254A: insulating film, 255: conductor, 260: conductor, 260a: conductor, 260b: conductor, 262: conductor, 265: sealing portion, 271: insulator, 271a: insulator, 271A: insulating film, 271b: insulator, 271B: insulating layer, 274: insulator, 275: insulator, 280: insulator, 282: insulator, 283: insulator, 285: insulator, 286: insulator, 287: insulator, 288: conductor, 289: insulator, 290: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 357: conductor, 400: opening region, 401: precursor, 402: precursor, 404: carrier purge gas, 405: nitriding agent, 411: precursor, 412: precursor, 413: precursor, 414: oxidizing gas, 500: semiconductor device, 900: manufacturing apparatus, 901: reaction chamber, 903: gas inlet, 904: reaction chamber entrance, 905: exhaust port, 907: wafer stage, 908: shaft, 950: wafer, 1001: wiring, 1002: wiring, 1003: wiring, 1004: wiring, 1005: wiring, 1006: wiring, 1007: wiring, 1008: wiring, 1009: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1400: storage device, 1411: peripheral circuit, 1420: row circuit, 1430: column circuit, 1440: output circuit, 1460: control logic circuit, 1470: memory cell array, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: stationary game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door

The invention claimed is:

1. A ferroelectric device comprising:
an insulating film;
a first conductor over the insulating film;
a metal nitride film over the first conductor;
a second conductor over the metal nitride film;
a first insulator over the first conductor, the metal nitride film, and the second conductor; and
a second insulator over the first insulator,
wherein the first conductor, the metal nitride film, and the second conductor are surrounded by the insulating film, the first insulator, and the second insulator,
wherein the metal nitride film has ferroelectricity,
wherein the metal nitride film comprises a first element, a second element, and nitrogen,
wherein the first element is one or more elements selected from Group 13 elements,
wherein the second element is one or more elements selected from Group 2 elements to Group 6 elements and Group 13 elements other than the first element,
wherein the first conductor and the second conductor each comprise nitrogen,
wherein the first insulator comprises aluminum and oxygen, and
wherein the insulating film and the second insulator each comprise silicon and nitrogen.

2. A ferroelectric device comprising:
a first conductor;
a metal nitride film over the first conductor;
a second conductor over the metal nitride film;
a first insulator over the first conductor, the metal nitride film, and the second conductor; and
a second insulator over the first insulator,
wherein the first insulator comprises a region in contact with a side surface of the metal nitride film, a region in contact with a side surface of the second conductor, and a region in contact with a top surface of the second conductor,
wherein the metal nitride film has ferroelectricity,
wherein the metal nitride film comprises a first element, a second element, and nitrogen,
wherein the first element is one or more elements selected from Group 13 elements,
wherein the second element is one or more elements selected from Group 2 elements to Group 6 elements and Group 13 elements other than the first element,
wherein the first conductor and the second conductor each comprise nitrogen,
wherein the first insulator comprises aluminum and oxygen, and
wherein the second insulator comprises silicon and nitrogen.

3. The ferroelectric device according to claim 1,
wherein the first insulator has an amorphous structure.

4. A ferroelectric device comprising:
an insulating film;
a first conductor over the insulating film;
a metal nitride film over the first conductor;
a second conductor over the metal nitride film; and
an insulator over the first conductor, the metal nitride film, and the second conductor,
wherein the insulator comprises a region in contact with a top surface of the insulating film, a region in contact with a side surface of the metal nitride film, a region in contact with a side surface of the second conductor, and a region in contact with a top surface of the second conductor,
wherein the metal nitride film has ferroelectricity,
wherein the metal nitride film comprises a first element, a second element, and nitrogen,
wherein the first element is one or more elements selected from Group 13 elements,
wherein the second element is one or more elements selected from Group 2 elements to Group 6 elements and Group 13 elements other than the first element,
wherein the first conductor and the second conductor each comprise nitrogen, and
wherein the insulating film and the insulator each comprise silicon and nitrogen.

5. The ferroelectric device according to claim 1,
wherein the metal nitride film has a wurtzite type structure.

6. The ferroelectric device according to claim 1,
wherein the first element is aluminum, and
wherein the second element is one or more selected from lanthanoids and actinoids.

7. The ferroelectric device according to claim 1,
wherein the first element is aluminum, and
wherein the second element is one or more selected from titanium, zirconium, hafnium, vanadium, niobium, and tantalum.

8. The ferroelectric device according to claim 1,
wherein the first conductor comprises a crystal having a sodium chloride type structure.

9. The ferroelectric device according to claim 1, further comprising a silicon nitride film between the first conductor and the metal nitride film.

10. The ferroelectric device according to claim 1, further comprising a silicon nitride film between the metal nitride film and the second conductor.

11. A semiconductor device comprising:
the ferroelectric device according to claim 1; and
a transistor whose channel formation region comprises an oxide semiconductor.

12. The ferroelectric device according to claim 2, further comprising a silicon nitride film between the first conductor and the metal nitride film.

13. The ferroelectric device according to claim 2, further comprising a silicon nitride film between the metal nitride film and the second conductor.

14. A semiconductor device comprising:
the ferroelectric device according to claim 2; and
a transistor whose channel formation region comprises an oxide semiconductor.

15. The ferroelectric device according to claim 4, further comprising a silicon nitride film between the first conductor and the metal nitride film.

16. The ferroelectric device according to claim 4, further comprising a silicon nitride film between the metal nitride film and the second conductor.

17. A semiconductor device comprising:
the ferroelectric device according to claim 4; and
a transistor whose channel formation region comprises an oxide semiconductor.

* * * * *